(12) United States Patent
Danno et al.

(10) Patent No.: US 8,981,538 B2
(45) Date of Patent: Mar. 17, 2015

(54) SEMICONDUCTOR DEVICE AND A METHOD FOR MANUFACTURING A SEMICONDUCTOR DEVICE

(71) Applicant: Renesas Electronics Corporation, Kawasaki-shi, Kanagawa (JP)

(72) Inventors: Tadatoshi Danno, Kanagawa (JP); Toshiyuki Hata, Kanagawa (JP); Yuichi Machida, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/048,804

(22) Filed: Oct. 8, 2013

(65) Prior Publication Data
US 2014/0299979 A1    Oct. 9, 2014

(30) Foreign Application Priority Data
Oct. 23, 2012   (JP) .................................. 2012-233805

(51) Int. Cl.
| H01L 23/495 | (2006.01) |
| H01L 21/44 | (2006.01) |
| H01L 21/48 | (2006.01) |
| H01L 21/50 | (2006.01) |
| H01L 23/00 | (2006.01) |

(52) U.S. Cl.
CPC ...... *H01L 23/49568* (2013.01); *H01L 21/4875* (2013.01); *H01L 24/34* (2013.01); *H01L 24/97* (2013.01); *H01L 2224/32245* (2013.01); *H01L 2224/48137* (2013.01); *H01L 2224/48247* (2013.01); *H01L 2224/48465* (2013.01); *H01L 2224/4903* (2013.01); *H01L 2224/73265* (2013.01); *H01L 2224/78301* (2013.01)

USPC ............ 257/675; 257/E27.033; 257/E29.347; 438/107

(58) Field of Classification Search
CPC ...................... H01L 21/4875; H01L 23/49568
USPC ............ 257/675, E27.033, E29.347; 438/107
See application file for complete search history.

(56) References Cited

U.S. PATENT DOCUMENTS

| 2010/0259201 A1* | 10/2010 | Kawano et al. ................ 315/362 |
| 2011/0215400 A1* | 9/2011 | Nakamura et al. ............. 257/334 |
| 2013/0049137 A1* | 2/2013 | Uno et al. ...................... 257/401 |

FOREIGN PATENT DOCUMENTS

| JP | 2008-016515 | | 1/2008 | |
| JP | 2008-177179 A | | 7/2008 | |
| JP | 2010-177619 A | | 8/2010 | |
| WO | WO 2012/127696 | * | 9/2012 | .............. H01L 25/07 |

* cited by examiner

*Primary Examiner* — David S Blum
(74) *Attorney, Agent, or Firm* — McDermott Will & Emery LLP

(57) ABSTRACT

The reliability of a semiconductor device is improved. A semiconductor device has a first metal plate and a second metal plate electrically isolated from the first metal plate. Over the first metal plate, a first semiconductor chip including a transistor element formed thereover is mounted. Whereas, over the second metal plate, a second semiconductor chip including a diode element formed thereover is mounted. Further, the semiconductor device has a lead group including a plurality of leads electrically coupled with the first semiconductor chip or the second semiconductor chip. The first and second metal plates are arranged along the X direction in which the leads are arrayed. Herein, the area of the peripheral region of the first semiconductor chip in the first metal plate is set larger than the area of the peripheral region of the second semiconductor chip in the second metal plate.

20 Claims, 39 Drawing Sheets

FIG. 16

| SEMICONDUCTOR DEVICE | 1K1 | 1K2 | 1 | 1H1 |
|---|---|---|---|---|
| TEMPERATURE RISING RATE [°C/W] | 1.503 | 1.510 | 1.388 | 1.376 |
| IMPROVEMENT RATIO [%] | — | -0.50 | 7.65 | 8.42 |

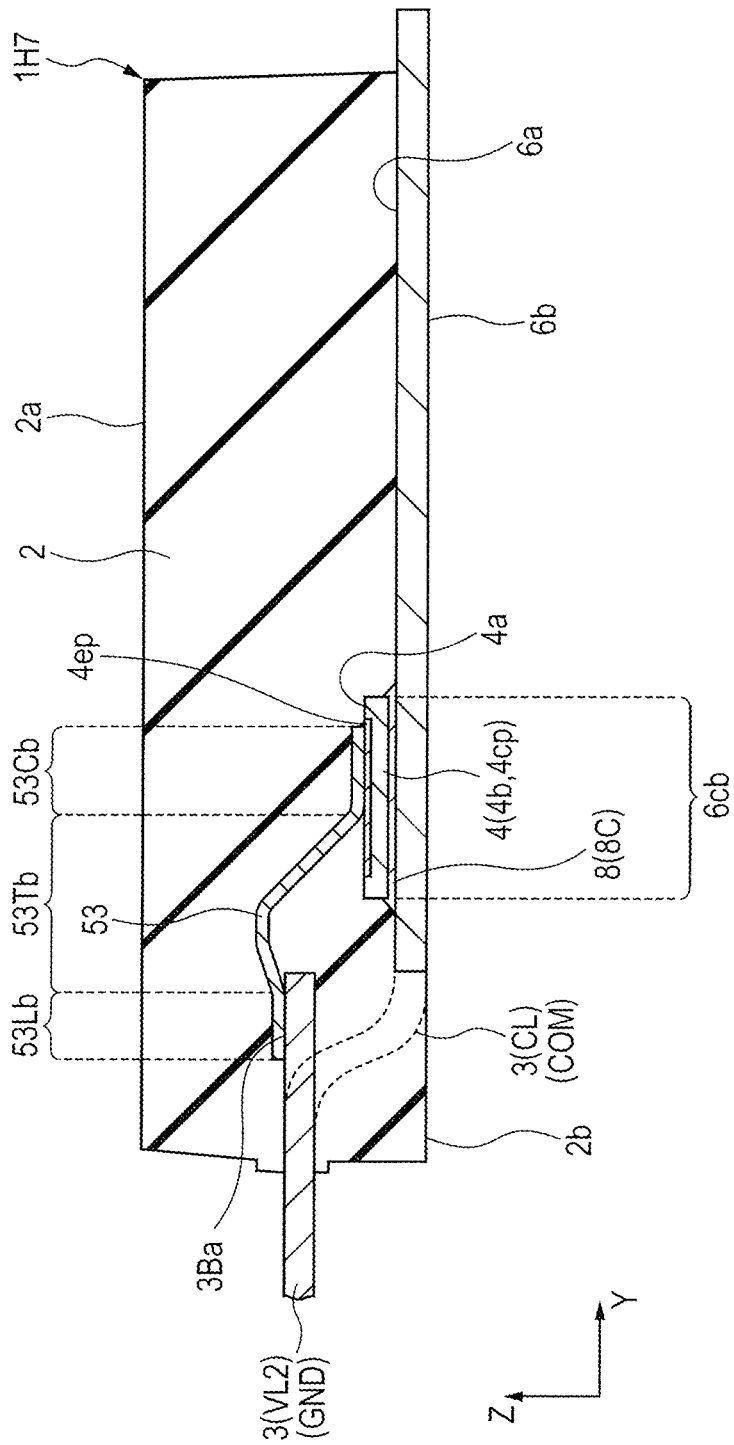

SEMICONDUCTOR DEVICE AND A METHOD FOR MANUFACTURING A SEMICONDUCTOR DEVICE

CROSS-REFERENCE TO RELATED APPLICATIONS

The disclosure of Japanese Patent Application No. 2012-233805 filed on Oct. 23, 2012 including the specification, drawings and abstract is incorporated herein by reference in its entirety.

BACKGROUND

The present invention relates to a semiconductor device and a manufacturing technology of a semiconductor device. More particularly, it relates to a technology effectively applicable to, for example, a semiconductor device to be mounted in a power circuit.

Japanese Unexamined Patent Publication No. 2008-177179 (Patent Document 1) describes a semiconductor module in which semiconductor chips each including a transistor formed therein, and semiconductor chips each including a diode formed therein are separately mounted on a plurality of metal base plates, and the plurality of semiconductor chips are electrically coupled via the metal base plates and wires.

Further, Japanese Unexamined Patent Publication No. 2010-177619 (Patent Document 2) describes a semiconductor device in which an IGBT (chip) and a diode (chip) are mounted on the same lead frame, and a slit is formed between the IGBT (chip) and the diode (chip).

Still further, Japanese Unexamined Patent Publication No. 2008-16515 (Patent Document 3) describes a structure in which an IGBT (chip) and a diode (chip) are joined to a Cu wiring board, and a cooling green sheet is bonded to the surface of the Cu wiring board opposite from the chip joint surface.

PATENT DOCUMENTS

Patent Document 1

Japanese Unexamined Patent Publication No. 2008-177179

Patent Document 2

Japanese Unexamined Patent Publication No. 2010-177619

Patent Document 3

Japanese Unexamined Patent Publication No. 2008-16515

SUMMARY

The present inventors have been conducting a study on a technology of improving the performances of a semiconductor device to be mounted into, for example, a power circuit. As part of this, a study was conducted on a technology of incorporating a semiconductor chip including a transistor formed therein, and a semiconductor chip including a diode for performing a switching operation with the transistor, formed therein, into one package. As a result, the present inventors found that there is a problem in improving the reliability of the semiconductor device.

Other objects and novel features will be apparent from the description of this specification and the accompanying drawings.

In a semiconductor device in accordance with one embodiment, in a first metal plate for mounting thereover a first semiconductor chip including a transistor formed therein, the peripheral region of the first semiconductor chip is set larger than the peripheral region of a second semiconductor chip in a second metal plate for mounting thereover the second semiconductor chip including a diode formed therein.

In accordance with the one embodiment, it is possible to improve the reliability of a semiconductor device.

BRIEF DESCRIPTION OF THE DRAWINGS

FIG. 16 is an illustrative view showing the results of evaluation conducted by the present inventors regarding the heat radiation characteristics of the metal plates shown in FIGS. 12 to 15;

FIG. 41 is an enlarged cross-sectional view along line A-A of FIG. 40.

DETAILED DESCRIPTION

Figure 1:
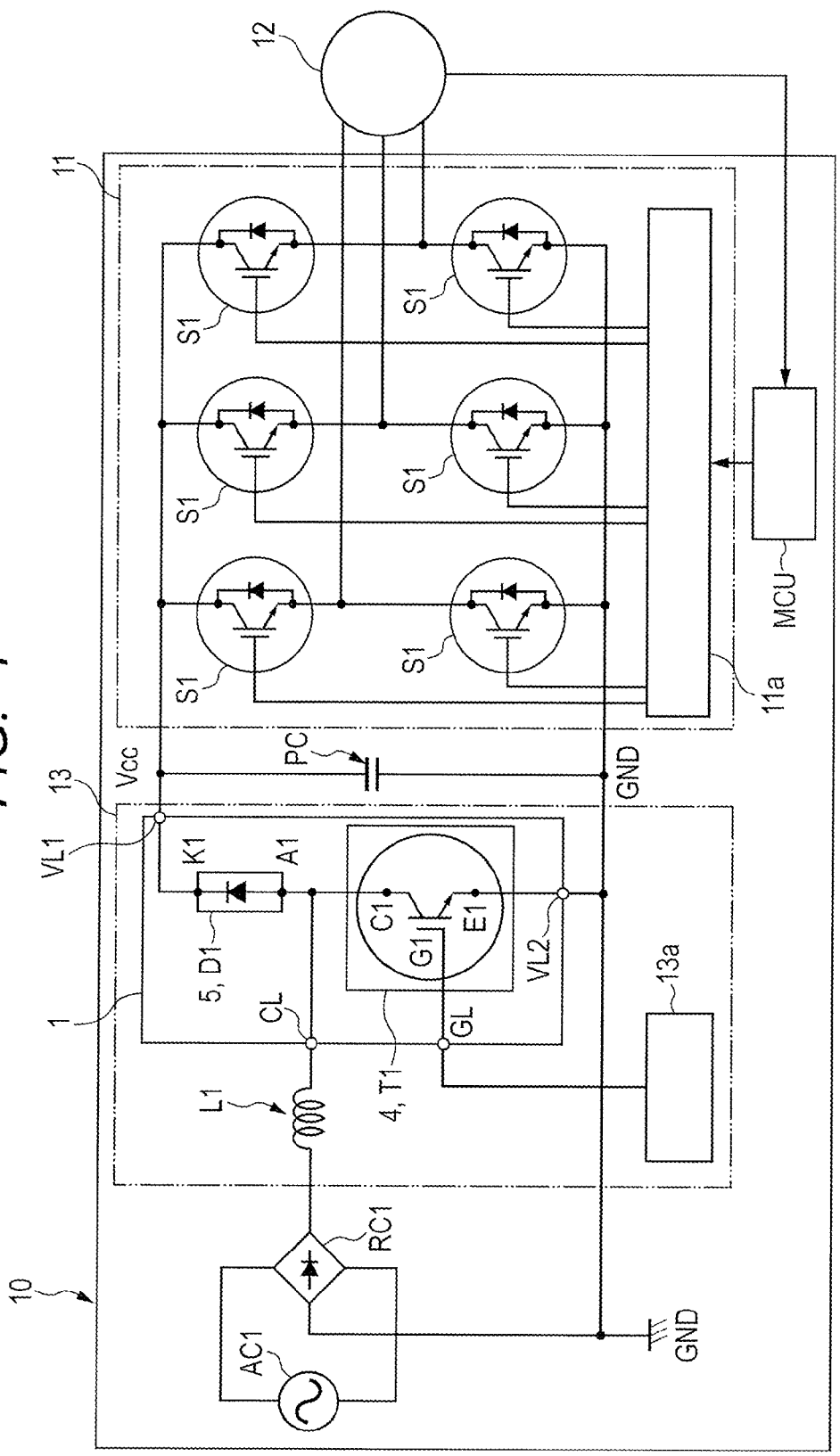
FIG. 1 is an illustrative view showing a circuit configuration of a power conversion device including a semiconductor device of an embodiment mounted therein.

Explanation of Description Form, Basic Terms, and Methods in the Present Invention In the present invention, in the following description of embodiments, the description may be divided into a plurality of sections, or the like for convenience, if required. However, unless otherwise specified, these are not independent of each other, but, are respective parts of a single example, in a relation such that one is a detailed explanation of a part of the other, a modification example of a part or the whole, or the like of the other, irrespective of the order of description. Further, in principle, the repetitive description of the same parts will be omitted. Whereas, respective constitutional elements in embodiments are not essential, unless otherwise specified, or except for the case where the number is theoretically limiting, and unless otherwise apparent from the context.

Similarly, in the description of embodiments, and the like, the term "X including A" or the like for the material, composition, or the like does not exclude the one including an element other than A unless otherwise specified and unless otherwise apparent from the context. For example, for the component, the term is used to embrace "X including A as a main component", and the like. For example, it is naturally understood that the term "silicon member" or the like herein used is not limited to pure silicon but also embraces a SiGe (silicon germanium) alloy, other multinary alloys containing silicon as a main component, and other members containing additives, and the like. Whereas, it is naturally understood that the term gold plating, a Cu layer, nickel plating, or the like, herein used is assumed to embrace not only the pure one but also a member containing gold, Cu, nickel, or the like as a main component, unless otherwise specified.

Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

Further, in the present invention, the term "planar surface" or "side surface" is used. With the semiconductor element-formed surface of the semiconductor chip as the reference surface, the surface in parallel with the reference surface is described as a planar surface. Whereas, the surface crossing with the planar surface is described as a side surface. Further, the direction in which two spaced planar surfaces are connected in side view is described as a thickness direction.

Whereas, in the present invention, the term "top surface" or "bottom surface" may be used. However, the mounting forms of a semiconductor package include various forms. Accordingly, after mounting of a semiconductor package, for example, the top surface may be arranged below the bottom surface. In the present invention, the planar surface on the element-formed surface side of the semiconductor chip is described as a top surface, and the surface arranged on the opposite side to the top surface is described as a bottom surface.

Further, in respective drawings of embodiments, the same or similar portions are indicated with the same or similar reference numerals and signs, and will not be repeatedly described in principle.

Further, in the accompanying drawings, hatching or the like may be omitted even in cross section when it rather complicates the drawing, or when it is apparently distinct from the gap. In conjunction with this, when apparent from the description or the like, even for a two-dimensionally closed hole, the background outline may be omitted. Further, even not in cross section, hatching or a dot pattern may be added in order to clearly demonstrate that the part is not a gap, or in order to clearly demonstrate the boundary between regions.

EMBODIMENTS

In the present embodiment, a description will be given by taking a semiconductor device including transistors and diodes for a PFC (Power Factor Correction) circuit, to be mounted in a power conversion circuit as one example of a semiconductor device to be mounted in a power circuit. Particularly, the power conversion circuit described in the present embodiment converts an input power into a three-phase AC power, and supplies the power to the load (e.g., three-phase motor) side.

<Power Conversion Device>

FIG. 1 is an illustrative view showing a circuit configuration of a power conversion device including a semiconductor device of the present embodiment mounted therein. A power conversion device 10 shown in FIG. 1 has a power conversion circuit which rectifies an electrical power inputted from an AC input part AC1, then, converts the electrical power into a three-phase AC power at an inverter (inverter circuit) 11, and outputs the three-phase AC power into a load 12. As the load 12 coupled to the power conversion device 10, mention may be made of a motor to be mounted in a household electrical appliance such as a refrigerator or an air conditioning device, or an industrial motor. Thus, the power conversion device 10 is coupled to the load 12 consuming a large amount power, and hence is formed of circuit components capable of supplying a large amount power of, for example, 1 A (ampere) or more (e.g., several tens amperes) and about 600 V (volts).

For example, the power conversion device 10 passes a large current of several tens amperes therethrough. For this reason, when the wiring resistance or the parasitic inductance of the circuit is large, the elements are required to be inhibited from being broken by the reverse induced voltage upon start of or upon stop of a motor. Further, for example, in the case where a plurality of elements passing a large current therethrough are incorporated in one package, the elements are required to be insulated from one another with reliability even when applied with a high voltage of several hundreds volts.

In the inverter 11 shown in FIG. 1, paired two switching elements (switching transistors) S1 are coupled in series for each phase, so that a three-phase AC power is outputted. In the example shown in FIG. 1, as the switching element S1 of the inverter 11, there is used, for example, an IGBT (Insulated Gate Bipolar Transistor). As the switching element to be mounted into the power circuit, there can be used a MOSFET (Metal Oxide Semiconductor Field Effect Transistor) other than an IGBT. However, as described above, in the case of the power conversion device 10 for supplying a driving power to a motor, a breakdown voltage as high as, for example, about 600 V is demanded. For this reason, an IGBT is particularly preferable in that the heat generation due to the ON resistance is more likely to be inhibited upon achieving a higher breakdown voltage.

Further, the inverter 11 is coupled with a control device MCU. The control device MCU is formed of, for example, a PWM (Pulse Width Modulation) circuit. The PWM circuit compares a command signal and the amplitude of the triangle wave, and outputs a PWM signal (control signal). Further, monitoring data (e.g., revolution speed or temperature) of the load 12 is transmitted to the control device MCU. The control device MCU outputs a PWM signal based on the monitoring data.

The PWM signal outputted from the control device MCU is inputted to a control circuit part 11a of the inverter 11. In the control circuit part 11a, there is formed, for example, a driving circuit for controlling the electrical potentials of the gate electrodes of the plurality of switching elements S1 in response to the inputted control signal for driving. The inverter 11 adjusts the revolution speed and the output torque of the load 12 by the control signal outputted from the control device MCU.

Further, a rectifier circuit RC1, a power factor correction circuit 13, and a smoothing capacitor PC are coupled between the AC input part AC1 and the inverter 11 of the power conversion device 10. The electrical power inputted to the AC input part AC1 is cleared of a noise component at a filter circuit not shown, and then, is rectified at the rectifier circuit RC1. The electrical power converted into a DC waveform and outputted at the rectifier circuit RC1 is converted into a flat waveform at a smoothing circuit including the smoothing capacitor PC via the power factor correction circuit 13, and is supplied to the inverter 11.

The smoothing capacitor PC is arranged between a first power source potential Vcc and a second power source potential GND. In other words, the smoothing capacitor PC is coupled to a first power source terminal for supplying the first power source potential Vcc and a second power source terminal for supplying the second power source potential (reference potential) GND. In the example shown in FIG. 1, the second power source potential GND is a ground potential (0 volt). However, as a modified example, a lower potential than the first power source potential Vcc can be used as the second power source potential.

Further, in the example shown in FIG. 1, the power factor correction circuit 13 is a step-up PFC circuit for outputting a higher voltage than the input voltage. The power factor correction circuit 13 includes an inductor (coil) L1 as a boost coil, and a transistor element T1 and a diode element D1 as switching elements.

The diode element D1 and the transistor element T1 are coupled in series between a lead (terminal or Vcc terminal) VL1 to supplied with the first power source potential Vcc, and a lead (terminal or GND terminal) VL2 to be supplied with the second power source potential GND. Particularly, a cathode electrode K1 of the diode element D1 is electrically coupled with the lead VL1. Whereas, an emitter electrode E1 of the transistor element T1 is electrically coupled with the lead VL2.

Whereas, a lead (terminal, COM terminal, or anode-collector lead) CL coupled to the inductor L1 is coupled between the diode element D1 and the transistor element T1. Particularly, the lead CL is electrically coupled between the anode electrode A1 of the diode element D1 and the collector electrode C1 of the transistor element T1.

Further, to the gate electrode G1 of the transistor element T1, there is coupled a control device 13a for supplying a driving potential for switching operation. Particularly, an output signal line for supplying a control signal from the control device 13a is electrically coupled with a lead (terminal or gate terminal) GL coupled to the gate electrode G1 of the transistor element T1.

An output current from the rectifier circuit RC1 flows to the diode element D1 or the transistor element T1 through the inductor L1. When the transistor element T1 in the OFF state, the output current from the rectifier circuit RC1 flows through the diode element D1. As a result, the smoothing capacitor PC is charged. Whereas, when the transistor element T1 is in the ON state, the output current from the rectifier circuit RC1 flows through the transistor element T1. As a result, the diode element D1 is reverse biased. Then, a smoothed current from the smoothing capacitor PC is supplied to the inverter 11.

In other words, a current flows through the diode element D1 or the transistor element T1 in response to the ON-OFF operation (switching operation) of the transistor elements.

The switching operation can smoothen the electrical power supplied to the inverter 11. In other words, the diode element D1 and the transistor element T1 complementarily (alternately) operate, thereby to form a smoothing circuit for smoothening the electrical power supplied to the inverter 11.

When the power conversion device 10 shown in FIG. 1 is reduced in size, there can be considered a method in which a plurality of components forming the power conversion device are incorporated in one package. Further, from the viewpoint of improving the manufacturing efficiency of electronic components, preferably, the general versatility of electronic components is improved, so that the same products are mass produced. Thus, the present inventors conducted a close study on the following configuration: a semiconductor device 1 including the diode element D1 and the transistor element T1 integrated in one package except for electronic components required to be changed according to the power requirements on the load 12 side such as the inductor L1 and the smoothing capacitor PC is mounted into the power conversion device 10.

<Semiconductor Device>

Figure 2:
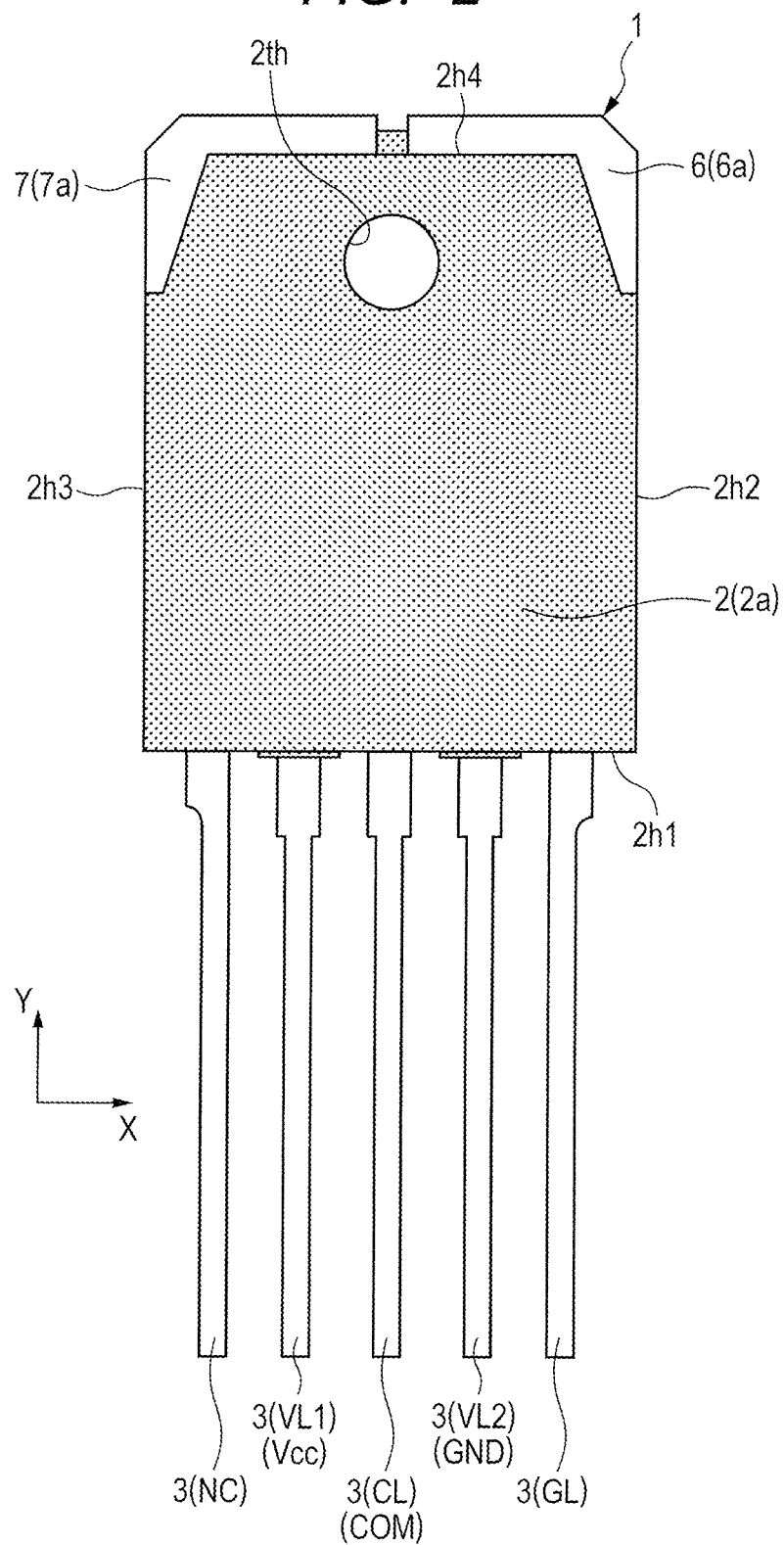
FIG. 2 is a plan view showing an outward appearance of the semiconductor device of the embodiment.
Figure 3:
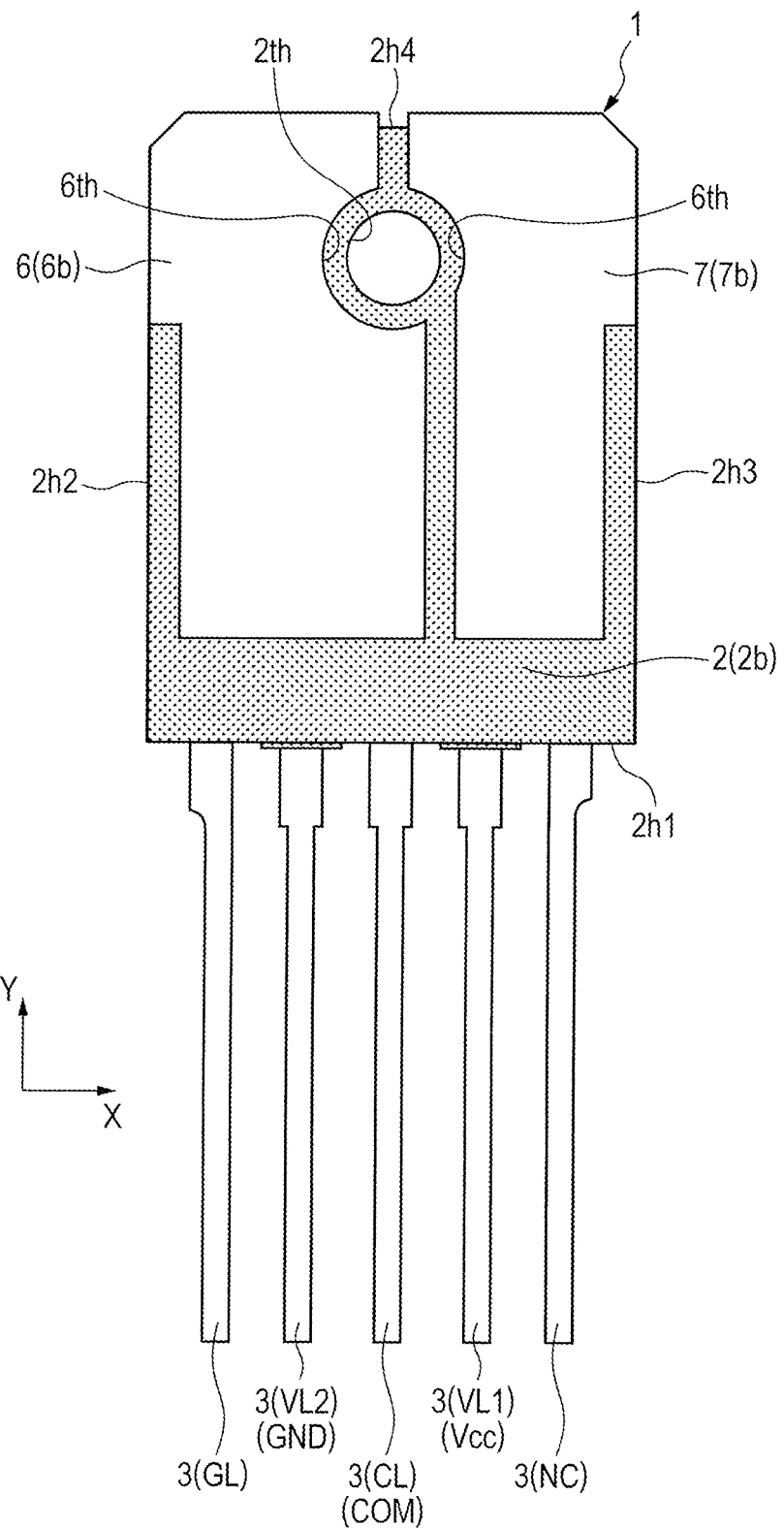
FIG. 3 is a plan view showing the heat radiation plate-mounted surface side of the semiconductor device shown in FIG. 2.
Figure 4:
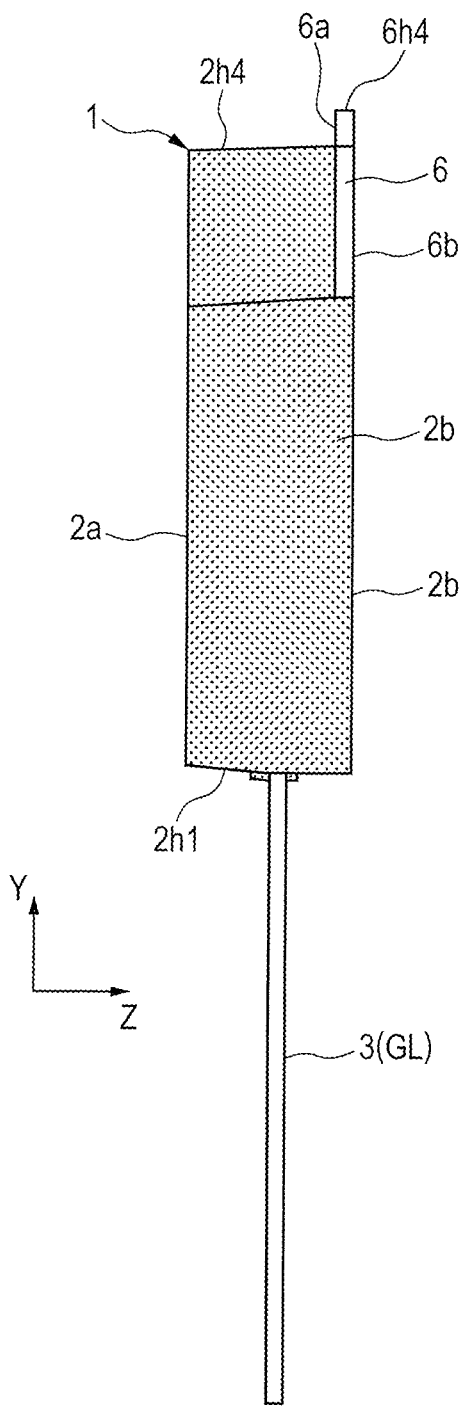
FIG. 4 is a side view of the semiconductor device shown in FIG. 2.
Figure 5:
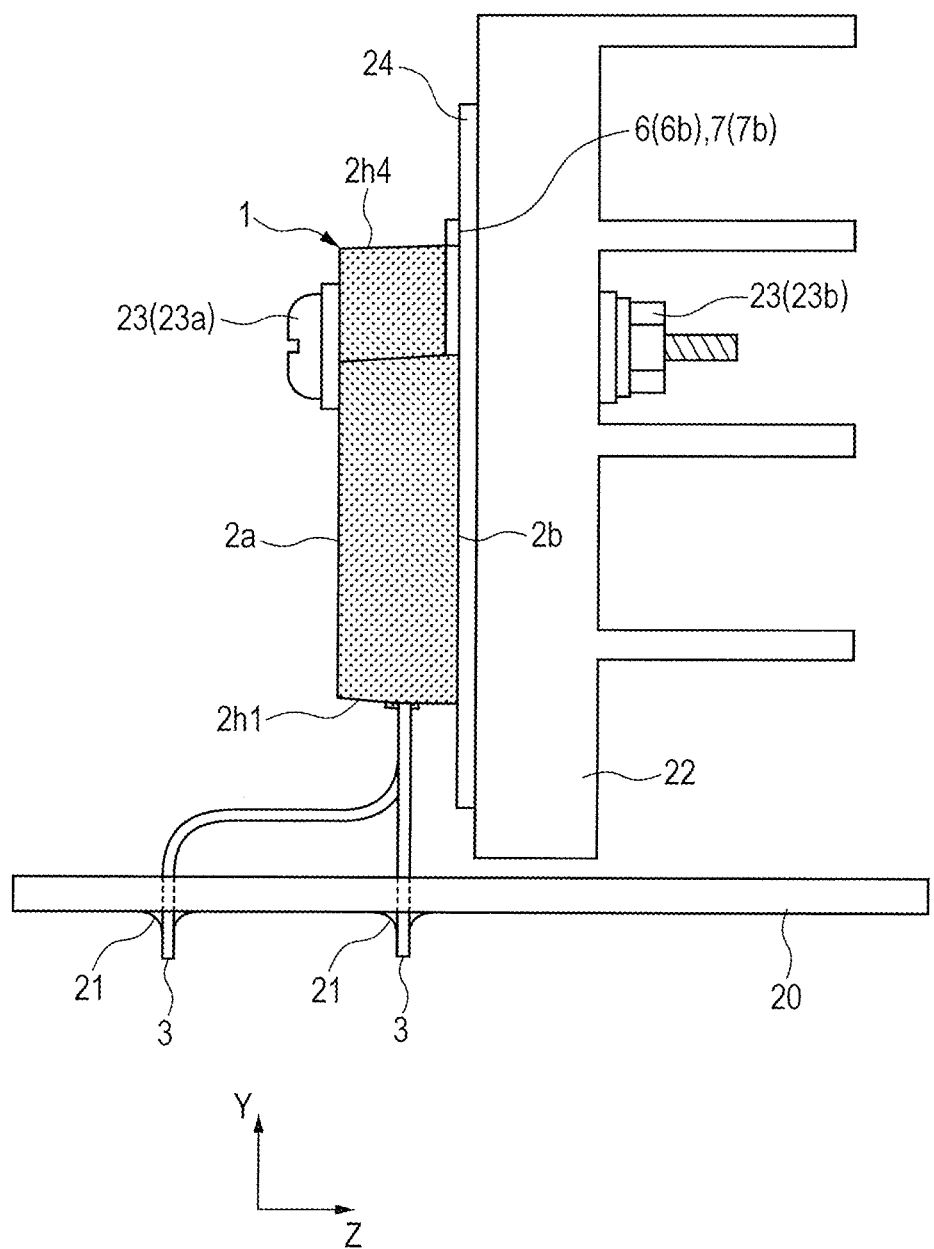
FIG. 5 is a side view showing a state in which the semiconductor device shown in FIG. 4 is attached with a heat radiation plate, and is mounted on a mounting substrate of the power conversion device shown in FIG. 1.
Figure 6:
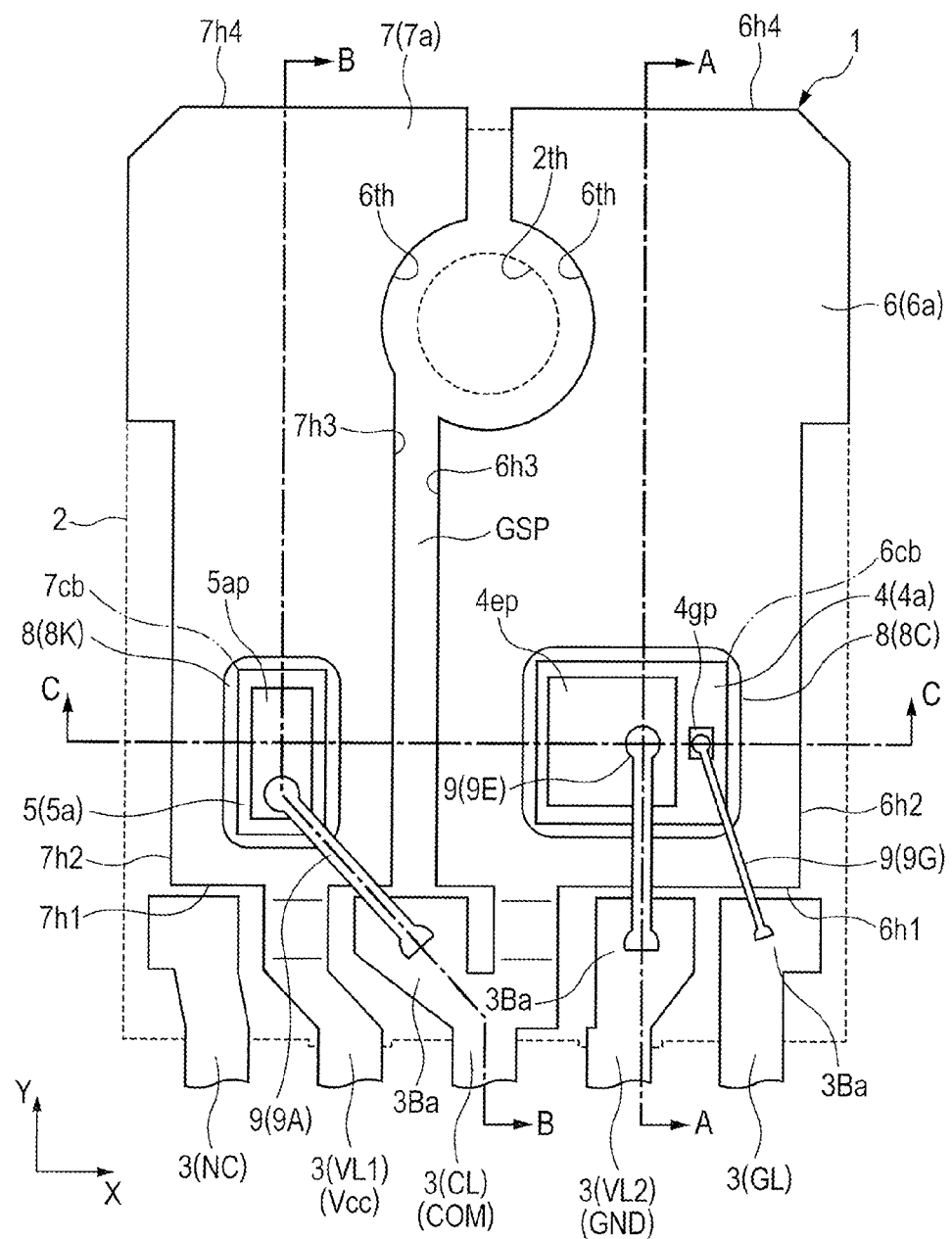
FIG. 6 is a transparent enlarged plan view showing an internal structure of the semiconductor device as seen through a sealing body shown in FIG. 2.
Figure 7:
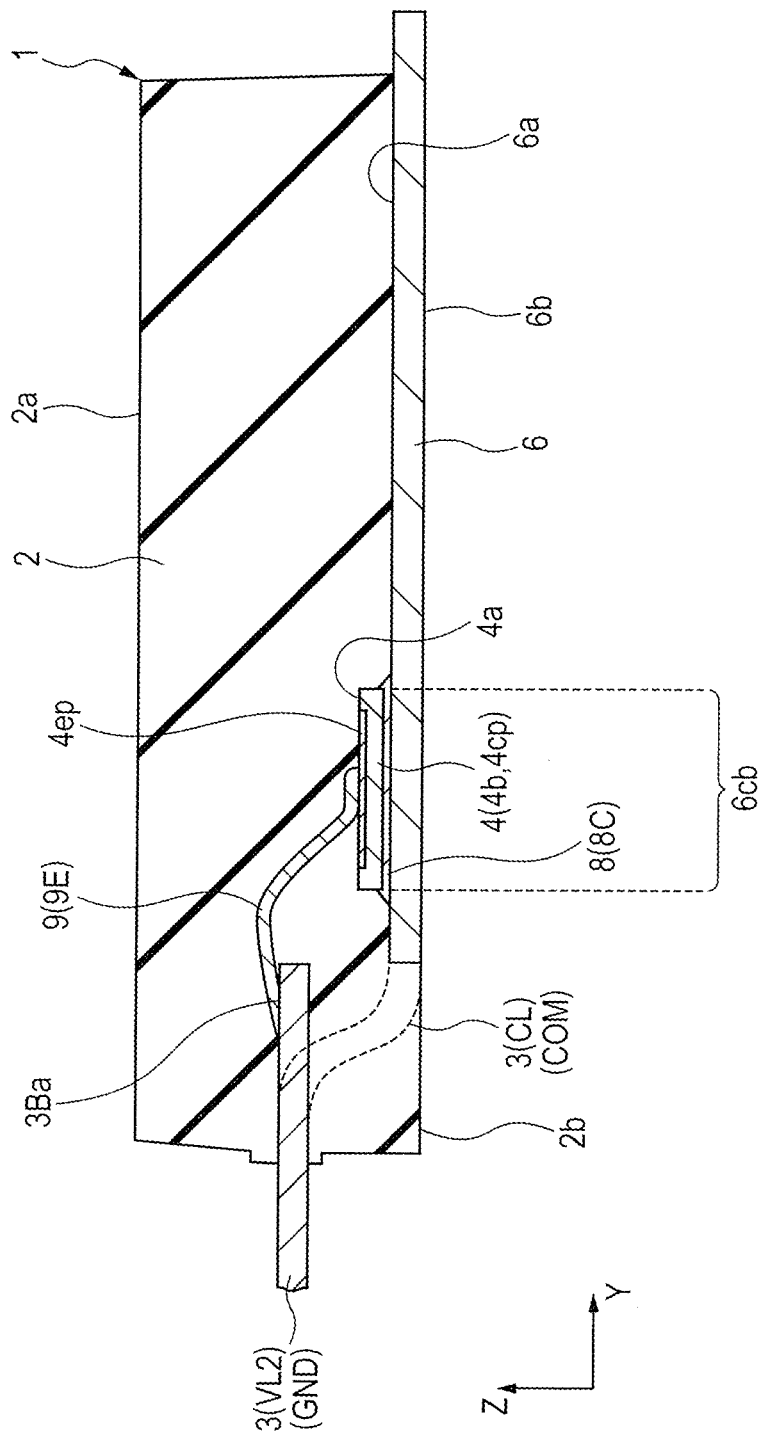
FIG. 7 is an enlarged cross-sectional view along line A-A of FIG. 6.
Figure 8:
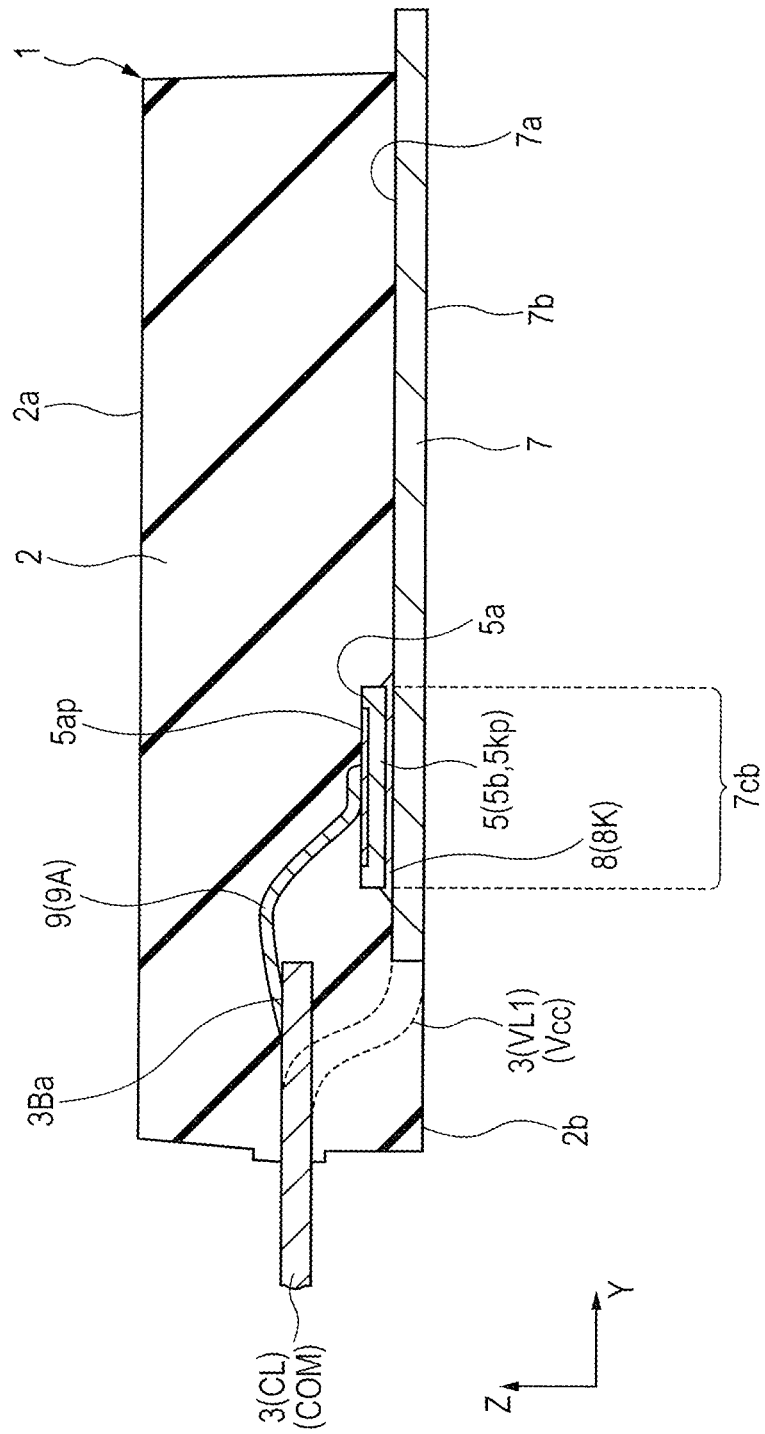
FIG. 8 is an enlarged cross-sectional view along line B-B of FIG. 6.
Figure 9:
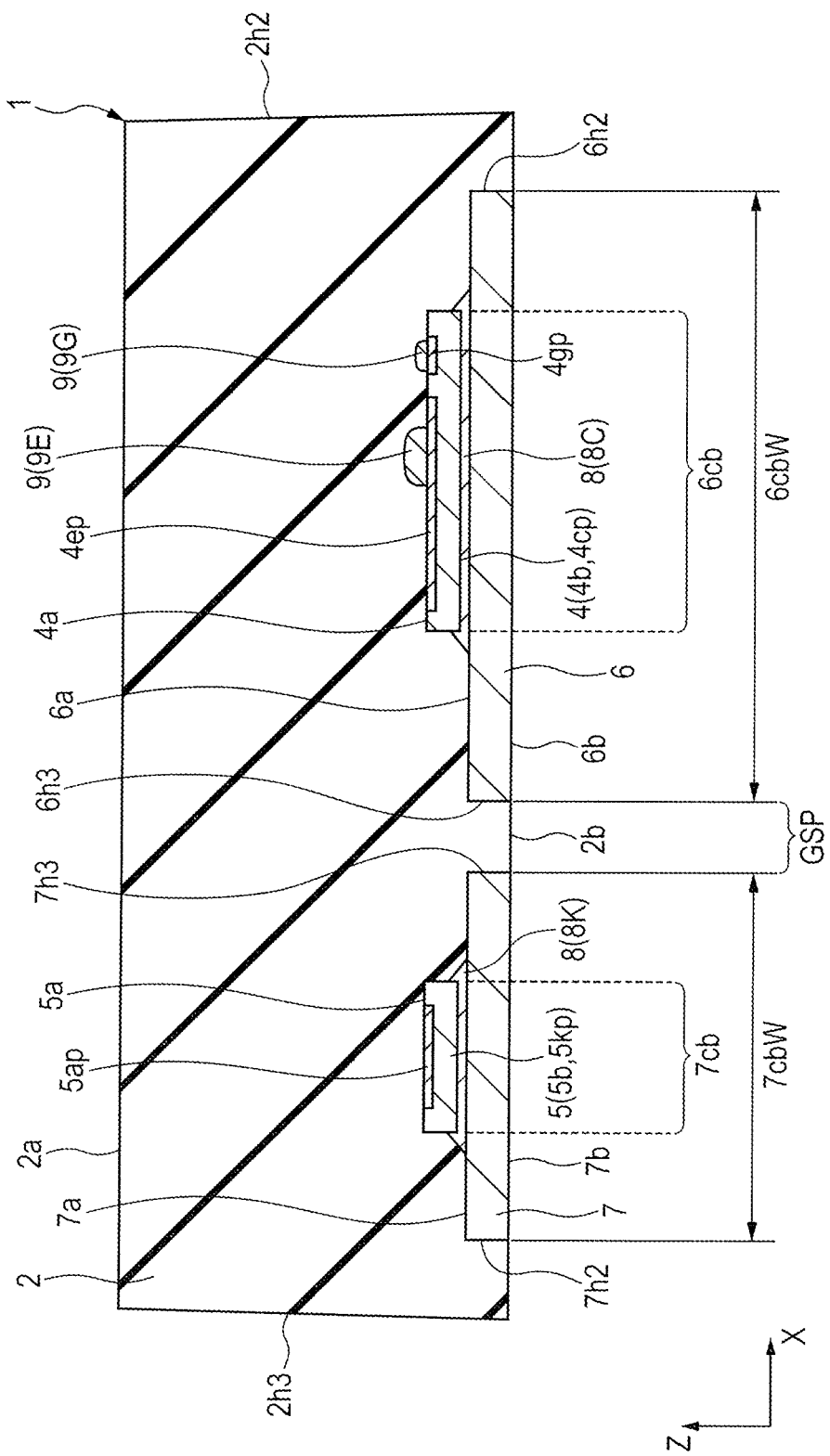
FIG. 9 is an enlarged cross-sectional view along line C-C of FIG. 6.
Figure 10:
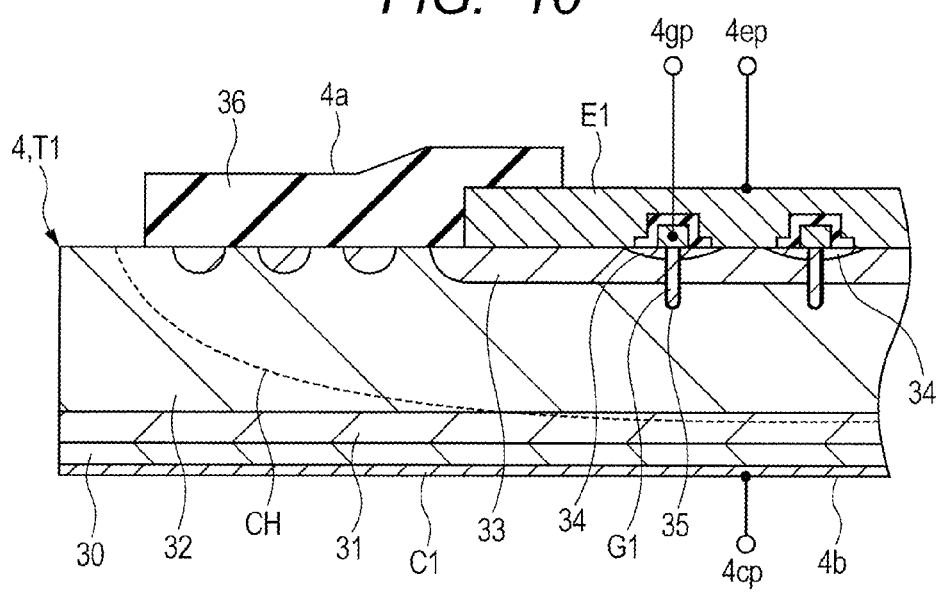
FIG. 10 is an enlarged cross-sectional view showing an element structure example of the semiconductor chip including a transistor element formed therein shown in FIG. 1.
Figure 11:
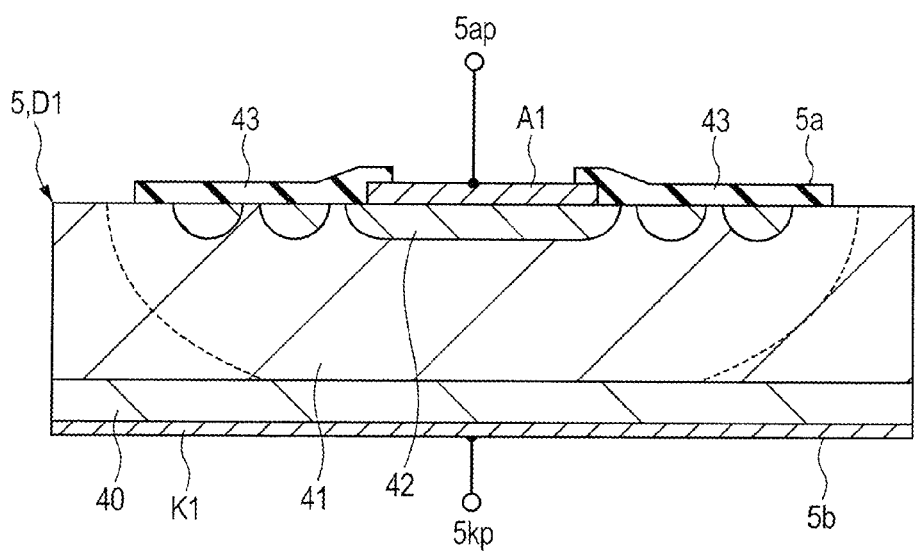
FIG. 11 is an enlarged cross-sectional view showing an element structure example of the semiconductor chip including a diode element formed therein shown in FIG. 1.

FIG. 2 is a plan view showing an outward appearance of the semiconductor device of the present embodiment. Whereas, FIG. 3 is a plan view showing the heat radiation plate-mounted surface side of the semiconductor device shown in FIG. 2. Further, FIG. 4 is a side view of the semiconductor device shown in FIG. 2. Still further, FIG. 5 is a side view showing a state in which the semiconductor device shown in FIG. 4 is attached with a heat radiation plate, and is mounted on a mounting substrate of the power conversion device shown in FIG. 1. Furthermore, FIG. 6 is a transparent enlarged plan view showing an internal structure of the semiconductor device as seen through a sealing body shown in FIG. 2. Still further, FIG. 7 is an enlarged cross-sectional view along line A-A of FIG. 6. Whereas, FIG. 8 is an enlarged cross-sectional view along line B-B of FIG. 6. Further, FIG. 9 is an enlarged cross-sectional view along line C-C of FIG. 6. Still further, FIG. 10 is an enlarged cross-sectional view showing an element structure example of the semiconductor chip including a transistor element formed therein shown in FIG. 1. Furthermore, FIG. 11 is an enlarged cross-sectional view showing an element structure example of the semiconductor chip including a diode element formed therein shown in FIG. 1.

Incidentally, in FIGS. 7 and 8, in order to show the shapes in side view of the lead VL1 and the lead CL shown in FIG. 6, FIGS. 7 and 8 show the outline of the lead CL and the outline of the lead VL1 with dotted lines, respectively.

As shown in FIG. 2, the semiconductor device 1 is a semiconductor package having a sealing body 2 made of a resin, and a plurality of leads 3 (lead group) which are a plurality of external terminals exposed from the sealing body 2. The sealing body 2 is made of, for example, an epoxy resin impregnated with a silicon filler. The lead 3 is formed of, for example, Cu (copper), Al (aluminum), or a Fe—Ni (iron-nickel) alloy. Further, the surface of the lead 3 is applied with a solder plating film such as tin-lead plating, pure tin plating which is Pb-free plating, or tin-bismuth plating.

As shown in FIG. 4, the sealing body 2 has, in side view, a top surface (first surface or main surface) $2a$, and a bottom surface (second surface, main surface, or heat radiation member-mounted surface) $2b$ arranged on the opposite side to the top surface $2a$.

Further, as shown in FIGS. 2 and 3, the sealing body 2 has, in plan view, a side (side surface) $2h1$ extending in the X direction, a side $2h2$ extending in the Y direction orthogonal to the X direction, and crossing with the side (side surface) $2h1$, a side $2h3$ extending in the Y direction, and facing to the side (side surface) $2h2$, and a side (side surface) $2h4$ extending in the X direction, and facing to the side $2h1$.

Further, the lead group formed of a plurality of leads 3 exposed from the sealing body 2 is, as shown in FIGS. 2 to 5, arranged along one side (side $2h1$) of respective sides which the sealing body 2 has. In other words, the plurality of leads 3 which are the external terminals of the semiconductor device 1 are arranged collectively closer to the side $2h1$ of the sealing body 2. The semiconductor device 1 is, for example, as shown in FIG. 5, fixed to a mounting substrate (mother board) 20 via a bonding material 21 such as solder by inserting the plurality of leads 3 extending in a rod form into the mounting substrate. In other words, the side surface of the sealing body 2 on the side $2h1$ side serves as the mounting surface of the semiconductor device 1. Therefore, the plurality of leads 3 are collectively arranged along the side $2h1$ arranged on the mounting surface side, which allows easy electrical coupling between the mounting substrate 20 and the plurality of leads 3.

Further, in the sealing body 2, there is formed a through hole $2th$ penetrating in the thickness direction from one surface toward the other surface of the top surface $2a$ shown in FIG. 2 and the bottom surface $2b$ shown in FIG. 3. As shown in FIG. 5, the through hole $2th$ is a hole for fixing the semiconductor device 1 and the heat radiation member 22. When the heat radiation member 22 is attached on the heat radiation member-mounting surface of the semiconductor device 1, a fastening member 23 is inserted into the through hole $2th$ disposed in the sealing body 2 to fasten and fix the sealing body 2 and the heat radiation member 22. FIG. 5 shows an example in which screwing and fixing are achieved by the fastening member 23 including a pair of bolt $23a$ and a nut $23b$.

In the semiconductor device 1, as described above, the plurality of external terminals (leads 3) are collectively arranged on the side $2h1$ side. Then, it is preferable from the viewpoint of reducing the wiring resistance that various internal components electrically coupled with the plurality of leads 3 are arranged close to the leads 3. On the other hand, the position of the through hole $2th$ for fixing the heat radiation member 22 shown in FIG. 5 is desirably a position which can penetrate between the top surface $2a$ and the bottom surface $2b$ of the sealing body 2. Therefore, as shown in FIG. 2, in plan view, the through hole $2th$ is preferably arranged at a position closer to the side $2h4$ than to the side $2h1$ along which the plurality of leads 3 are disposed. This can ensure the space for arranging various internal components in the vicinity of the side $2h1$.

Further, as shown in FIGS. 2 and 3, the lead group including the plurality of leads 3 is arranged along the side $2h1$ of the sealing body 2. Whereas, the plurality of leads 3 are respectively arranged along the X direction, and extend along the Y direction orthogonal to the X direction. In other words, the plurality of leads 3 are arranged in parallel along the X direction, and, the plurality of leads 3 each protrude along the Y direction orthogonal to the X direction from the sealing body 2.

The plurality of leads 3 include the lead (terminal or Vcc terminal) VL1 to be supplied with the first power source potential Vcc shown in FIG. 1, and the lead (terminal or GND terminal) VL2 to be supplied with the second power source potential GND. Further, the plurality of leads 3 include the lead (terminal or gate terminal) GL to be coupled to a gate electrode G1 of the transistor element T1. Still further, the plurality of leads 3 include the lead (terminal or COM terminal) CL arranged between the diode element D1 and the transistor element T1, and coupled to the inductor L1.

The plurality of leads 3 are electrically coupled with the internal components of the semiconductor device shown in FIG. 6. However, in the example shown in FIGS. 2 and 3, the plurality of leads 3 include the lead NC not electrically coupled with the circuit shown in FIG. 1.

As shown in FIG. 6, the semiconductor device 1 has a semiconductor chip (transistor chip) 4, a semiconductor chip (diode chip) 5, a metal plate 6 for mounting the semiconductor chip 4 thereover, and a metal plate 7 for mounting the semiconductor chip 5 thereover inside the sealing body 2. The metal plate 6 and the metal plate 7 are sealed on the chip-mounting surface side thereof by the sealing body 2 while being electrically separated from each other.

As shown in FIG. 9, the semiconductor chip 4 has a front surface 4a including an emitter electrode pad 4ep and a gate electrode pad 2gp formed thereover, and a back surface 4b arranged on the opposite side to the front surface 4a, and including a collector electrode 4cp formed thereover. As shown in FIG. 1, a transistor element T1 is formed in the semiconductor chip 4. The transistor element T1 is electrically coupled with the emitter electrode pad 4ep, the gate electrode pad 4gp, and the collector electrode 4cp of the semiconductor chip 4 shown in FIG. 9. The emitter electrode pad 4ep and the gate electrode pad 4gp are each formed of, for example, an aluminum (Al) alloy. As shown in FIG. 6, the emitter electrode pad 4ep is formed with a wider area than that of the gate electrode pad 4gp in order to reduce the ON resistance of the transistor element.

The transistor element T1 shown in FIG. 1 is, for example, an IGBT element (insulation gate bipolar transistor element) as shown in FIG. 10. FIG. 10 shows the element structure of an n channel type IGBT having a trench gate structure.

Over a $p^+$ type silicon substrate 30 shown in FIG. 10, there are formed an n' type buffer layer 31 and an $n^-$ type epitaxial layer 32. Over the surface of the $n^-$ type epitaxial layer 32, there are formed a $p^+$ type diffusion layer 33 and an $n^+$ type diffusion layer 34. Further, in a part of each n' type diffusion layer 34, there is formed a trench penetrating through the $n^+$ type diffusion layer 34 and the $p^+$ type diffusion layer 33, and reaching the $n^-$ type epitaxial layer 32. In the inside of the trench, there is formed a gate insulation film 35 formed of a silicon oxide film and a gate electrode G1 formed of a poly-crystal silicon film.

The $p^+$ type silicon substrate 30, the $n^+$ type buffer layer 31, the $n^-$ type epitaxial layer 32, and the $p^+$ type diffusion layer 33 form the pnp transistor part of the IGBT. The $p^+$ type diffusion layer 33, the $n^+$ type diffusion layer 34, the gate insulation film 35, and the gate electrode G1 form the MOSFET part of the IGBT. Over the back surface of the $p^+$ type silicon substrate 30, there is formed a collector electrode C1. Over respective top parts of the $p^+$ type diffusion layer 33, and the $n^+$ type diffusion layer 34, there is formed an emitter electrode E1.

Over the top part of the emitter electrode E1, there is formed a surface protective film 36 covering the outermost surface of the $p^+$ type silicon substrate 30. The emitter electrode E1 is formed of an Al (aluminum) alloy film. The surface protective film 36 is formed of, for example, a polyimide resin film. A region of the emitter electrode E1 not covered with the surface protective film 36, namely, a region exposed at the front surface 4a of the semiconductor chip 4, forms the emitter electrode pad 4ep. Further, although not shown, the gate electrode G1 is coupled with a gate lead-out electrode formed of an Al alloy film at the same layer as the emitter electrode E1. A region of the gate lead-out electrode not covered with the surface protective film 36, namely, a region exposed at the front surface 4a of the semiconductor chip 4 forms the gate electrode pad 4gp. Further, the collector electrode C1 formed over the back surface 4b of the semiconductor chip 4 is formed in such a manner as to cover the entire back surface 4b of the semiconductor chip 4, and forms the collector electrode 4cp.

In the semiconductor chip 4, the collector electrode 4cp is formed over the back surface 4b serving as amounting surface, and the emitter electrode pad 4ep is formed over the front surface 4a arranged on the opposite side to the back surface 4b. In other words, the semiconductor chip 4 has an element structure in which a current flows along the thickness direction.

Further, as shown in FIG. 9, the semiconductor chip 5 has a front surface 5a including an anode electrode pad 5ap formed therein, and a back surface 5b arranged on the opposite side to the front surface 5a, and including a cathode electrode 5kp formed therein. As shown in FIG. 1, in the semiconductor chip 5, there is formed a diode element D1. The diode element D1 is electrically coupled with the anode electrode pad 5ap and the cathode electrode 5kp of the semiconductor chip 5 shown in FIG. 9.

The diode element D1 shown in FIG. 1 is, for example, an IGBT element (insulation gate bipolar transistor element) as shown in FIG. 11. FIG. 11 shows the element structure of the diode referred to as a FRD (Fast Recovery Diode).

Over an $n^+$ type silicon substrate 40 shown in FIG. 11, there is formed an $n^-$ type epitaxial layer 41. Over the surface of the $n^-$ type epitaxial layer 41, there is formed a $p^+$ type diffusion layer 42. Further, over the surface of the $p^+$ type diffusion layer 42, there is formed an anode electrode A1. Over the back surface of the $n^+$ type silicon substrate 40, there is formed a cathode electrode K1.

Over the top part of the anode electrode A1, there is formed a surface protective film 43 covering the outermost surface of the $n^+$ type silicon substrate 40. The anode electrode A1 is formed of an aluminum alloy film. The surface protective film 43 is formed of, for example, a polyimide resin film. A region of the anode electrode A1 not covered with the surface protective film 43, namely, a region exposed at the front surface 5a of the semiconductor chip 5 forms the anode electrode pad 5ap. Whereas, the cathode electrode K1 formed at the back surface 5b of the semiconductor chip 5 is formed in such a manner as to cover the entire back surface 5b of the semiconductor chip 5, and forms the cathode electrode 5kp. The anode electrode pad 5ap and the cathode electrode 5kp are each formed of, for example, an Au (gold) film.

In the semiconductor chip 5, at the back surface 5b serving as the mounting surface, there is formed the cathode electrode 5kp, and at the front surface 5a arranged on the opposite side to the back surface 5b, there is formed the anode electrode pad 5ap. In other words, the semiconductor chip 5 has an element structure in which a current flows along the thickness direction.

Further, as shown in FIG. 6, the semiconductor chip 4 and the semiconductor chip 5 are each formed in a tetragonal shape in plan view. In the example shown in FIG. 6, the semiconductor chip 4 forms a rectangle with long sides of about 7 mm, and short sides of about 4 mm. Whereas, the semiconductor chip 5 forms a rectangle with long sides of about 4 mm, and short sides of about 2 mm. Further, each thickness of the semiconductor chips 4 and 5 is, for example, about 0.05 mm to 0.5 mm.

Further, as shown in FIG. 6, the semiconductor chip 4 and the semiconductor chip 5 are mounted over the metal plate 6 and the metal plate 7 electrically isolated from each other. As shown in FIG. 7, the semiconductor chip 4 is mounted over the chip mounting part 6cp of the metal plate 6 via a conductive adhesive material 8C with the back surface 4b facing to the top surface 6a of the metal plate 6. The conductive adhesive material 8C is a die bonding material 8 for electrically coupling the collector electrode 4cp formed at the back surface 4b of the semiconductor chip 4 and the metal plate 6, and, fixing the semiconductor chip 4 over the chip mounting part 6cp of the metal plate 6. For the conductive adhesive material 8C, there can be used a solder material such as Pb—Sn—Ag solder or Sn—Sb solder, or a conductive resin material including a large number of conductive particles (metal particles) mixed in a resin such as Ag paste.

Further, as shown in FIG. 8, the semiconductor chip 5 is mounted over the chip mounting part 7cb of the metal plate 7 via the die bonding material (conductive adhesive material) 8 with the back surface 5b facing to the top surface 7a of the metal plate 7. The conductive adhesive material 8K is the die bonding material 8 for electrically coupling the cathode electrode 5kp formed at the back surface 5b of the semiconductor chip 5 and the metal plate 7, and fixing the semiconductor chip 5 over the chip mounting part 7cb of the metal plate 7. For the conductive adhesive material 8K, as with the conductive adhesive material 8C, there can be used, for example, a solder material such as Pb—Sn—Ag solder or Sn—Sb solder, or a conductive resin material including a large number of conductive particles (metal particles) mixed in a resin such as Ag paste.

Further, as shown in FIGS. 6 and 9, the metal plate 6 and the metal plate 7 are arranged adjacent to each other along the X direction. A gap GSP is arranged along the Y direction between the side 6h3 of the metal plate 6 and the side 7h3 of the metal plate 7. By disposing the gap GSP between the metal plate 6 and the metal plate 7, it is possible to electrically isolate the metal plates 6 and 7. Still further, by arranging (embedding) apart of the sealing body 2 in the gap GSP as shown in FIG. 9, it is possible to insulate the metal plate 6 and the metal plate 7 with reliability.

Then, the metal plate 6 and the metal plate 7 are electrically isolated. As a result, as shown in FIG. 1, different electrical potentials can be supplied to the cathode electrode K1 of the diode element D1 and the emitter electrode E1 of the transistor element T1; and the same electrical potentials can be supplied to the anode electrode A1 of the diode element D1 and the collector electrode C1 of the transistor element T1.

Further, as shown in FIG. 6, the metal plate 6 has a side (side surface) 6h1 extending in the X direction, a side (side surface) 6h2 extending along the Y direction orthogonal to the X direction, a side (side surface) 6h3 facing to the side 6h2, and arranged inwardly of the side 6h2 (on the metal plate 7 side), and a side (side surface) 6h4 facing to the side 6h1. The side 6h2 and the side 6h3 respectively cross with the side 6h1.

Further, the metal plate 7 has a side (side surface) 7h1 extending in the X direction, a side (side surface) 7h2 extending in the Y direction orthogonal to the X direction, a side (side surface) 7h3 facing to the side 7h1, and arranged inwardly of the side 7h2 (on the metal plate 6 side), and a side (side surface) 7h4 facing to the side 7h1. The side 7h2 and the side 7h3 respectively cross with the side 7h1.

Further, The lead group including the plurality of leads 3 is arranged along the Y direction in such a manner as to face to the metal plate 6 and the metal plate 7. In other words, the plurality of leads 3 are respectively arranged side by side on the side 6h1 or the side 7h1 side along the side 6h1 of the metal plate 6, or the side 7h1 of the metal plate 7.

Herein, in the X direction, the chip mounting part 6cb of the metal plate 6 is arranged between the side 6h2 and the side 6h3. Further, the chip mounting part 7cb of the metal plate 7 is arranged between the side 7h2 and the side 7h3.

Further, in the Y direction, the chip mounting part 6cb of the metal plate 6 is arranged on the side closer to the side 6h1 than to the side 6h4. In other words, the semiconductor chip 4 is arranged at a position closer to the side 6h1 than to the side 6h4 of the metal plate 6 in plan view. Whereas, the chip mounting part 7cb of the metal plate 7 is arranged on the side closer to the side 7h1 than to the side 7h4. In other words, the semiconductor chip 5 is arranged at a position closer to the side 7h1 than to the side 7h4 of the metal plate 7 in plan view.

In other words, in the semiconductor device 1, the plurality of leads 3 which are external terminals, and the semiconductor chips 4 and 5 electrically coupled with the plurality of leads 3 are arranged collectively on the side on which the side 6h1 of the metal plate 6 or the side 7h1 of the metal plate 7 is arranged. In other words, in the semiconductor device 1, the plurality of leads 3 which are external terminals, and the semiconductor chips 4 and 5 electrically coupled with the plurality of leads 3 are arranged collectively on the side 2h1 side of the sealing body 2.

Thus, the components forming the electrical circuit included in the semiconductor device 1 are arranged collectively closer to one side of the sealing body 2. This can shorten the distance for establishing an electrical coupling between respective components, which can reduce the impedance component of the conduction path.

Further, the metal plate 6 and the metal plate 7 are arranged adjacent to each other along the X direction. As a result, the semiconductor chip 4 and the semiconductor chip 5 can be arranged close to the lead groups, respectively.

Further, as shown in FIGS. 7 and 8, in side view (cross-sectional view), the metal plates 6 and 7 are arranged on the bottom surface 2b side of the sealing body 2, respectively. On the other hand, in side view, the leads 3 and the metal plate 6 or 7 are arranged at different positions. The plurality of leads 3 are respectively arranged closer to the top surface 2a than the metal plates 6 and 7. In other words, the plurality of leads 3 are respectively arranged, in side view, between the top surface 2a and the bottom surface 2b of the sealing body 2, and are arranged closer to the top surface 2a than the metal plates 6 and 7.

As shown in FIG. 7, the lead CL integrally formed with the metal plate 6 of the plurality of leads 3 is subjected to clinching, and is elevated to the same height as that of the wire coupling surface 3Ba of the lead VL2. Whereas, as shown in FIG. 8, the lead VL1 integrally formed with the metal plate 7 of the plurality of leads 3 is subjected to clinching, and is elevated to the same height as that of the wire coupling surface 3Ba of the lead CL. Further, although not shown, the lead GL and the lead NC of the plurality of leads 3 shown in FIG. 6 are also respectively arranged at the same height of other leads 3 (closer to the top surface 2a than the metal plates 6 and 7).

As described above, in side view, the plurality of leads 3 and the metal plates 6 and 7 are arranged at different heights. Accordingly, even when the distance between the plurality of leads 3 and the metal plates 6 and 7 in plan view is shortened, it is possible to prevent or inhibit the short circuit between the metal plates 6 and 7 and the plurality of leads 3. As a result, it is possible to shorten the distance between the plurality of leads 3 and the metal plates 6 and 7 in plan view. For this reason, it is possible to shorten the distance between respective bonding regions of the plurality of leads 3 and the electrodes pads of the semiconductor chips 4 and 5. In other words, it is possible to shorten the distance of each conduction path for electrically coupling the semiconductor chips 4 and 5 and the plurality of leads 3. This can reduce the impedance component of the conduction path.

Whereas, the metal plates 6 and 7 are each a metal base plate formed of, for example, Cu or a Fe—Ni alloy, and has a function as a header for heat radiation. In each example shown in FIGS. 2 to 6, each portion of the metal plates 6 and 7 protrudes from one side surface (side surface closer to the side 2h4) of the sealing body 2 to the outside. Whereas, as shown in FIG. 3, respective bottom surfaces 6b and 7b of the metal plates 6 and 7 are exposed from the bottom surface 2b of the sealing body 2. Each thickness of the metal plates 6 and 7 and the leads 3 is, for example, about 0.6 mm. Thus, each portion of the metal plates 6 and 7 functioning as a header for heat radiation is exposed from the sealing body 2. As a result, it is possible to improve the heat radiation efficiency by the metal plates 6 and 7.

Further, as shown in FIG. 5, the respective bottom surfaces 6b and 7b of the metal plates 6 and 7 are fixed to the heat radiation member 22. As a result, it is possible to further improve the heat radiation performances of the metal plates 6 and 7. However, from the viewpoint of high heat efficiency improvement, the heat radiation member 22 is preferably formed of a metal member such as aluminum. In this case, the metal plates 6 and 7 are required to be prevented from being electrically coupled to each other via the heat radiation member 22. Therefore, preferably, an insulation plate 24 made of, for example, rubber is interposed between the semiconductor device 1 and the heat radiation member 22, thereby to insulate the metal plate 6 from the metal plate 7.

In order to fix the heat radiation member 22 shown in FIG. 5, as shown in FIG. 6, the through hole 2th is formed in the sealing body 2. Further, in order to allow the through hole 2th to penetrate through the sealing body 2 in the thickness direction thereof, there is formed a through hole 6th penetrating through at least one of the metal plate 6 or the metal plate 7 in the thickness direction thereof. In the example shown in FIG. 6, the through hole 2th is arranged at a position across the metal plate 6 and the metal plate 7. For this reason, the through hole 6th is formed in such a manner as to extend across the metal plate 6 and the metal plate 7. In other words, the through hole 6th is formed from the metal plate 6 to the metal plate 7.

Further, as shown in FIG. 6, the semiconductor chips 4 and 5 and the plurality of leads 3 are electrically coupled, thereby to form the electrical circuit shown in FIG. 1. In the example shown in FIG. 6, the semiconductor chip 4 or 5 and a plurality of leads 3 are electrically coupled via a plurality of wires (metal conductors or conductive members) 9 or conductive adhesive material 8C or 8K. As the plurality of wires 9, there can be used, for example, wires made of aluminum (Al) or made of copper (Cu), or made of gold (Au).

As shown in FIGS. 6 and 7, the emitter electrode pad 4ep formed at the front surface 4a of the semiconductor chip 4 is electrically coupled with the lead VL2 to be supplied with the second power source potential GND via a wire 9E. In the example shown in FIGS. 6 and 7, one end part (first bonding part) of the wire 9E is coupled to the emitter electrode pad 4ep; and the other end part (second bonding part) of the wire 9E is coupled to the wire coupling surface (coupling surface) 3Ba of the lead VL2 arranged at a higher position than that of the emitter electrode pad ep (a position close to the top surface 2a of the sealing body 2).

Further, as shown in FIG. 6, the gate electrode pad 4gp formed at the front surface 4a of the semiconductor chip 4 is electrically coupled with the lead GL to be supplied with an output signal from the control device 13a shown in FIG. 1 via the wire 9G. In the example shown in FIG. 6, the one end part (first bonding part) of the wire 9G is coupled to the gate electrode pad 4gp; and the other end part (second bonding part) of the wire 9G is coupled to the wire coupling surface (coupling surface) 3Ba of the lead GL arranged at a higher position than that of the gate electrode pad gp.

Whereas, as indicated with a dotted line in FIG. 7, the collector electrode 4cp formed at the back surface 4b of the semiconductor chip 4 is electrically coupled with the lead CL integrally formed with the metal plate 6 via the conductive adhesive material 8C. Further, as described above, the lead CL is subjected to clinching, and is elevated to the same height as that of the wire coupling surface 3Ba of the lead VL2.

Further, as shown in FIGS. 6 and 8, the lead CL is coupled with the wire 9A electrically coupled with the anode electrode pad 5ap formed at the front surface 5a of the semiconductor chip 5. In the example shown in FIGS. 6 and 8, one end part (first bonding part) of the wire 9A is coupled to the anode electrode pad 5ap; and the other end part (second bonding part) of the wire 9A is coupled to the wire coupling surface (coupling surface) 3Ba of the lead CL arranged at a higher position than that of the anode electrode pad 5ap (a position closer to the top surface 2a of the sealing body 2). In other words, the collector electrode 4cp of the semiconductor chip 4 (see FIG. 7) and the anode electrode pad 5ap of the semiconductor chip 5 are electrically coupled via the lead CL, and are supplied with the same electrical potential.

Further, as indicated with a dotted line in FIG. 8, the cathode electrode 5kp formed at the back surface 5b of the semiconductor chip 5 is electrically coupled with the lead VL1 integrally formed with the metal plate 7 via the conductive adhesive material 8K. Further, as described above, the lead VL1 is subjected to clinching, and is elevated to the same height as that of the wire coupling surface 3Ba of the lead CL.

As described above, the semiconductor chips 4 and 5 and the plurality of leads 3 are electrically coupled. As a result, it is possible to form the power factor correction circuit 13 as shown in FIG. 1. Namely, the diode element D1 and the transistor element T1 are coupled in series between the lead VL1 to be supplied with the first power source potential Vcc and the lead VL2 to be supplied with the second power source potential GND. Particularly, the cathode electrode K1 of the diode element D1 is electrically coupled with the lead VL1. Whereas, the emitter electrode E1 of the transistor element T1 is electrically coupled with the lead VL2. Whereas, the lead CL coupled to the inductor L1 is electrically coupled between the anode electrode A1 of the diode element D1 and the collector electrode C1 of the transistor element T1. Whereas, the gate electrode G1 of the transistor element T1 is electrically coupled with the lead GL to which a control signal from the control device 13a is outputted.

Further, in the example shown in FIG. 6, each thickness (wire diameter) of the wire 9E and the wire 9A is equal to or larger than the thickness (wire diameter) of the wire 9G. In other words, the cross-sectional area of each conduction path of the wire 9E and the wire 9A is equal to or larger than the cross-sectional area of the conduction path of the wire 9G. Each wire diameter (diameter) of the wire 9E and the wire 9A is, for example, 200 to 500 µm, and the wire diameter (diameter) of the wire 9G is, for example, 125 to 300 µm.

The wire 9E and the wire 9A are coupled between the lead VL1 to be supplied with the first power source potential Vcc and the lead VL2 to be supplied with the second power source potential GND shown in FIG. 1. Accordingly, the wires 9 E and 9A are conduction paths for passing a large current from the switch circuit therethrough. On the other hand, the wire 9G is a conduction path for passing therethrough a control signal for ON/OFF controlling the switch circuit. Therefore, each thickness of the wire 9E and the wire 9A for passing a relatively larger current than that of the wire 9G therethrough is set larger than that of the wire 9G. This can more reduce each resistance value of the wire 9E and the wire 9A than when the wire 9E and the wire 9A are equal to each other in thickness. Further, by reducing each resistance value of the wire 9E and the wire 9A, it is possible to reduce the heat value in the wire 9E or 9A. Further, by reducing the resistance value of the wire 9E, it is possible to reduce the ON resistance of the switching circuit (the resistance when the transistor element T1 shown in FIG. 1 is rendered in the ON state).

<Heat Radiation Characteristics of Semiconductor Device>

Figure 12:
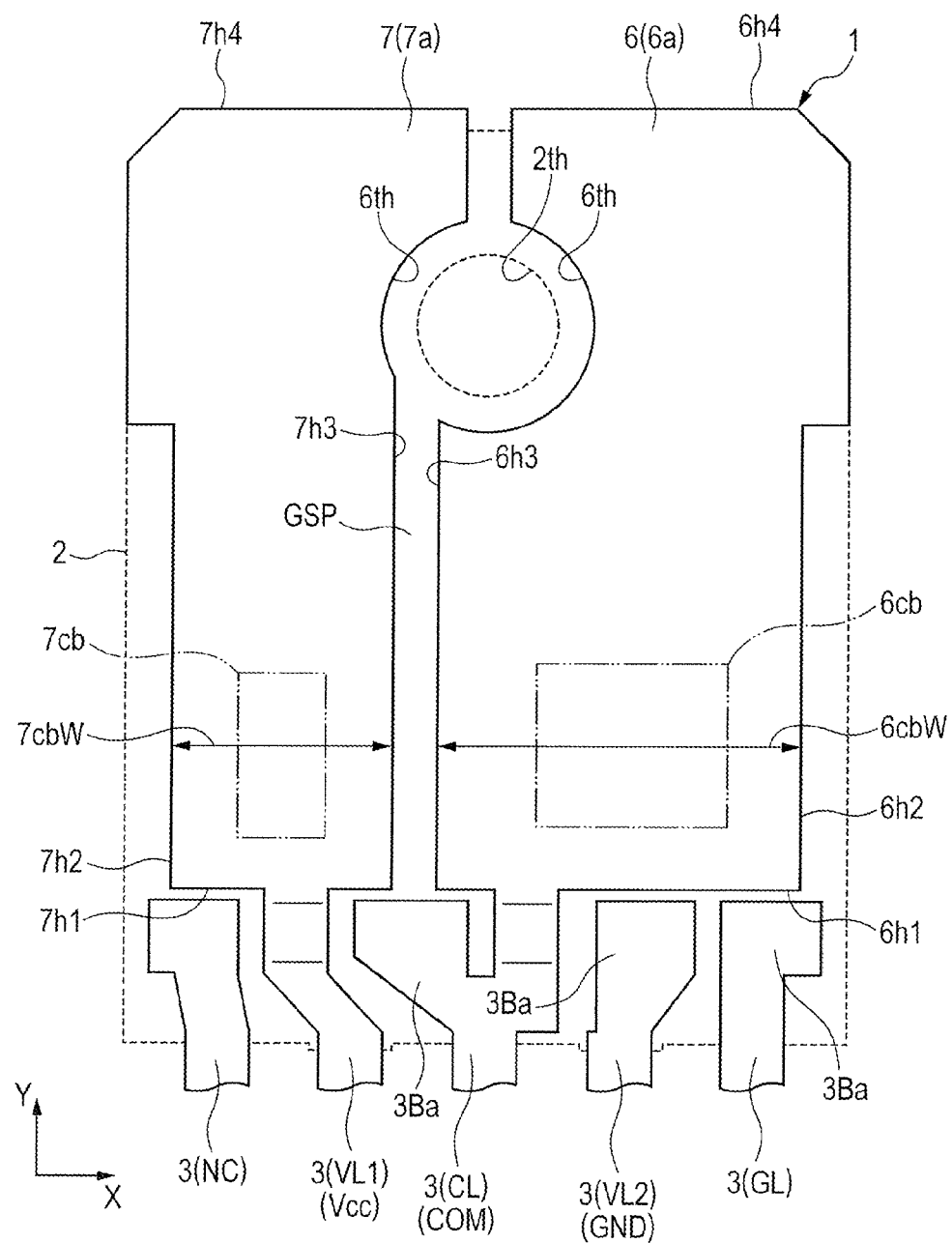
FIG. 12 is an enlarged plan view showing the plan configuration of the metal plate from which the semiconductor chips, the conductive adhesive material, and the wires shown in FIG. 6 have been removed.
Figure 13:
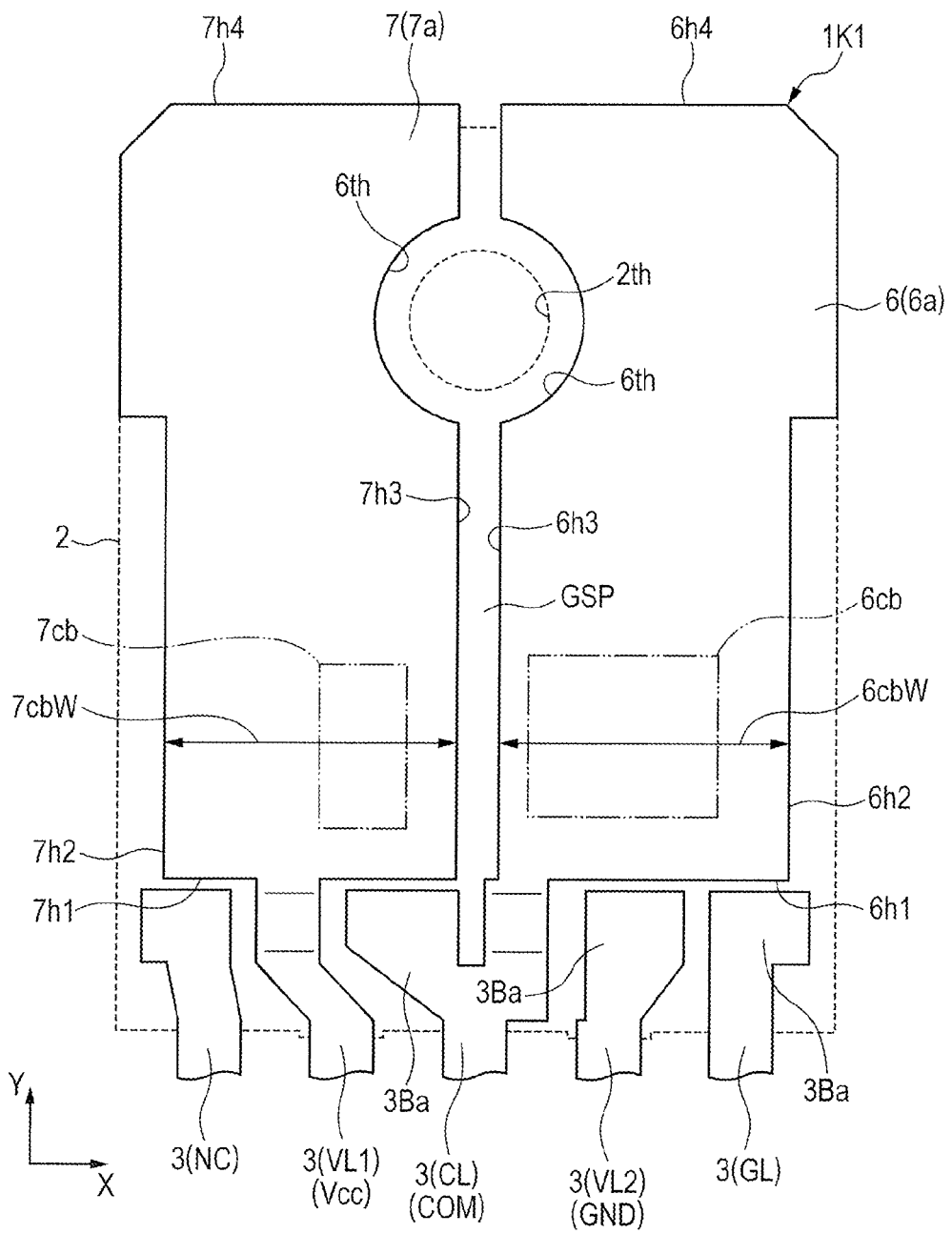
FIG. 13 is an enlarged plan view showing a study example with respect to FIG. 12.
Figure 14:
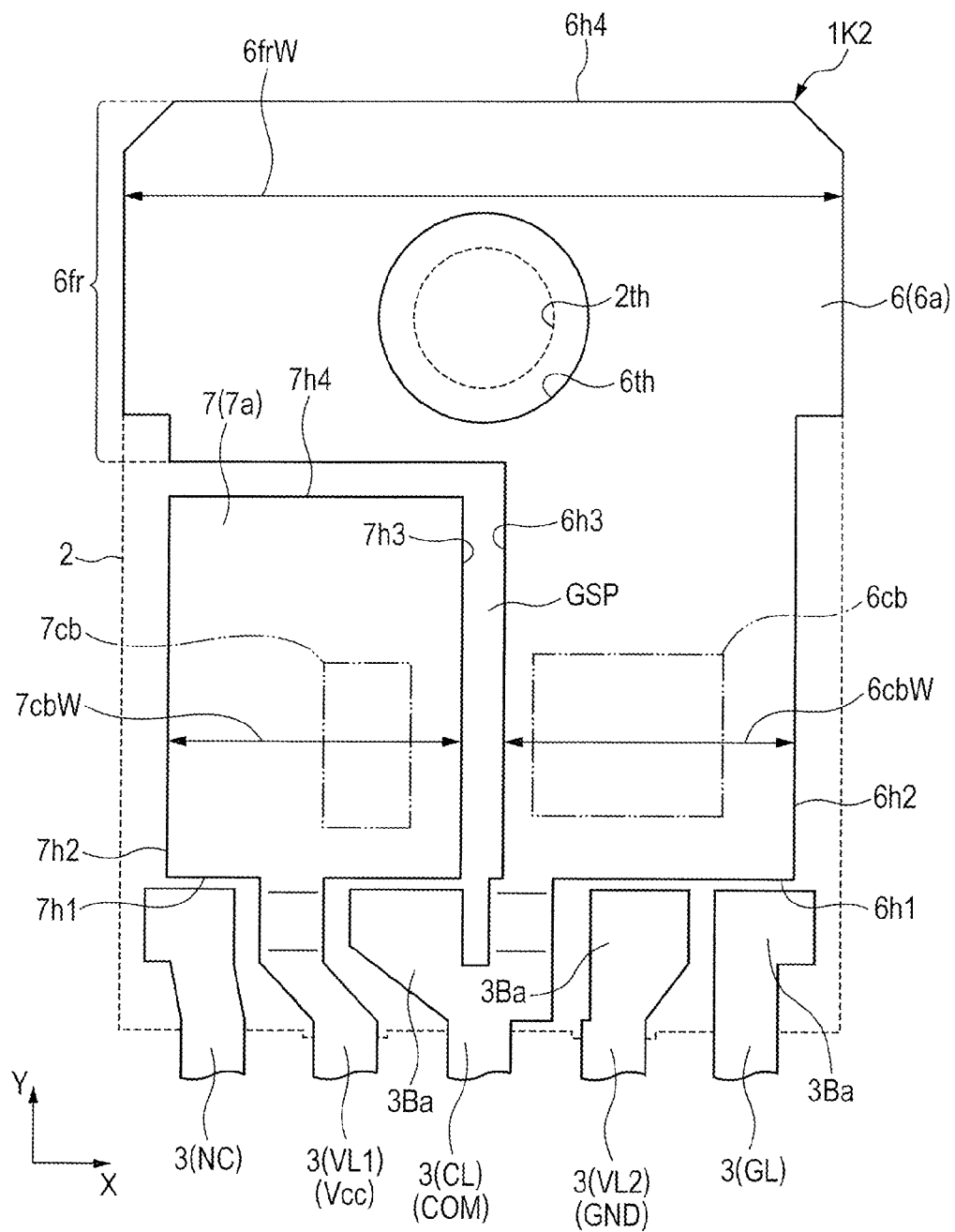
FIG. 14 is an enlarged plan view showing another study example with respect to FIG. 12.
Figure 15:
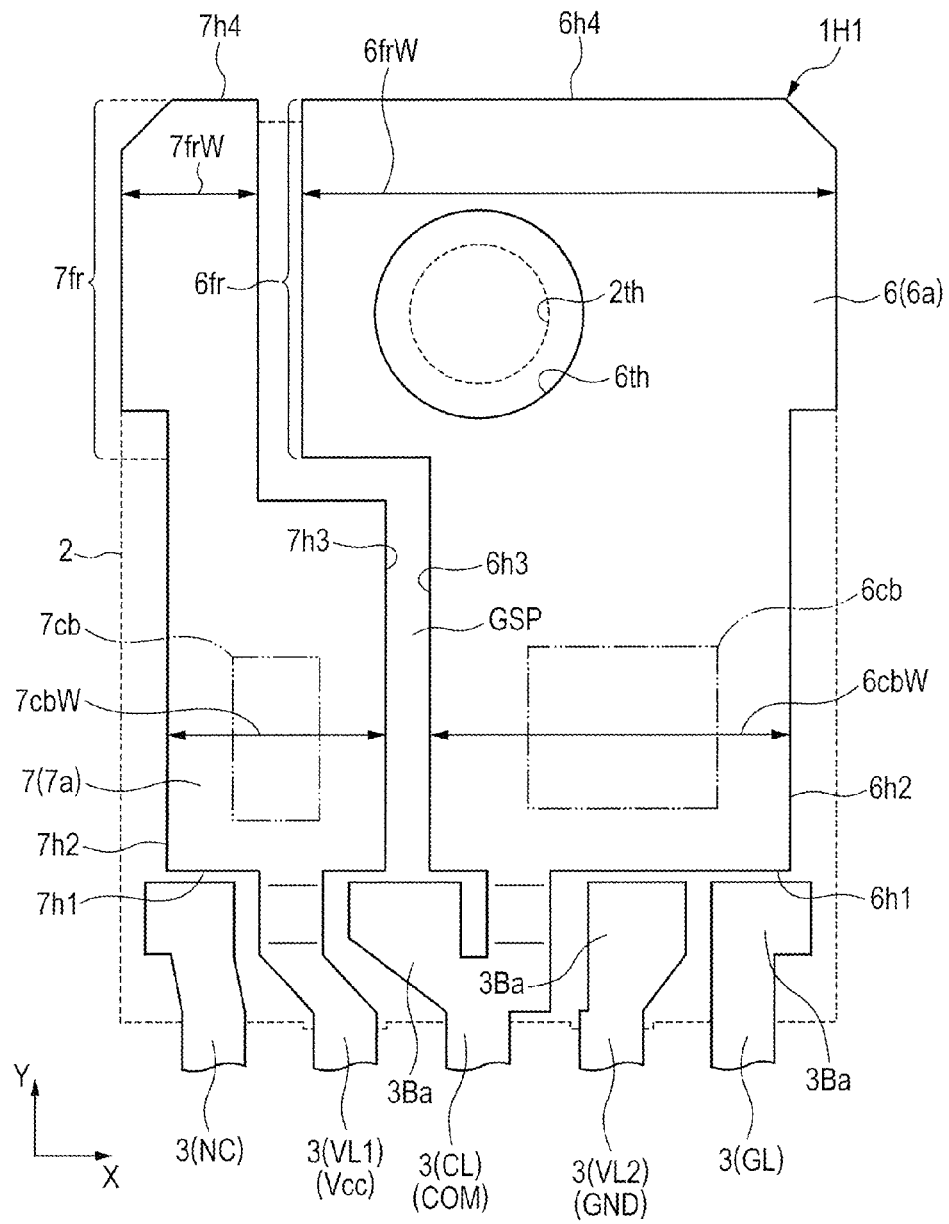
FIG. 15 is an enlarged plan view showing a modified example with respect to FIG. 12.

Then, a description will be given to the heat radiation characteristics of the semiconductor device 1 shown in FIGS. 1 to 9. FIG. 12 is an enlarged plan view showing the plan configuration of the metal plate from which the semiconductor chips, the conductive adhesive material, and the wires shown in FIG. 6 have been removed. Whereas, FIGS. 13 and 14 are each an enlarged plan view showing a study example with respect to FIG. 12. Further, FIG. 15 is an enlarged plan view showing a modified example with respect to FIG. 12. Still further, FIG. 16 is an illustrative view showing the results of evaluation conducted by the present inventors regarding the heat radiation characteristics of the metal plates shown in FIGS. 12 to 15. In the evaluation of the metal plate shown in FIG. 16, evaluation is performed in the following manner. Five semiconductor devices are formed for each semiconductor device shown in FIGS. 12 to 15, and are mounted into the power factor correction circuit 13 shown in FIG. 1. Thus, each temperature rise of respective semiconductor devices 1, 1K1, 1K2, and 1H1 upon supplying an electrical power is measured, and the mean value is calculated. Further, the data in the row of temperature rising rate shown in FIG. 16 denotes the temperature rising rate [° C./W] per unit electrical power upon supplying an electrical power to the power factor correction circuit 13 shown in FIG. 1. Further, the data in the row of improvement ratio shown in FIG. 16 denotes the improvement ratio of the temperature rising rate of the semiconductor device 1K1 relative to the semiconductor device 1K1 shown in FIG. 13 (the reduction ratio of temperature rising rate).

As in the present embodiment, in the semiconductor device to be mounted into the power circuit, the value of the current flowing in the package is large. For this reason, from the viewpoint of reliability improvement, the heat radiation property is preferably improved. Particularly, for the transistor element T1 (see FIG. 1) corresponding to the switching circuit, the heat radiation property of the package is improved, so that the temperature rise in the semiconductor chip is inhibited. As a result, malfunction can be inhibited, which allows the stable switching operation.

Herein, when the semiconductor chips 4 and 5 are mounted over the electrically isolated metal plate 6 and metal plate 7, respectively, as in the present embodiment, there can be considered an embodiment in which the metal plates 6 and 7 are formed so as to be in plan configuration line symmetrical with respect to the gap GSP as a reference line as with the semiconductor device 1K1 shown in FIG. 13. The semiconductor device 1K1 shown in FIG. 13 is different from the semiconductor device 1 shown in FIG. 12 in that the metal plates 6 and 7 are in a plane configuration line symmetrical with respect to the gap GSP as a reference line. In other words, in the semiconductor device 1 shown in FIG. 12, in plan view, the width 6cbW in the X direction of the portion of the metal plate 6 including the chip mounting part 6cb is larger than the width 7cbW in the X direction of the metal plate 7 including the chip mounting part 7cb. On the other hand, the semiconductor device 1K1 shown in FIG. 13 is different from the semiconductor device 1 shown in FIG. 12 in that the width 6cbW and the width 7cbW have the same value. Other points than the differences are the same as those of the semiconductor device 1 shown in FIG. 12, and hence will not be repeatedly described.

When the heat values upon driving (upon supplying an electrical power) of the semiconductor chip 4 and the semiconductor chip 5 shown in FIG. 1 are equal to each other, the metal plates 6 and 7 are formed in a linearly symmetrical shape as with the semiconductor device 1K1 shown in FIG. 13, which can maximize the heat radiation amount from the metal plates 6 and 7.

However, the study by the present inventors has shown the following: at least in the case of the power factor correction circuit 13 shown in FIG. 1, the heat value of the semiconductor chip 4 upon driving (upon supplying an electrical power) is larger than the heat value of the semiconductor chip 5. In other words, it has been shown as follows: the metal plates 6 and 7 are formed in a linearly symmetrical shape as with the semiconductor device 1K1 shown in FIG. 13, the heat radiation performance of the metal plate 6 may be insufficient relative to the heat value of the semiconductor chip 4.

Thus, the present inventors conducted a study on the configuration of a semiconductor device 1K2 shown in FIG. 14 as a configuration in which the plane area of the metal plate 6 for mounting thereover the semiconductor chip 4 having a relatively larger heat value is increased, thereby to improve the heat radiation performance of the metal plate 6. The semiconductor device 1K2 shown in FIG. 14 is different from the semiconductor device 1K1 shown in FIG. 13 in that the width 6frW in the X direction in a region 6fr (a region in which the through hole 6th is arranged) arranged closer to the side 6h4 than the chip mounting part 6cb of the metal plate 6 is equal to or larger than twice the width 6cbW. In the semiconductor device 1K2 shown in FIG. 14, the plane area of the metal plate 6 is equal to or larger than twice the plane area of the metal plate 7. It is considered that the heat radiation performance of the metal plate 6 is improved by increasing the heat capacity of the metal plate 6. Therefore, in the embodiment shown in FIG. 14, the plane area of the whole metal plate 6 is increased, thereby to improve the heat capacity of the metal plate 6, which improves the heat radiation performance. Other points than the difference are the same as those of the semiconductor device 1K1 shown in FIG. 13, and hence, will not be repeatedly described.

When the increase in plane area of the metal plate 6 is the largest factor for improving the heat radiation performance of the metal plate 6, it has been expected as follows: the plane area of the metal plate 6 is set equal to or larger than twice the plane area of the metal plate 7 as with the semiconductor device 1K2 shown in FIG. 14, which can largely improve the heat radiation performance.

However, it has been shown as follows: as shown in FIG. 16, in the case of the semiconductor device 1K2, the value of the temperature rising rate is almost the same as that of the semiconductor device 1K1. The present inventors considered as follows: for the evaluation results of the semiconductor device 1K2, even when the area of the region 6fr closer to the side 6h4 of the metal plate 6 is increased, the distance between the chip mounting part 6cb and the region 6fr is large; in this case, the heat generated at the semiconductor chip 4 (see FIG. 6) is less likely to be radiated. In other words, the present inventors considered as follows: in order to efficiently radiate the heat generated at the semiconductor chip 4, it is necessary to increase the heat capacity of the metal plate 6 in the peripheral portion of the chip mounting part 6cb including the semiconductor chip 4 mounted thereover.

From the study results, the present inventors conducted a study on the configuration shown in FIG. 12. In the semiconductor device 1 shown in FIG. 12, the area of the peripheral region of the chip mounting part 6cb over which the semiconductor chip 4 (see FIG. 6) is mounted is set larger than the area of the peripheral region of the chip mounting part 7cb over which the semiconductor chip 5 (see FIG. 6) is mounted. Particularly, in the semiconductor device 1 shown in FIG. 12, in plan view, the width 6cbW in the X direction of the portion of the metal plate 6 including the chip mounting part 6cb is larger than the width 7cbW in the X direction of the portion of the metal plate 7 including the chip mounting part 7cb. As one example, the width 6cbW is about 8.0 mm, and the width 7cbW is about 5 mm. In other words, in the semiconductor device 1, the area of the region (portion) of the metal plate 6 including the chip mounting part 6cb is larger than the area of the region of the metal plate 7 including the chip mounting part 7cb. In the semiconductor device 1, the width 6cbW is set larger than the width 7cbW, resulting in an increase in area of the portion including the chip mounting part 6cb. As a result, the heat capacity of the portion is improved.

It has been shown as follows: as shown in FIG. 16, the semiconductor device 1 shown in FIG. 12 can be improved in heat radiation performance by about 7.7% than the semiconductor device 1K1 shown in FIG. 13. Further, the plane area of the whole metal plate 6 included in the semiconductor device 1 shown in FIG. 12 is smaller than the plane area of the whole metal plate 6 included in the semiconductor device 1K2 shown in FIG. 14. However, it has been shown as follows: the semiconductor device 1 shown in FIG. 12 can be improved in heat radiation performance by 8% or more than the semiconductor device 1K2 shown in FIG. 14. In other words, from the viewpoint of improving the performance of radiating the heat from the semiconductor chip 4 (see FIG. 6) as a heat source, it has been experimentally confirmed that the size of the plane area (the magnitude of the heat capacity) of the region (portion) including the chip mounting part 6cb exerts a larger effect than that exerted by the size of the plane area (the magnitude of the heat capacity) of the whole metal plate 6.

However, in the semiconductor device 1H1 shown in FIG. 15, the width 6cbW of the metal plate 6 is larger than the width 7cbW of the metal plate 7; and the width 6frW of the metal plate is larger than the width 7frW of the metal plate 7. Incidentally, the width 7frW of the metal plate 7 is defined as the length in the X direction of the metal plate 7 in the region 7fr of the metal plate 7 arranged in parallel with the region 6fr in the X direction. In other words, in the semiconductor device 1H1 shown in FIG. 15, the plane area of the metal plate 6 around the chip mounting part 6cb for mounting the semiconductor chip 4 (see FIG. 6) thereover is larger than the plane area of the metal plate 7 around the chip mounting part 7cb; and the plane area of the whole metal plate 6 is still larger than that of the semiconductor device 1 shown in FIG. 12.

As shown in FIG. 16, it has been indicated that the semiconductor device 1H1 can be further reduced in temperature rising rate than the semiconductor device 1. In other words, it has been indicated that the semiconductor device 1H1 shown in FIG. 15 can be more improved in heat radiation performance than the semiconductor device 1 shown in FIG. 12 by about 0.8%. In other words, from the viewpoint of improving the performance of radiating the heat from the semiconductor chip 4 (see FIG. 6) as a heat source, it has been experimentally confirmed that the size of the plane area of the whole metal plate 6 also exerts an effect.

Further, the evaluation results indicate that the improvement of the heat capacity of the portion of the metal plate 6 including the chip mounting part 6cb can improve the heat radiation performance. The heat capacity of the metal plate 6 can also be improved by increasing the cross-sectional area in the thickness direction of the metal plate 6. Therefore, as shown in FIG. 9, the cross-sectional areas in the X direction of the portion of the metal plate 6 including the chip mounting part 6cb, and in the thickness direction (Z direction) of the metal plate 6 are set larger than the cross-sectional areas in the X direction of the portion of the metal plate 7 including the chip mounting part 7cb and in the thickness direction (Z direction) of the metal plate 7. As a result, the heat capacity can be further increased. In the example shown in FIG. 9, the metal plate 6 and the metal plate 7 have the same thickness. For this reason, when the width 6cbW is set larger than the width 7cbW, the cross-sectional area of the portion of the metal plate 6 including the chip mounting part 6cb can be set larger than the cross-sectional area of the portion of the metal plate 7 including the chip mounting part 7cb.

Further, although not shown, when the thickness of the metal plate 6 is set larger than the thickness of the metal plate 7, the cross-sectional area of the portion of the metal plate 6 including the chip mounting part 6cb can be set still larger than the cross-sectional area of the portion of the metal plate 7 including the chip mounting part 7cb.

Whereas, the evaluation results of the semiconductor device 1H1 shown in FIG. 15 indicate as follows: the plane area of the whole metal plate 6 (the area of the top surface 6a) is set larger than the plane area of the whole metal plate 7 (the area of the top surface 7a); as a result, the heat radiation performance can be further improved. Further, then, when the metal plate 6 and the metal plate 7 have, for example, the same thickness, the volume of the metal plate 6 can be set larger than the volume of the metal plate 7. As a result, the heat capacity of the metal plate 6 is increased, which can improve the heat radiation performance. In both of the semiconductor device 1 shown in FIG. 12 and the semiconductor device 1H1 shown in FIG. 15, the volume of the metal plate 6 is larger than the volume of the metal plate 7. Further, although not shown, when the thickness of the metal plate 6 is set larger than the thickness of the metal plate 7, the volume of the metal plate 6 can be set still larger than the volume of the metal plate 7.

<Method for Manufacturing Semiconductor Device>

Figure 17:
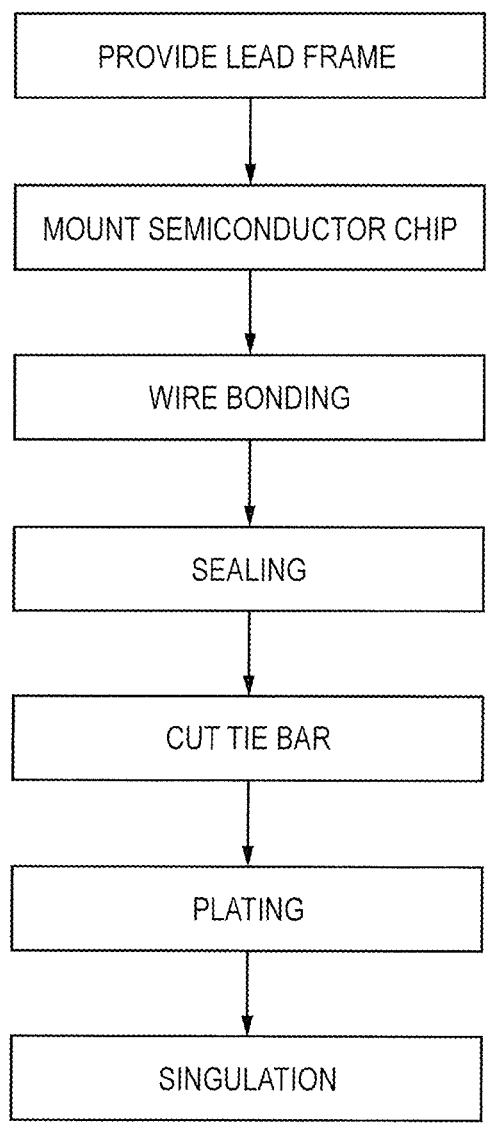
FIG. 17 is an illustrative view showing the general outline of the manufacturing steps of the semiconductor device described by reference to FIGS. 1 to 12.

Then, a description will be given to the manufacturing steps of the semiconductor device 1 described by reference to FIGS. 1 to 12. The semiconductor device 1 is manufactured according to the flow shown in FIG. 17. FIG. 17 is an illustrative view showing the general outline of the manufacturing steps of the semiconductor device described by reference to FIGS. 1 to 12. The details of respective steps will be described below by reference to FIGS. 18 to 29.

<Lead Frame Provision Step>

Figure 18:
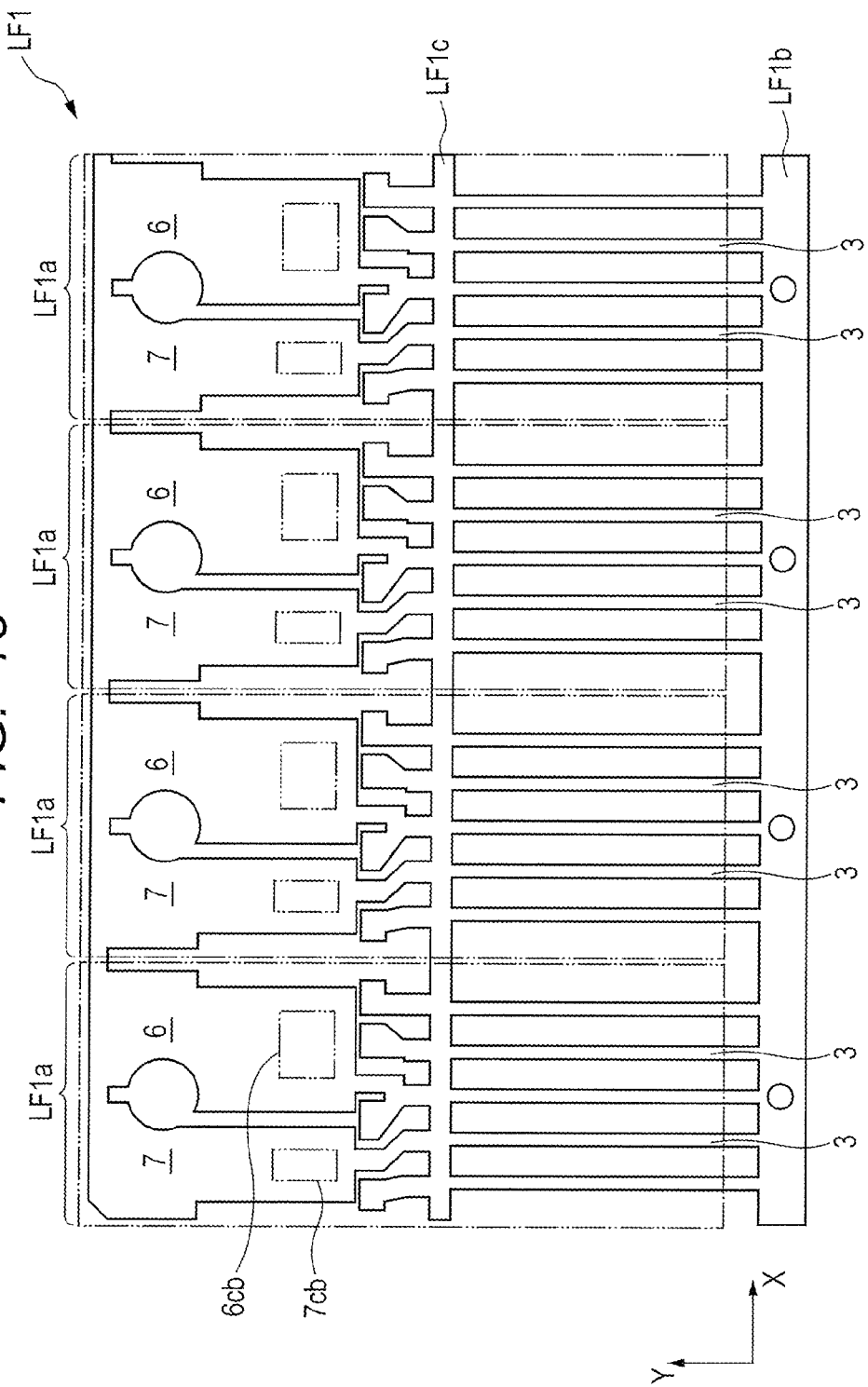
FIG. 18 is a plan view showing the overall structure of a lead frame provided in the lead frame provision step shown in FIG. 17.
Figure 19:
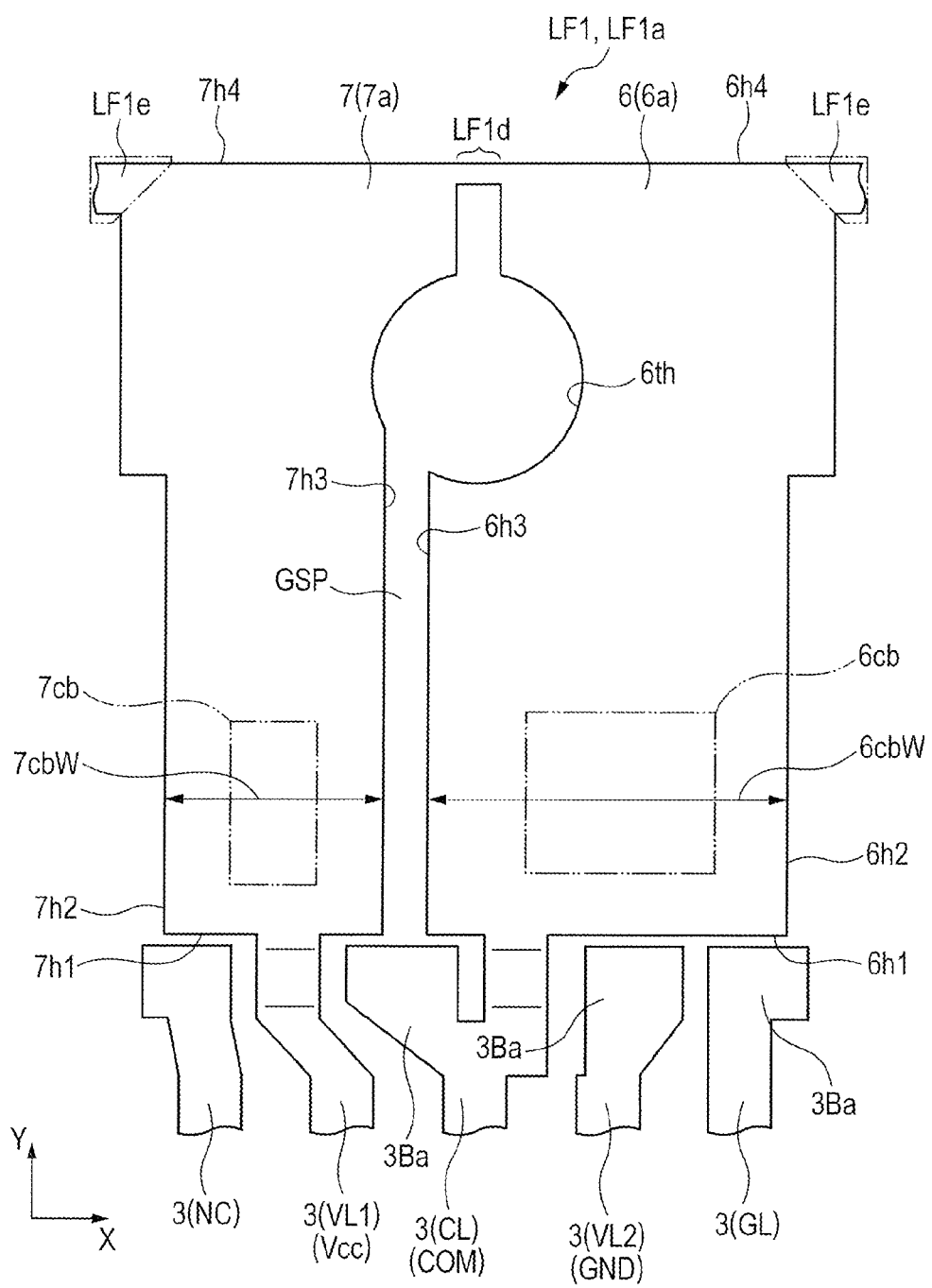
FIG. 19 is an enlarged plan view of one device region shown in FIG. 18.
Figure 20:
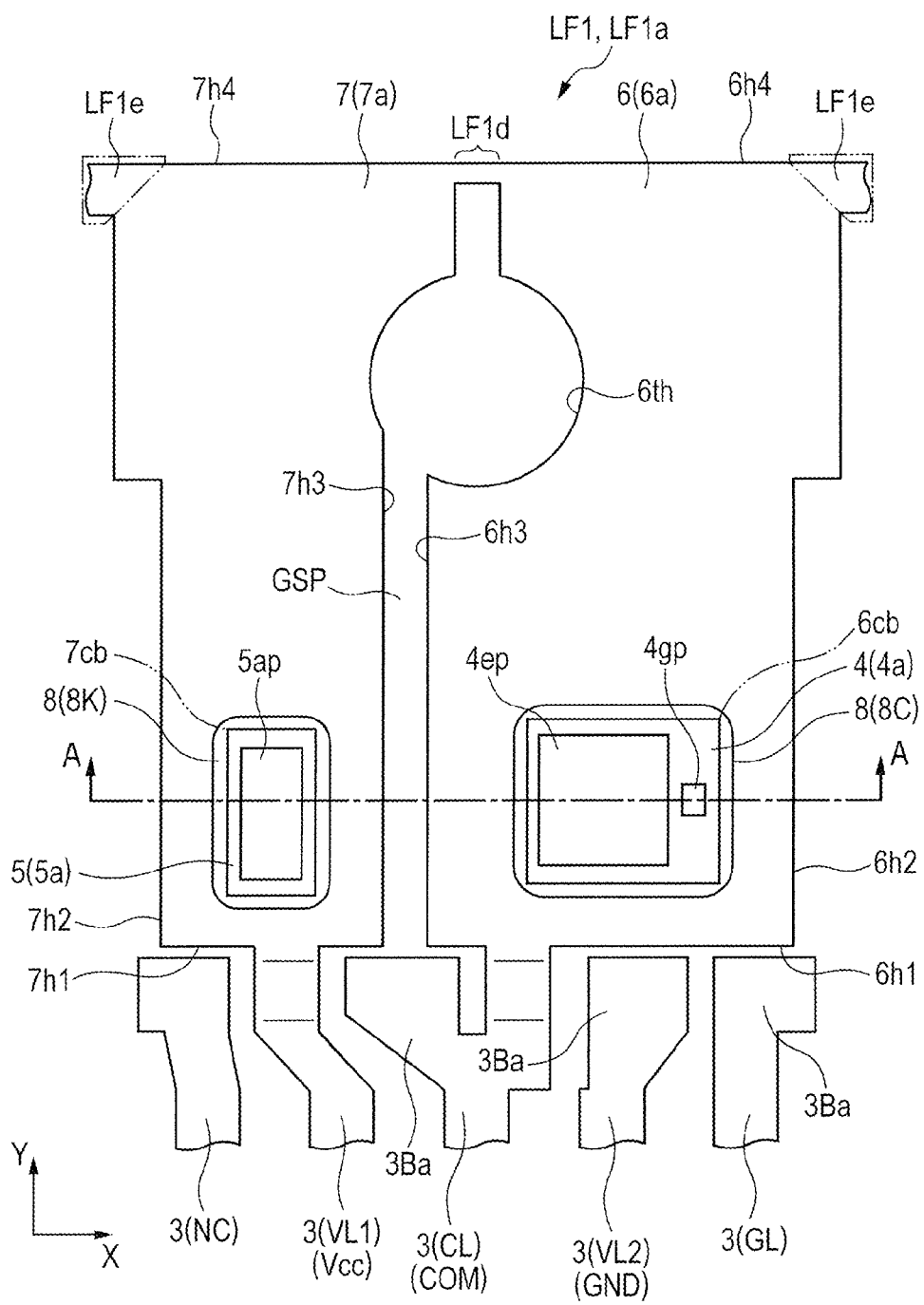
FIG. 20 is an enlarged plan view showing a state in which a semiconductor chip is mounted over the chip mounting part of each metal plate shown in FIG. 19.

First, in the lead frame provision step shown in FIG. 17, a lead frame LF1 shown in FIGS. 18 to 20 is provided. FIG. 18 is a plan view showing the overall structure of a lead frame provided in the lead frame provision step shown in FIG. 17. Whereas, FIG. 19 is an enlarged plan view of one device region shown in FIG. 18. Incidentally, the cross-sectional view of the lead frame shown in FIG. 19 is the same as the state of each cross-sectional view shown in FIGS. 7 to 9 from which the sealing body 2, the semiconductor chips 4 and 5, the die bonding material 8, and the wire 9 have been removed, and hence is not shown, and, if required, will be described by reference to FIGS. 7 to 9.

As shown in FIG. 18, the lead frame LF1 provided in the present step includes a plurality of (four in FIG. 18) device regions LF1a coupled to a support part (frame part) LF1b.

Each of the plurality of device regions LF1a corresponds to one semiconductor device 1 shown in FIG. 6. Further, the support part LF1b supports respective members formed in the device region LF1a until the singulation step shown in FIG. 17. By thus using the lead frame LF1 including the plurality of device regions LF1a, it is possible to manufacture a plurality of semiconductor devices 1 in one step. This can improve the manufacturing efficiency.

Further, although not repeatedly described, in each device region LF1a, there are formed the metal plates 6 and 7 and the plurality of leads 3 described by reference to FIGS. 2 to 12. The plurality of leads 3 respectively extend along the Y direction, and coupled to the support part LF1b at the ends thereof opposite to the metal plates 6 and 7 (see FIG. 18). As shown in FIG. 18, the metal plates 6 and 7 are supported by the support part LF1b via the leads 3. Further, between the metal plates 6 and 7 and the support part LF1b, there is disposed a tie bar LF1 for joining the plurality of leads 3. In the example shown in FIG. 18, for the tie bar LF1c, the tie bar LF1c is arranged at a position closer to the metal plates 6 and 7 than the support part LF1b.

Further, as shown in FIG. 19, at the stage of the present step, the metal plate 6 and the metal plate 7 are joined, resulting in an integral structure. As described above, the metal plate 6 and the metal plate 7 are finally electrically isolated from each other. However, at the manufacturing stage, the metal plates 6 and 7 are preferably joined to each other at some parts thereof. The integration of the metal plates 6 and 7 brings the metal plate 6 and the metal plate 7 into the relationship to mutually reinforce respective support strengths. For this reason, the metal plates 6 and 7 become less likely to be deformed in an unexpected direction during manufacturing steps, and hence become easy to manufacture.

Further, a joint part (first joint part) LF1d for joining the metal plate 6 and the metal plate 7 is arranged connected to the side 6h4 of the metal plate 6 and the side 7h4 of the metal plate 7. In other words, the joint part LF1d is arranged at a position most distant from the support part LF1b shown in FIG. 18. Thus, the joint part LF1d is disposed at a position distant from the support part LF1b, and the metal plate 6 and the metal plate 7 are integrated with each other. As a result, it is possible to improve the support strengths of the metal plates 6 and 7.

Further, between the adjacent device regions LF1a shown in FIG. 18, there is disposed each joint part (second joint part) LF1e for establishing a joint between the device regions LF1a (see FIG. 19). The adjacent device regions LF1a are thus joined. Thus, at a manufacturing stage, the adjacent device regions LF1a are joined. As a result, it is possible to further improve the strengths of the metal plate 6 and the metal plate 7 formed in each device region LF1a.

Further, as with the joint part LF1d, the joint part LF1e is arranged connected to the side 6h4 of the metal plate 6 and the side 7h4 of the metal plate 7. In other words, the joint part LF1e is arranged at a position most distant from the support part LF1b shown in FIG. 18. Thus, the joint part LF1e is disposed at a position most distant from the support part LF1b, and the adjacent device regions LF1a are joined. As a result, it is possible to improve the support strengths of the metal plates 6 and 7.

Further, as shown in FIG. 19, in the device region LF1a of the lead frame LF1 provided in the present step, there have already been formed a through hole 6th penetrating through the metal plates 6 and 7 in the thickness direction, and a gap GSP arranged between the metal plate 6 and the metal plate 7. Further, the lead CL integrally formed with the metal plate 6, and the lead VL1 integrally formed with the metal plate 7 of the plurality of leads 3 are subjected to clinching at the joint parts with the metal plates 6 and 7, respectively. For example, in FIGS. 7 and 8, there is formed a clinched part as indicated with a dotted line.

Other features of the lead frame LF1 provided in the present step than the foregoing ones are as described by reference to FIGS. 5 to 16, and hence will not be repeatedly described.

<Semiconductor Chip Mounting Step>

Figure 21:
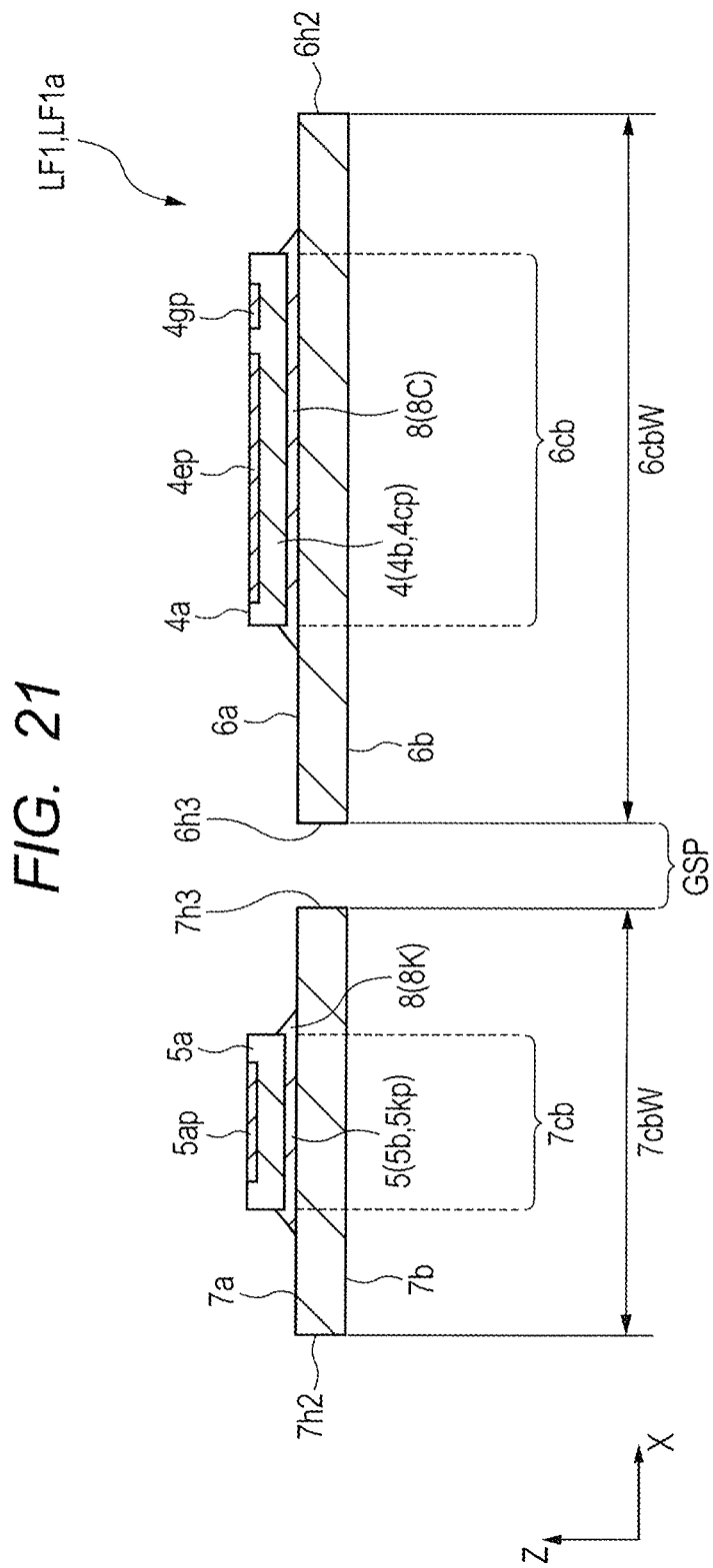
FIG. 21 is an enlarged cross-sectional view along line A-A of FIG. 20.

Then, in the semiconductor chip mounting step shown in FIG. 17, as shown in FIGS. 20 and 21, the semiconductor chip 4 is mounted over the metal plate 6, and the semiconductor chip 5 is mounted over the metal plate 7. FIG. 20 is an enlarged plan view showing a state in which a semiconductor chip is mounted over the chip mounting part of each metal plate shown in FIG. 19. FIG. 21 is an enlarged cross-sectional view along line A-A of FIG. 20.

In the present step, first, over the chip mounting part 6cb of the metal plate 6, there is arranged the conductive adhesive material 8C which is a die bonding material for mounting the semiconductor chip 4. Whereas, over the chip mounting part 7cb of the metal plate 7, there is arranged the conductive adhesive material 8K which is a die bonding material for mounting the semiconductor chip 5.

The conductive adhesive materials 8C and 8K are each a solder material such as Pb—Sn—Ag solder or Sn—Sb solder, or a conductive resin material including a large number of conductive particles (metal particles) mixed in a resin such as Ag paste. When a solder material is used as the conductive adhesive material 8C or 8K, a solder paste including a solder component such as Pb—Sn—Ag solder or Sn—Sb solder, and a flux component for activating the chip mounting surfaces of the metal plates 6 and 7 are arranged (applied) over the chip mounting parts 6cb and 7cb, respectively. Further, when as the conductive adhesive material 8C or 8K, a conductive resin material is used, there is arranged (applied) a conductive particle paste including a large number of conductive particles mixed in a paste-like resin (e.g., Ag paste).

Then, over the chip mounting part 6cb (conductive adhesive material 8C) of the metal plate 6, the semiconductor chip 4 is arranged, and the semiconductor chip 4 is pressed toward the metal plate 6. At this step, as shown in FIG. 21, the semiconductor chip 4 is pressed with the back surface 4b of the semiconductor chip 4 and the top surface 6a of the metal plate 6 facing to each other. As a result, the collector electrode 4cp formed at the back surface 4b of the semiconductor chip 4 is electrically coupled with the metal plate 6 via the conductive adhesive material 8C. On the other hand, the emitter electrode pad 4ep and the gate electrode pad 4gp formed at the front surface 4a of the semiconductor chip 4 are arranged in such a manner as to face the opposite side to the metal plate 6.

Further, over the chip mounting part 7cb of the metal plate 7 (conductive adhesive material 8K), the semiconductor chip 5 is arranged, and the semiconductor chip 5 is pressed toward the metal plate 7. At this step, as shown in FIG. 21, the semiconductor chip 5 is pressed with the back surface 5b of the semiconductor chip 5 and the top surface 7a of the metal plate 7 facing to each other. As a result, the cathode electrode 5kp formed at the back surface 5b of the semiconductor chip 5 is electrically coupled with the metal plate 7 via the conductive adhesive material 8K. On the other hand, the anode electrode pad 5ap formed at the front surface 5a of the semiconductor chip 5 is arranged in such a manner as to face the opposite side to the metal plate 7.

Then, the conductive adhesive materials 8C and 8K are cured, thereby to fix the semiconductor chip 4 over the chip mounting part 6cb of the metal plate 6, and to fix the semiconductor chip 5 over the chip mounting part 7cb of the metal plate 7, respectively. Herein, when as the conductive adhesive materials 8C and 8K, a solder material is used, heating (referred to as a reflow treatment) is conducted to the temperature at which the conductive adhesive materials 8C and 8K are molten. As a result, an alloy layer is formed at each junction interface between the conductive adhesive materials 8C and 8K and the metal plates 6 and 7. Then, the conductive adhesive materials 8C and 8K are cooled, so that the semiconductor chips 4 and 5 are fixed to the metal plates 6 and 7, respectively. Thus, the alloy layer is formed at each junction interface between the conductive adhesive materials 8C and 8K and the metal plates 6 and 7. This can improve each junction strength between the metal plates 6 and 7 and the conductive adhesive materials 8C and 8K. Further, the alloy layer is formed at each junction interface between the conductive adhesive materials 8C and 8K and the metal plates 6 and 7. This can reduce the resistance at each junction interface between the metal plates 6 and 7 and the conductive adhesive materials 8C and 8K. Furthermore, when a solder material is used as the conductive adhesive material 8C or 8K, the residue of the flux component may remain in the periphery of the junction part. For this reason, preferably, after the reflow treatment, a cleaning step is performed, thereby to remove the flux residue and the like.

Alternatively, when a conductive resin material is used as the conductive adhesive materials 8C and 8K, the conductive resin material is heated to the curing temperature of the thermosetting resin included in the conductive adhesive materials 8C and 8K (referred to as a cure bake treatment), thereby to cure the conductive adhesive materials 8C and 8K. As a result, the semiconductor chips 4 and 5 are fixed to the metal plates 6 and 7, respectively. In the case of the conductive resin material, the residue such as the flux residue is less likely to be formed. For this reason, it is possible to omit the cleaning step.

Of a series of procedures of the semiconductor chip mounting step, the order of arranging the conductive adhesive materials 8C and 8K, and the order of pressing the semiconductor chips 4 and 5 have no particular restriction. On the other hand, preferably, the steps of curing the conductive adhesive materials 8C and 8K, and fixing the semiconductor chip 4 over the chip mounting part 6cb of the metal plate 6, and the semiconductor chip 5 over the chip mounting part 7cb of the metal plate 7 are performed at one time.

By the present step, as shown in FIG. 20, the collector electrode 4cp of the semiconductor chip 4 (see FIG. 21) and the lead CL are electrically coupled via the conductive adhesive material 8C and the metal plate 6. Whereas, the cathode electrode 5kp of the semiconductor chip 5 (see FIG. 21) and the lead VL1 are electrically coupled via the conductive adhesive material 8K and the metal plate 7.

<Wire Bonding Step>

Figure 22:
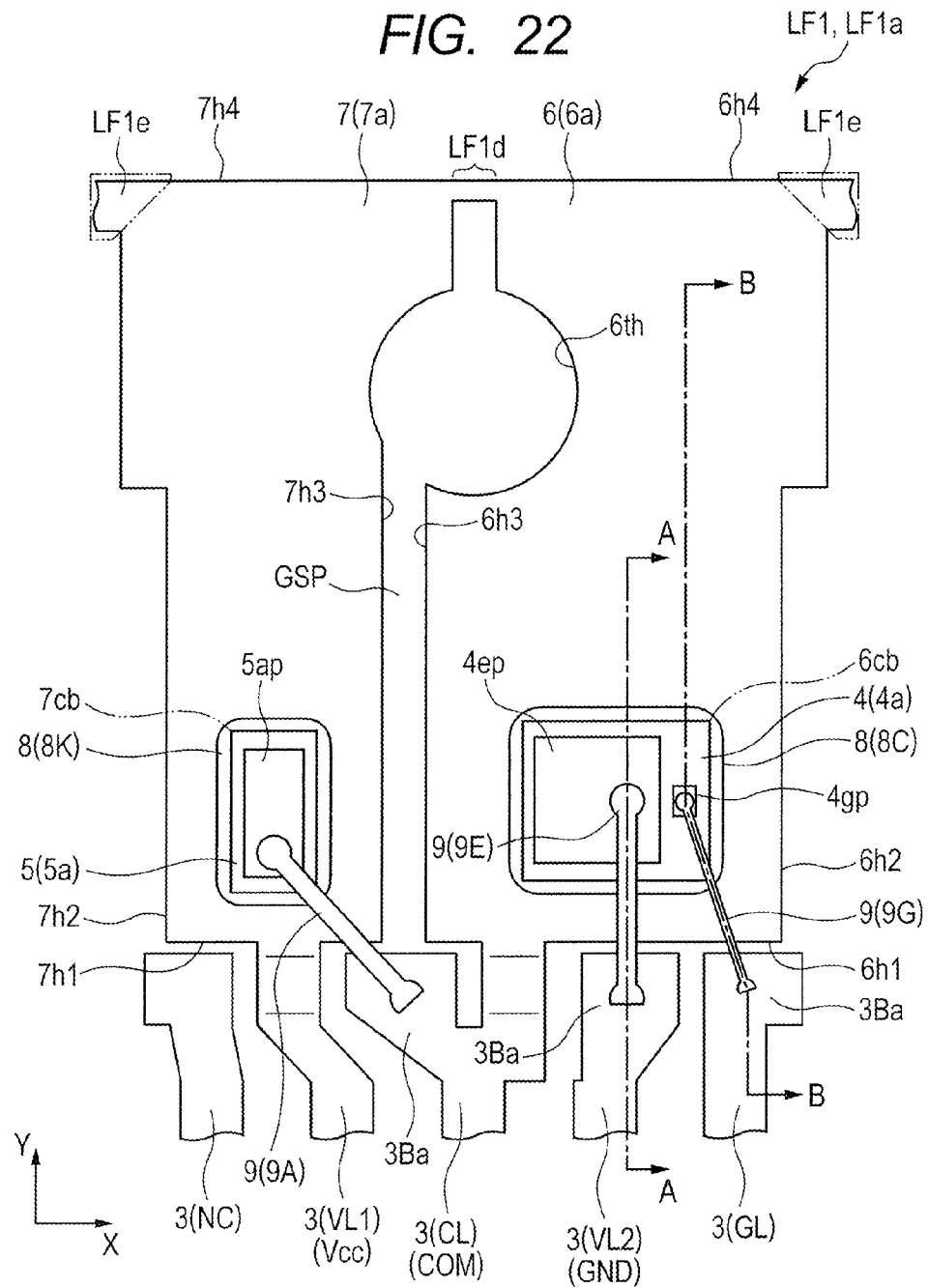
FIG. 22 is an enlarged plan view showing a state in which the semiconductor chips and the leads shown in FIG. 20 are electrically coupled by wire bonding.
Figure 23:
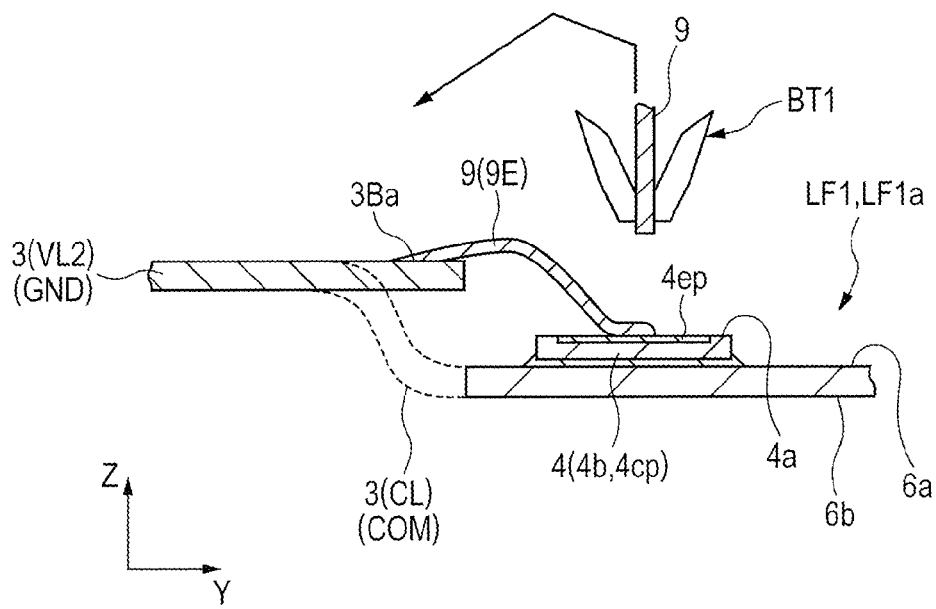
FIG. 23 is a cross-sectional view along line A-A of FIG. 22.
Figure 24:
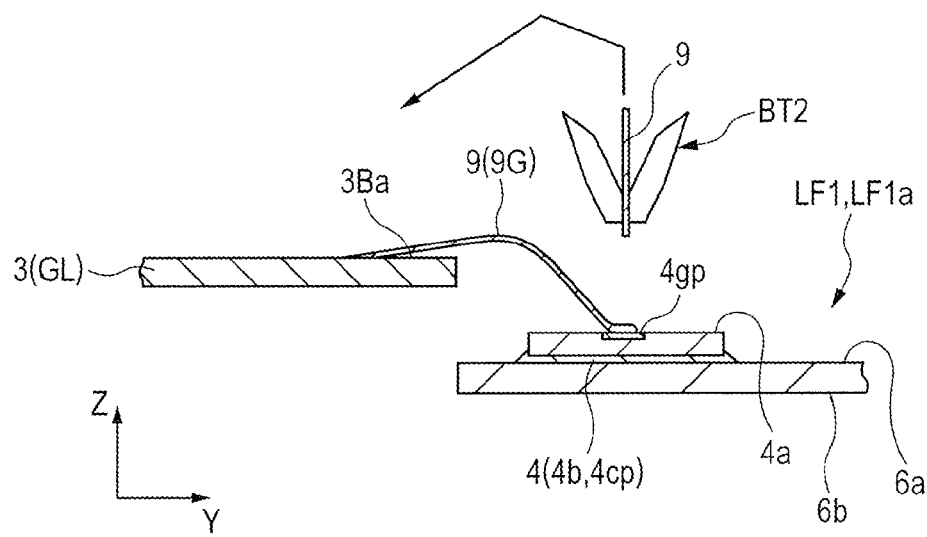
FIG. 24 is a cross-sectional view along line B-B of FIG. 22.

Then, in the wire bonding step shown in FIG. 17, as shown in FIG. 22, the electrode pad on the front surface 4a side of the semiconductor chip 4 and some of the plurality of leads 3, and the electrode pad on the front surface 5a side of the semiconductor chip 5 and others of the plurality of leads 3 are electrically coupled, respectively. FIG. 22 is an enlarged plan view showing a state in which the semiconductor chips and the leads shown in FIG. 20 are electrically coupled by wire bonding. Whereas, FIG. 23 is a cross-sectional view along line A-A of FIG. 22, and FIG. 24 is cross-sectional view along line B-B of FIG. 22. Incidentally, the cross-sectional structure along the wire 9A shown in FIG. 22 is the same as the cross-sectional structure shown in FIG. 23. Further, the cross-sectional structure is shown in FIG. 8, and hence, is not shown, and if required, will be described by reference to FIGS. 8 and 23.

As shown in FIG. 22, in the present step, the emitter electrode pad 4ep formed over the front surface 4a of the semiconductor chip 4 and the lead VL2 of the plurality of leads 3 are electrically coupled via the wire 9E. Whereas, the gate electrode pad 4gp formed over the front surface 4a of the semiconductor chip 4 and the lead GL of the plurality of leads 3 are electrically coupled via the wire 9G. Further, the anode electrode pad 5ap formed over the front surface 5a of the semiconductor chip 5 and the lead CL of the plurality of leads 3 are electrically coupled via the wire 9A. This establishes an electrical coupling between the collector electrode 4cp (see FIG. 23) formed over the back surface 4b (see FIG. 23) of the semiconductor chip 4, and the anode electrode pad 5ap formed over the front surface 5a of the semiconductor chip 5 via the lead CL.

In the present step, as schematically shown in FIGS. 23 and 24, wire bonding is performed using bonding tools BT1 and BT2. In the examples shown in FIGS. 22 to 24, first, the end of each wire 9 exposed from the tips of the bonding tools BT1 and BT2 is bonded to the electrode pad sides of the semiconductor chips 4 and 5. In other words, the emitter electrode pad 4ep, the gate electrode pad 4gp, and the anode electrode pad 5ap shown in FIG. 22 serve as the terminals on the first bond side, respectively. As the bonding method of the wire 9, there may be used a thermo-compression bonding method in which the tip part of the wire 9 and the to-be-joined part to be joined with the wire 9 are heated, and joined by thermo-compression bonding, an ultrasonic method in which an ultrasonic wave is applied from the bonding tool BT1 or BT2 for joining, thereby to form a metallic bond at the junction interface by the ultrasonic energy, or a method using the thermo-compression bonding method and the ultrasonic method in combination. From the viewpoint of improving the junction strength with the wire 9, particularly preferred is the method using the thermo-compression bonding method and the ultrasonic method in combination.

Then, as schematically shown in FIGS. 23 and 24, the bonding tool BT1 or BT2 is moved while drawing a loop shape from the electrode pad side of the semiconductor chip 4 toward the wire coupling surface 3Ba of the lead 3. At this step, the wire 9 is sequentially drawn from the bonding tool BT1 or BT2.

Then, as schematically shown in FIGS. 23 and 24, the tip of the bonding tool BT1 or BT2 is pressed against the wire coupling surface 3Ba of the lead 3, and joined thereto by the thermo-compression bonding method, the ultrasonic method, or the method using the thermo-compression bonding method and the ultrasonic method in combination. Then, the excess portions of the wires 9 are cut, resulting in the formation of the wires 9E, 9G, and 9A shown in FIGS. 22 to 24.

Herein, as described above, preferably, each wire thickness (cross-sectional area) of the wires 9E and 9A which are conduction paths for passing a large current from the switch circuit is equal to or larger than the wire thickness (cross-sectional area) of the wire 9G which is a conduction path for passing a control signal therethrough; and each wire thickness (cross-sectional area) of the wires 9E and 9A is thicker (larger) than the wire thickness (cross-sectional area) of the wire 9G. The wires 9E and 9A are each made thicker than the wire 9G, so that the cross-sectional area of each conduction path of the wires 9E and 9A is made larger than the cross-sectional area of the conduction path of the wire 9G. As a result, the resistance value can be reduced.

For this reason, as indicated with the comparison between FIG. 23 and FIG. 24, in the step of electrically coupling the gate electrode pad 4gp and the lead GL, a thinner wire 9 is joined than that in the step of electrically coupling the emitter electrode pad 4ep and the lead VL2.

In the wire bonding step, a larger energy is required to be applied for junction when the thin wire 9 is joined than when the thick wire 9 is joined. For example, with the bonding tool BT1 shown in FIG. 23, the ultrasonic energy to be applied is larger than that with the bonding tool BT2 shown in FIG. 24. Further, the junction part joined with the thin wire 9 is relatively lower in junction strength than the junction part joined with the thick wire 9. In other words, the junction part between the gate electrode pad 4gp and the wire 9G shown in FIG. 24 is lower in junction strength than the junction part between emitter electrode pad 4ep and the wire 9E shown in FIG. 23.

Therefore, from the viewpoint of preventing the wire 9G from being removed due to the effect of the energy when the emitter electrode pad 4ep is joined, it is preferable that after joining the wire 9E, the wire 9G is joined. Further, it is in particular preferable that after joining the wire 9E and the wire 9A, the wire 9G is joined.

Incidentally, in a modified example described later, a description will be given to an embodiment in which the wire 9E and the wire 9A shown in FIG. 22 are replaced with metallic ribbons, metallic clips, or the like. The same also applies to the case where the wire 9E and the wire 9A are replaced with metallic ribbons, metallic clips, or the like. When the metallic ribbons join the semiconductor chip and the leads, an ultrasonic wave is applied from a bonding tool not shown, thereby to form a metallic bond at the junction interface. Therefore, from the viewpoint of preventing the wire 9G from being removed, preferably, after joining the metallic ribbon, the wire 9G is joined. Alternatively, when the metallic clips join the semiconductor chip and the leads, the electrode pad of the semiconductor chip and each metallic clip are electrically coupled via a solder material. This requires a cleaning step for removing the residue of the flux component after joining. Therefore, from the viewpoint of preventing the contamination of the wire 9G by the cleaning step, preferably, after the cleaning step, the wire 9G is formed.

<Sealing Step>

Figure 25:
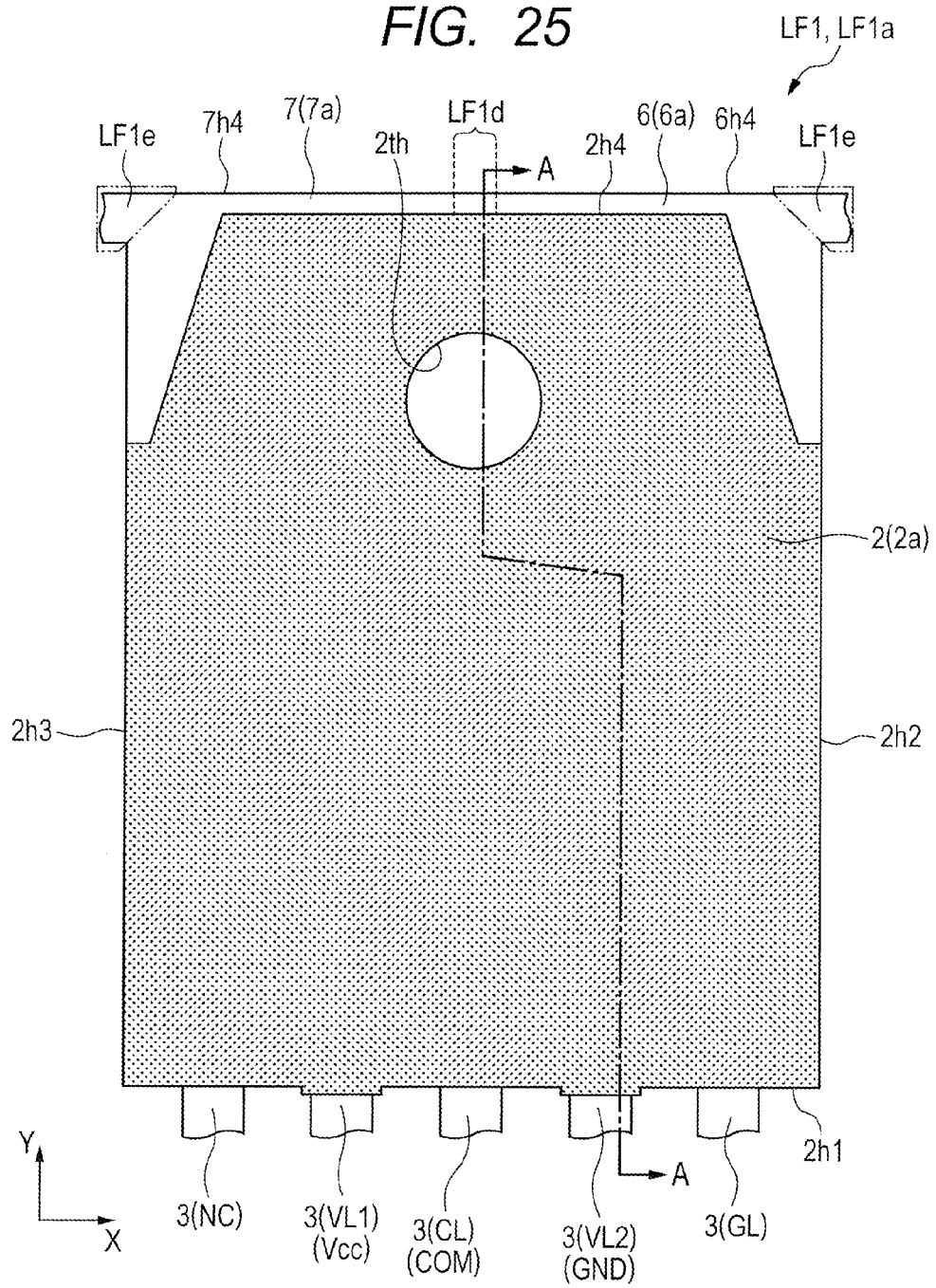
FIG. 25 is an enlarged plan view showing a state in which a sealing body for sealing a plurality of semiconductor chips is formed in the device region shown in FIG. 22.
Figure 26:
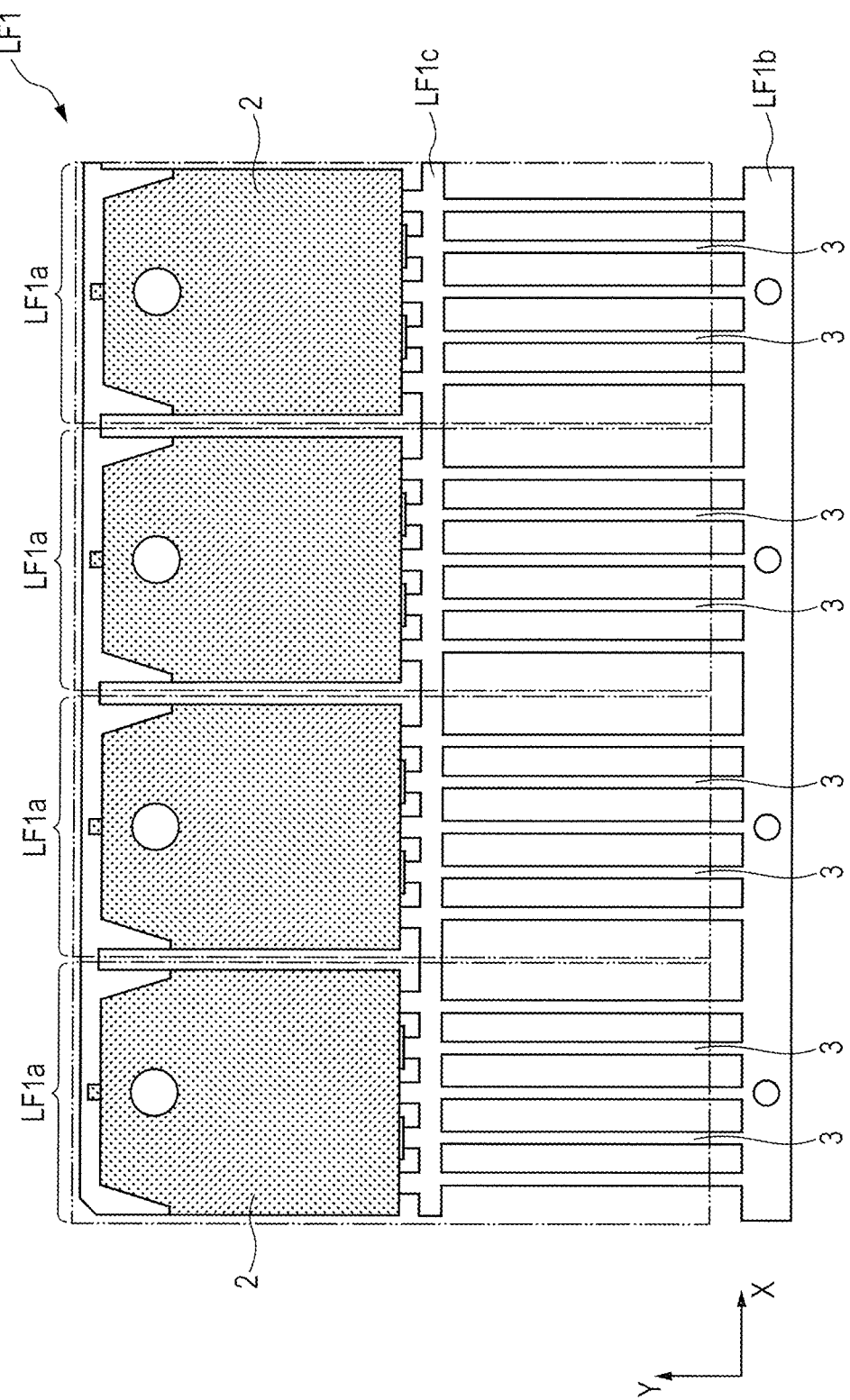
FIG. 26 is a plan view of the whole lead frame including the sealing body shown in FIG. 25 formed thereon.

Then, in the sealing step shown in FIG. 17, the semiconductor chips 4 and 5, and respective portions of the plurality of leads 3 shown in FIG. 22 are sealed by a resin (sealing resin), thereby to form the sealing body 2 shown in FIG. 25. FIG. 25 is an enlarged plan view showing a state in which a sealing body for sealing a plurality of semiconductor chips is formed in the device region shown in FIG. 22. Whereas, FIG. 26 is a plan view of the whole lead frame including the sealing body shown in FIG. 25 formed thereon. Further, FIG. 27 is an enlarged cross-sectional view showing a state in which the device region of the lead frame is arranged in a molding die in the enlarged cross-section along line A-A of FIG. 25.

In the present embodiment, as shown in FIG. 26, in each of the plurality of device regions LF1a, the sealing body 2 is formed. The semiconductor chips 4 and 5, the wires 9E, 9A, and 9G, and respective portions of the plurality of leads 3 shown in FIG. 22 are sealed by a resin (sealing resin). As shown in FIG. 25, the sealing body 2 is formed of, for example, an epoxy resin impregnated with a silicon filler, and has a top surface 2a, and sides 2h1, 2h2, and 2h3, and side 2h4 surrounding the circumference of the top surface 2a.

Figure 27:
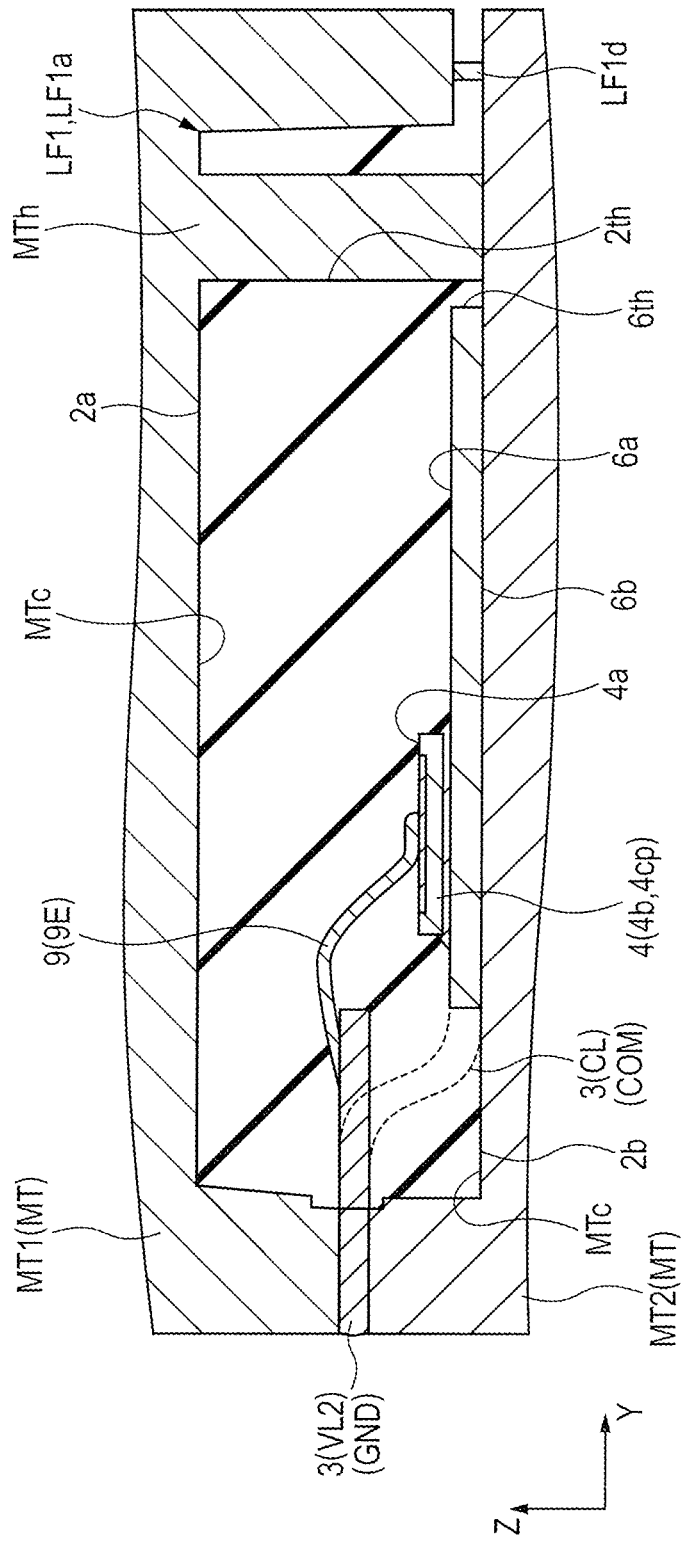
FIG. 27 is an enlarged cross-sectional view showing a state in which the device region of the lead frame is arranged in a molding die in the enlarged cross-section along line A-A of FIG. 25.

Further, in the present step, for example, as shown in FIG. 27, using a molding die MT including an upper die (first die) MT1 and a lower die (second die) MT2, the sealing body 2 is formed by a so-called transfer molding method.

In the example shown in FIG. 27, the lead frame LF1 is arranged so that the metal plates 6 and 7, the semiconductor chips 4 and 5, the plurality of wires 9, and respective portions of the plurality of leads 3 formed in the device region LF1a shown in FIG. 22 are arranged in the cavity MTc formed in the upper die MT1. Then, the lead frame LF1 is clamped (sandwiched) by the upper die MT1 and the lower die MT2. Particularly, the top surface and the bottom surface of the lead 3, and portions closer to the sides 6h4 and 7h4 of the metal plates 6 and 7 shown in FIG. 25 are clamped. In this state, the softened (plasticized) thermosetting (insulation resin) is press-fitted into the cavity MTc of the molding die MT. Then, the insulation resin is supplied into the space formed by the cavity MTc and the lower die MT2, and is molded following the shape of the cavity MTc.

At this step, when the bottom surface 6b of the metal plate 6 is brought into close contact with the lower die MT2, as shown in FIG. 27, the bottom surface 6b of the metal plate 6 is exposed from the sealing body 2. Whereas, when the bottom surface 7b of the metal plate 7 shown in FIG. 8 is brought into close contact with the lower die MT2 shown in FIG. 27, as shown in FIG. 8, the bottom surface 7b of the metal plate 7 is exposed from the sealing body 2. Further, as described above, when the upper die MT1 shown in FIG. 27 is pressed against the portions of the metal plates 6 and 7 closer to the sides 6h4 and 7h4 shown in FIG. 25, the portions of the metal plates 6 and 7 closer to the sides 6h4 and 7h4 are exposed from the sealing body 2 as shown in FIG. 25.

Further, when a columnar member MTh is arranged in a region for forming the through hole 2th therein as shown in FIG. 27, the through hole 2th can be formed.

Herein, with the transfer molding method, the sealing resin is applied with a pressure, and is supplied into the cavity MTc. For this reason, from the viewpoint of inhibiting the deformation of the metal plates 6 and 7, and the like by the resin supplying pressure, the metal plates 6 and 7 are each preferably clamped and pressed by the molding die MT.

Therefore, when the side 6h4 of the metal plate 6 and the side 7h4 of the metal plate 7 are not arranged in parallel along the X direction as with the semiconductor device 1K2 shown in FIG. 14 described above, the metal plate 7 cannot be clamped. Therefore, from the viewpoint of supplying a resin with stability in the sealing step, preferably, the side 6h4 of the metal plate 6 and the side 7h4 of the metal plate 7 are arranged in parallel along the X direction as with the semiconductor device 1 shown in FIG. 12, the semiconductor device 1K1 shown in FIG. 13, or the semiconductor device 1H1 shown in FIG. 15.

Further, in the present step, as shown in FIG. 9, a sealing resin is arranged in the gap GSP disposed between the metal plate 6 and the metal plate 7. The width in the X direction of gap GSP is, as shown in FIG. 9, narrower than the width 6cbW and the width 7cbW. As one example, the width 6cbW is about 8.0 mm, and the width 7cbW is about 5 mm. By reducing the width in the X direction of the gap GSP, it is possible to reduce the package size. As one example, the gap GSP has a width of about 1.0 mm. On the other hand, the reduction in width of the gap GSP requires ensuring of the insulation property when a voltage as high as, for example, 600 volts is applied across the metal plate 6 and the metal plate 7. Further, in order to facilitate the heat radiation performance design, the heat exchange between the metal plate 6 and the metal plate 7 is preferably reduced.

When the sealing body is formed by a transfer molding method as in the present embodiment, the resin supplying pressure and supplying direction can be adjusted. For this reason, even when the width of the gap GSP is small, the resin can be arranged with reliability. As a result, a high insulation property can be ensured between the metal plate 6 and the metal plate 7. Further, a heat exchange can be reduced between the metal plate 6 and the metal plate 7.

<Tie Bar Cutting Step>

Figure 28:
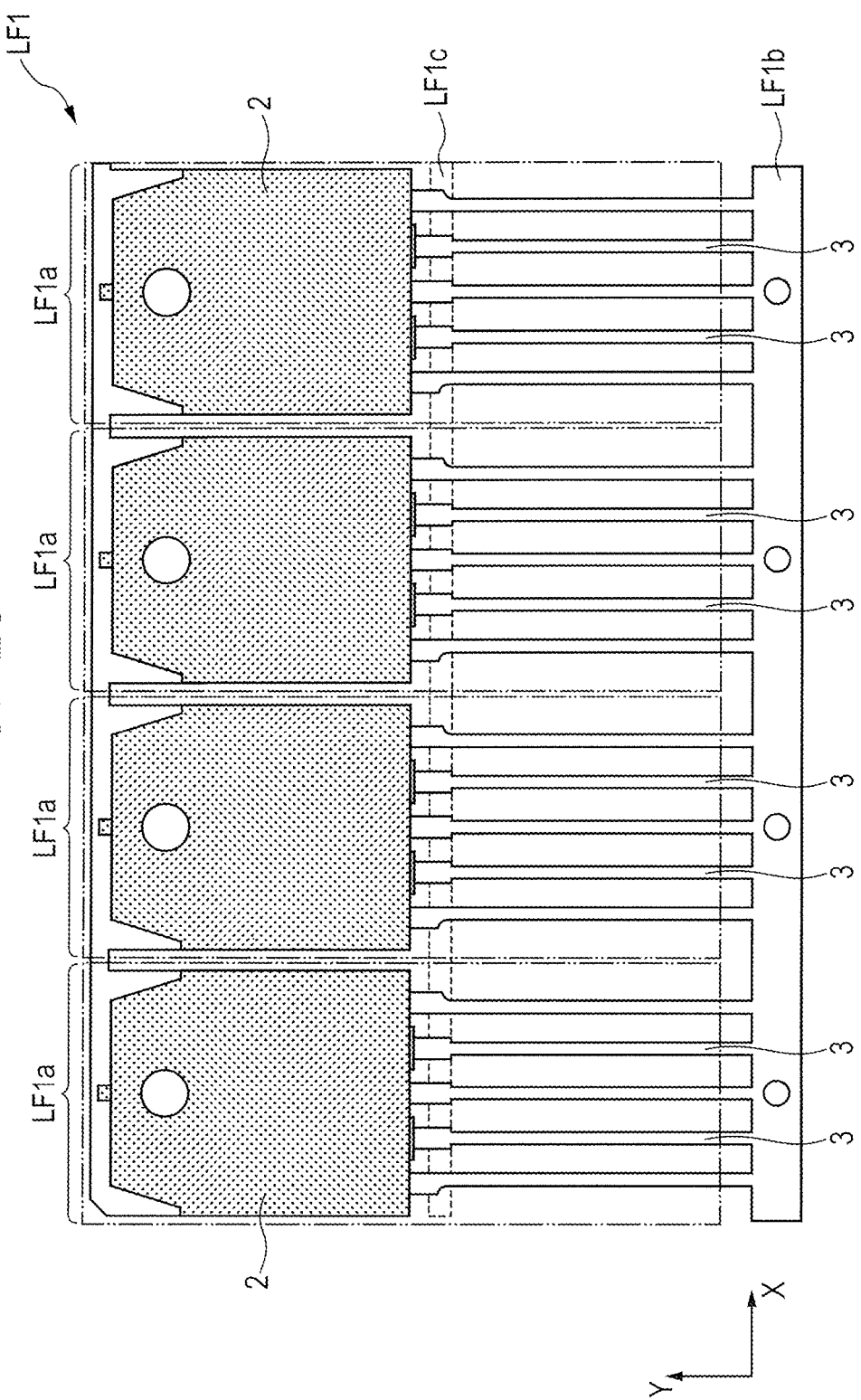
FIG. 28 is a plan view showing a state in which the tie bar shown in FIG. 26 has been cut.

Then, in the tie bar cutting step shown in FIG. 17, the tie bar LF1c for connecting each of the plurality of leads 3 is cut as shown in FIG. 28. FIG. 28 is a plan view showing a state in which the tie bar shown in FIG. 26 has been cut. Incidentally, in FIG. 28, for easy understanding of the cut portion of the tie bar LF1c, the to-be-cut region of the tie bar LF1c is indicated with a dotted line.

<Plating Step>

Then, in the plating step shown in FIG. 17, over each exposed surface of the plurality of leads 3 shown in FIG. 28, a metal film for improving the wettability with the solder material is formed by a plating method. In the present step, for example, the lead frame LF1 is immersed in a plating solution not shown, thereby to form a metal film over the surface of each exposed portion of the leads 3 exposed from the sealing body 2. Examples of the metal film formed by the plating method may include solder plating films such as tin-lead plating, pure tin plating which is Pb-free plating, and tin-bismuth plating.

<Singulation Step>

Figure 29:
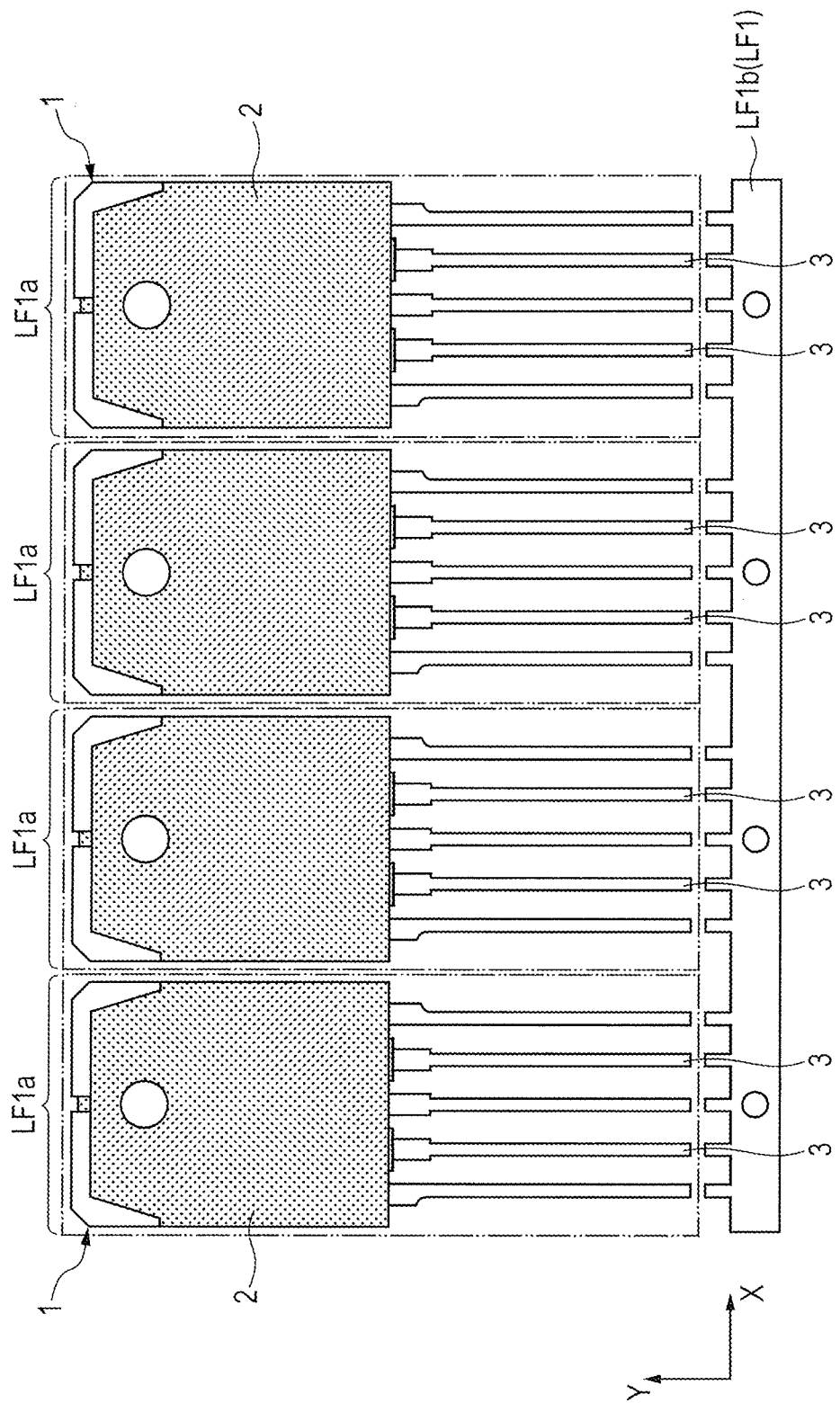
FIG. 29 is a plan view showing a state in which the lead frame shown in FIG. 28 has been singulated.

Then, in the singulation step shown in FIG. 17, as shown in FIG. 29, the plurality of device regions LF1a are respectively cut apart from the support part LF1b of the lead frame LF1, and are divided into individual pieces. FIG. 29 is a plan view showing a state in which the lead frame shown in FIG. 28 has been singulated.

In the present step, as shown in FIG. 29, portions of the plurality of leads 3 are cut, thereby to separate respective device regions LF1a from the support part of the lead frame. As a result, the plurality of leads 3 are electrically isolated from one another. In the example shown in FIG. 29, the plurality of leads 3 extending in the Y direction are cut at respective positions closer to the support part LF1b of the lead frame LF1 than to the sealing body 2. Further, in the present step, the joint part LF1d for joining the metal plate 6 and the metal plate 7 shown in FIG. 25, and the joint part LF1e for establishing a joint between the adjacent device regions LF1a are cut, respectively. As a result, the metal plate 6 and the metal plate 7 are isolated from each other. The cutting method in the present step has no particular restriction. For example, cutting can be performed by press forming using a cutting die.

The respective steps up to this point result in the semiconductor device 1 described by reference to FIGS. 1 to 12. Then, necessary inspections and tests such as an outward appearance inspection and an electrical test are performed. Then, shipment, or mounting over a mounting substrate not shown is performed.

Modified Example

Up to this point, the invention made by the present inventors was specifically described by way of embodiments. However, it is naturally understood that the present invention is not limited to the embodiments, and may be variously changed within the scope not departing from the gist thereof.

Modified Example 1

For example, in the embodiment, a description has been given to the semiconductor package of the type in which the metal plates 6 and 7 are partially exposed from the sealing body 2. However, as a modified example, there is applicable a structure in which the whole metal plates 6 and 7 are sealed by the sealing body 2 as with a semiconductor device 1H2 shown in FIGS. 30 to 32.

Figure 30:
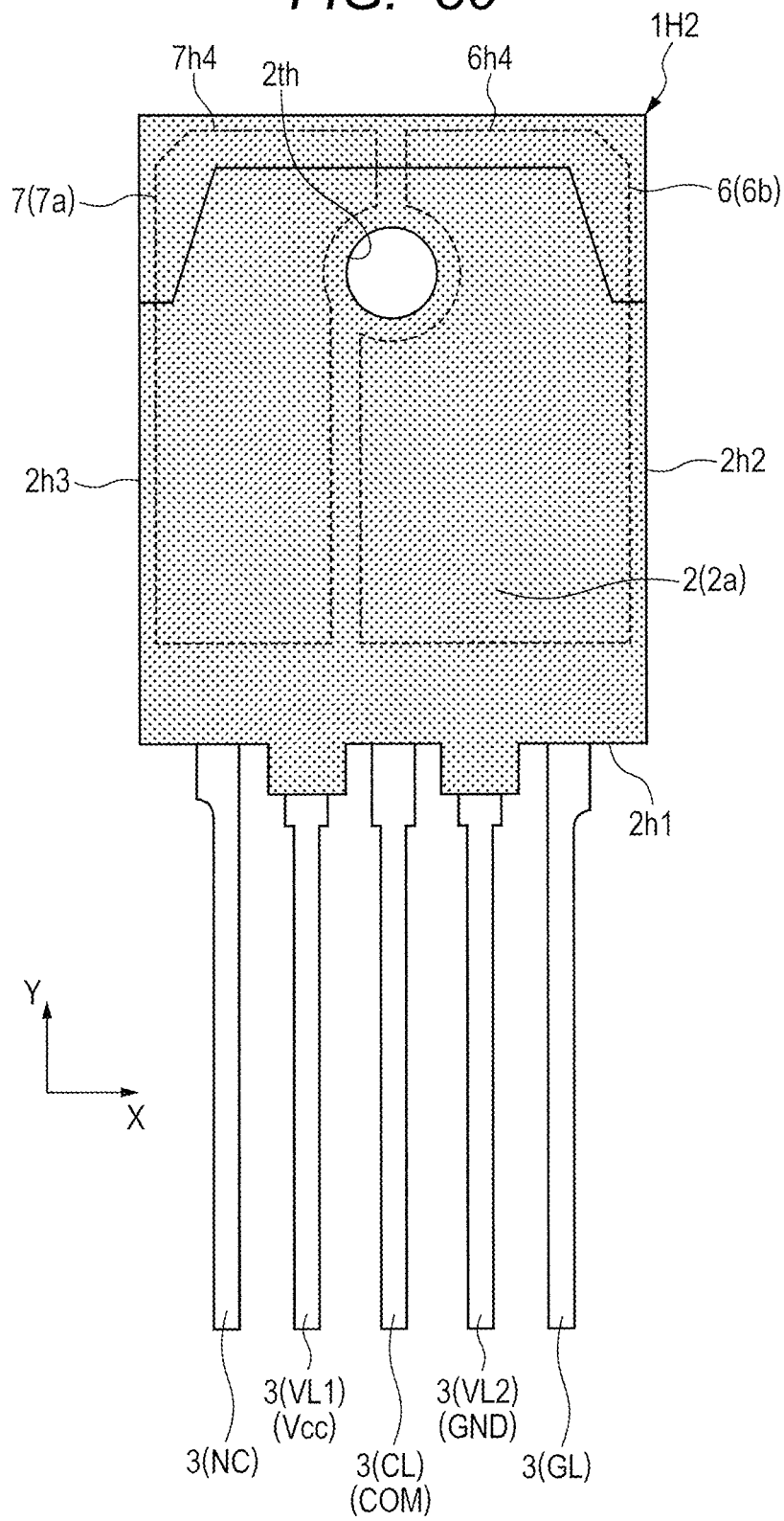
FIG. 30 is a plan view showing the outward appearance of a semiconductor device which is a modified example with respect to FIG. 2.
Figure 31:
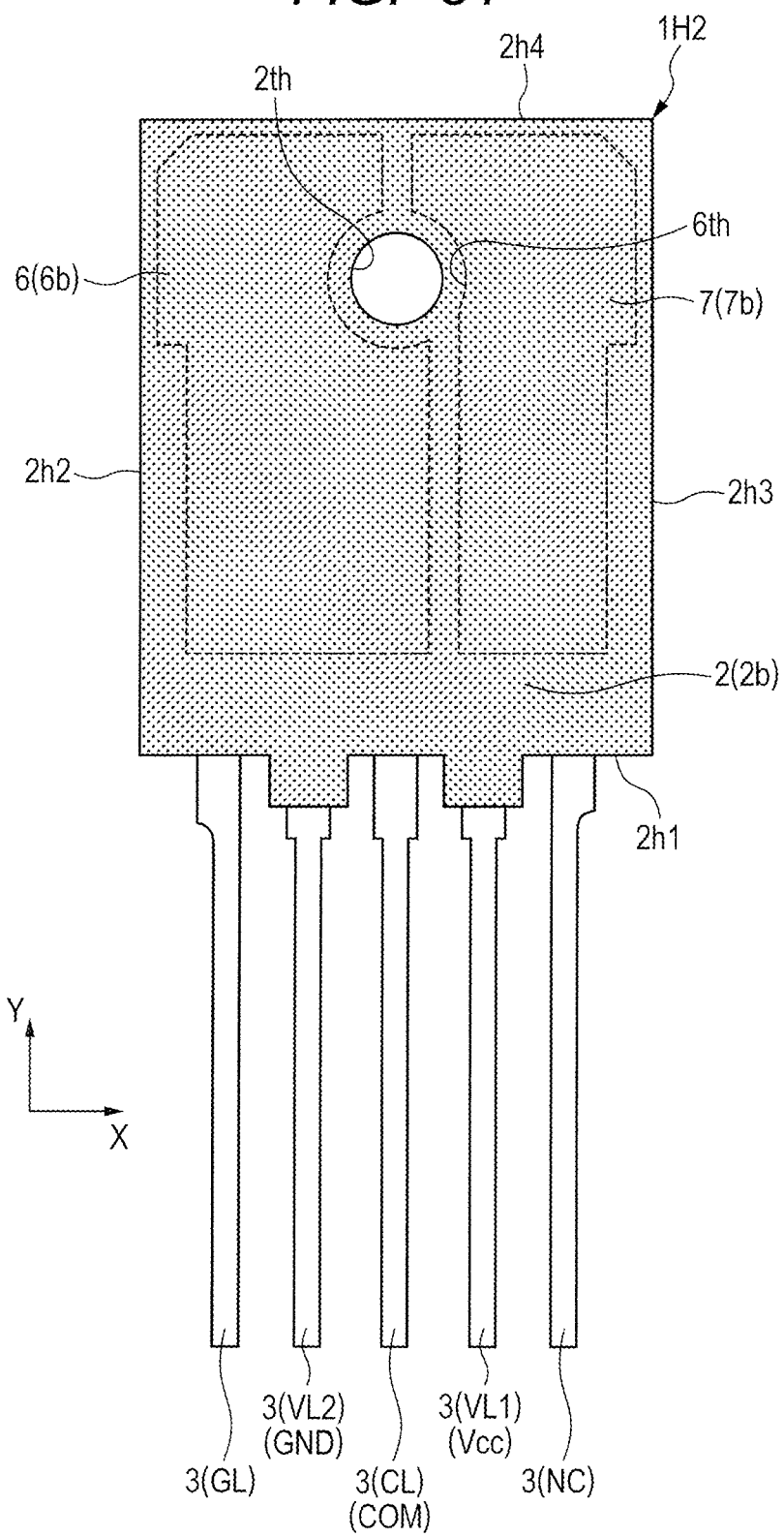
FIG. 31 is a plan view showing the heat radiation plate-mounted surface side of the semiconductor device shown in FIG. 30.

FIG. 30 is a plan view showing the outward appearance of a semiconductor device which is a modified example with respect to FIG. 2. Whereas, FIG. 31 is a plan view showing the heat radiation plate-mounted surface side of the semiconductor device shown in FIG. 30. Further, FIG. 32 is an enlarged cross-sectional view of the semiconductor device shown in FIG. 30.

Figure 32:
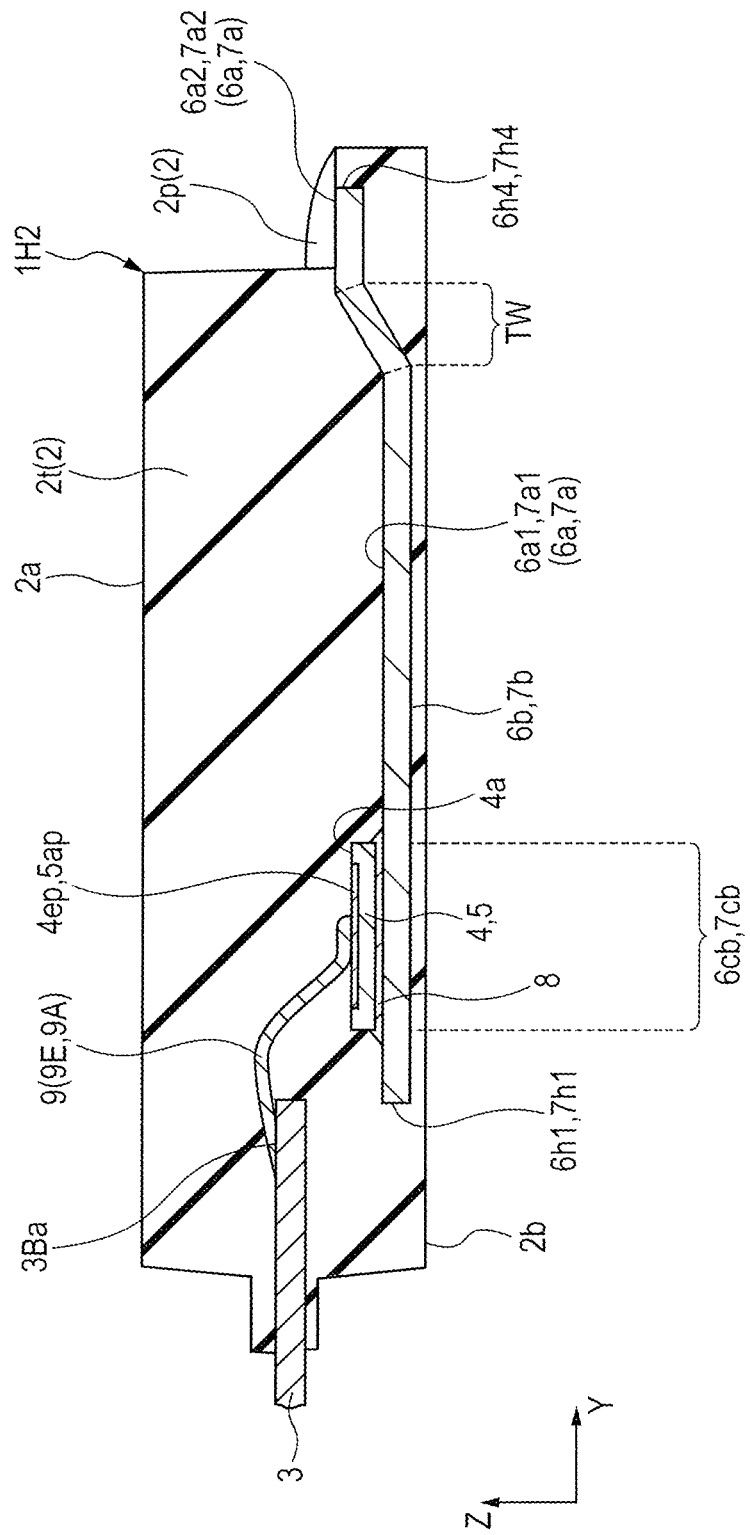
FIG. 32 is an enlarged cross-sectional view of the semiconductor device shown in FIG. 30.

The semiconductor device 1H2 shown in FIGS. 30 to 32 is different from the semiconductor device 1 shown in FIGS. 2 to 12 in that the whole metal plate 6 and metal plate 7 are covered with the sealing body 2. Further, the semiconductor device 1H2 is different from the semiconductor device 1 shown in FIGS. 2 to 12 in that the metal plate 6 and the metal plate 7 included in the semiconductor device 1H2 have clinched parts TW formed at respective positions closer to the sides 6h4 and 7h4 than to the sides 6h1 and 7h1, respectively, as shown in FIG. 32.

Particularly, in the metal plates 6 and 7 included in the semiconductor device 1H2, the whole bottom surfaces 6b and 7b, and the top surfaces 6a1 and 7a1 in respective regions between the sides 6h1 and 7h1 and the clinched part TW of the top surfaces 6a and 7a are sealed by a resin 2t formed by the transfer molding method described in the embodiment, respectively. On the other hand, the top surfaces 6a2 and 7a2 in respective regions between the sides 6h4 and 7h4 and the clinched part TW of the top surfaces 6a and 7a are sealed by a resin 2p formed by a so-called potting method in which a liquid resin is added dropwise, and then heated and cured. By adopting the sealing method as described above, in the sealing step, the sealing body 2 (resin 2t) can be formed with the top surfaces 6a2 and 7a2 of the metal plates 6 and 7 pressed by a molding die.

With the structure in which the sealing body 2 is formed in such a manner as to cover the whole metal plates 6 and 7 as described above, for mounting the semiconductor device 1H2 over a mounting substrate, and mounting a heat radiation member, respective bottom surfaces 6b and 7b of the metal plates 6 and 7 are covered with the sealing body 2, and are insulated, which can eliminate the necessity of the insulation plate 24 described by reference to FIG. 5. On the other hand, from the viewpoint of the heat radiation performances of the metal plates 6 and 7, preferably, the metal plates 6 and 7 are partially exposed as with the semiconductor device 1 described by reference to FIGS. 2 to 12.

Therefore, when the sealing body 2 entirely covering the metal plates 6 and 7 is formed as with the semiconductor device 1H2, the effect of increasing the heat capacity of the metal plate 6 around the chip mounting part 6cb mounting the semiconductor chip 4 thereover, and improving the heat radiation characteristic becomes particularly important.

The semiconductor device 1H2 and the semiconductor device 1 are the same except for the differences, and hence will not be repeatedly described.

Modified Example 2

Further, in the embodiment, for easy understanding, the circuit configuration was simplified and described. However, as the circuit to be mounted in the power circuit, various modified examples are applicable. For example, there is applicable a modified example including a diode element D2 further added therein as with a semiconductor device 1H3 shown in FIG. 33.

Figure 33:
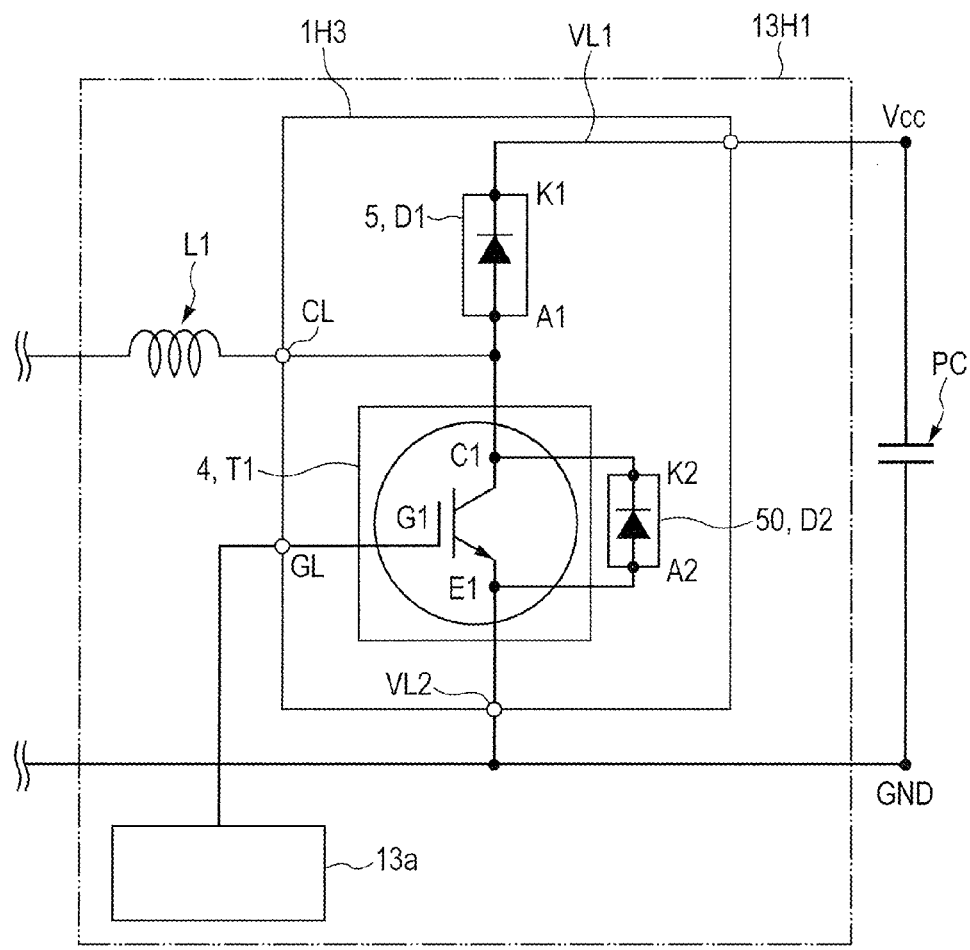
FIG. 33 is a circuit block diagram showing a modified example of the power factor correction circuit shown in FIG. 1.
Figure 34:
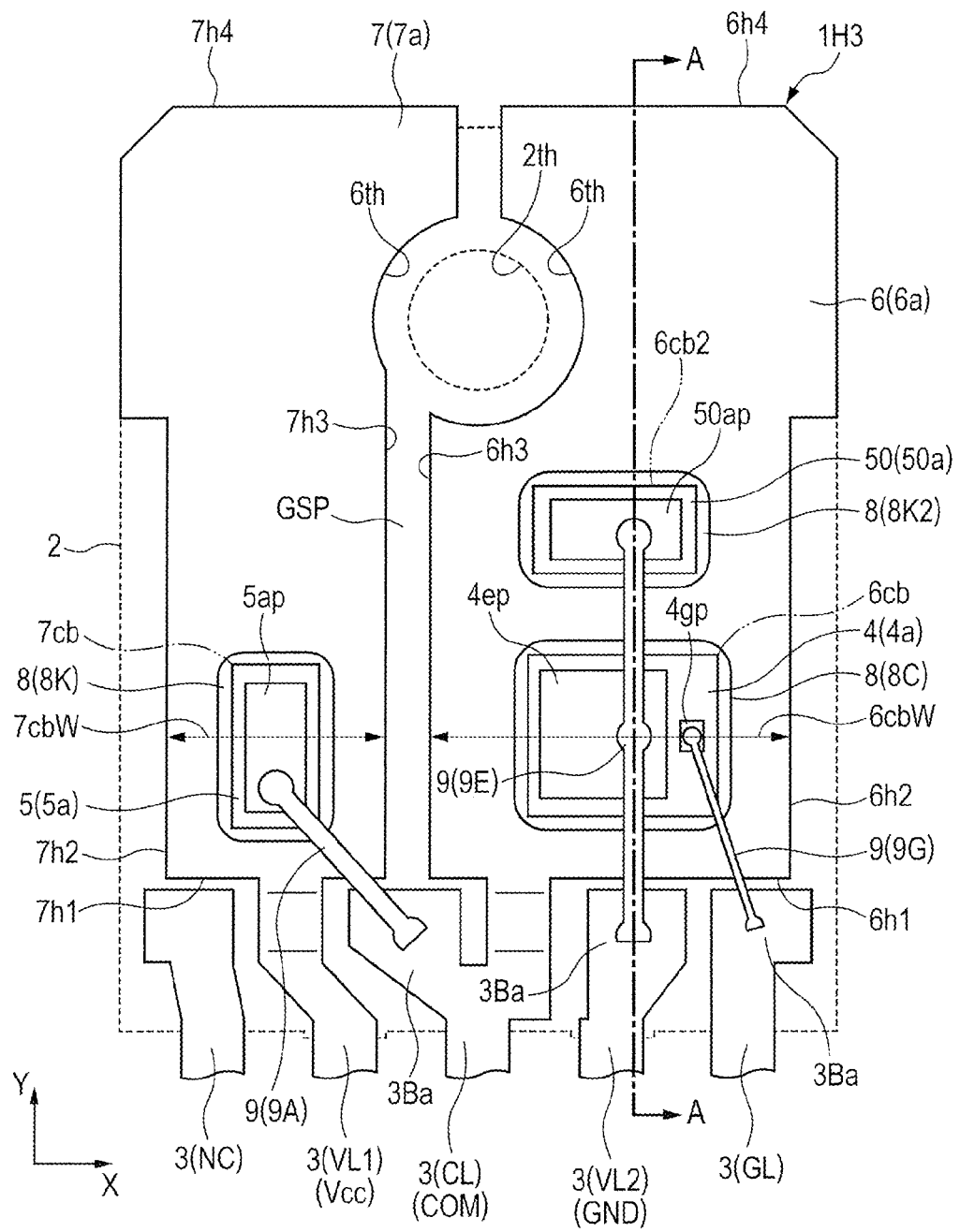
FIG. 34 is a transparent enlarged plan view showing the internal structure of the semiconductor device as seen through the sealing body of the semiconductor device mounted into the power factor correction circuit shown in FIG. 33.
Figure 35:
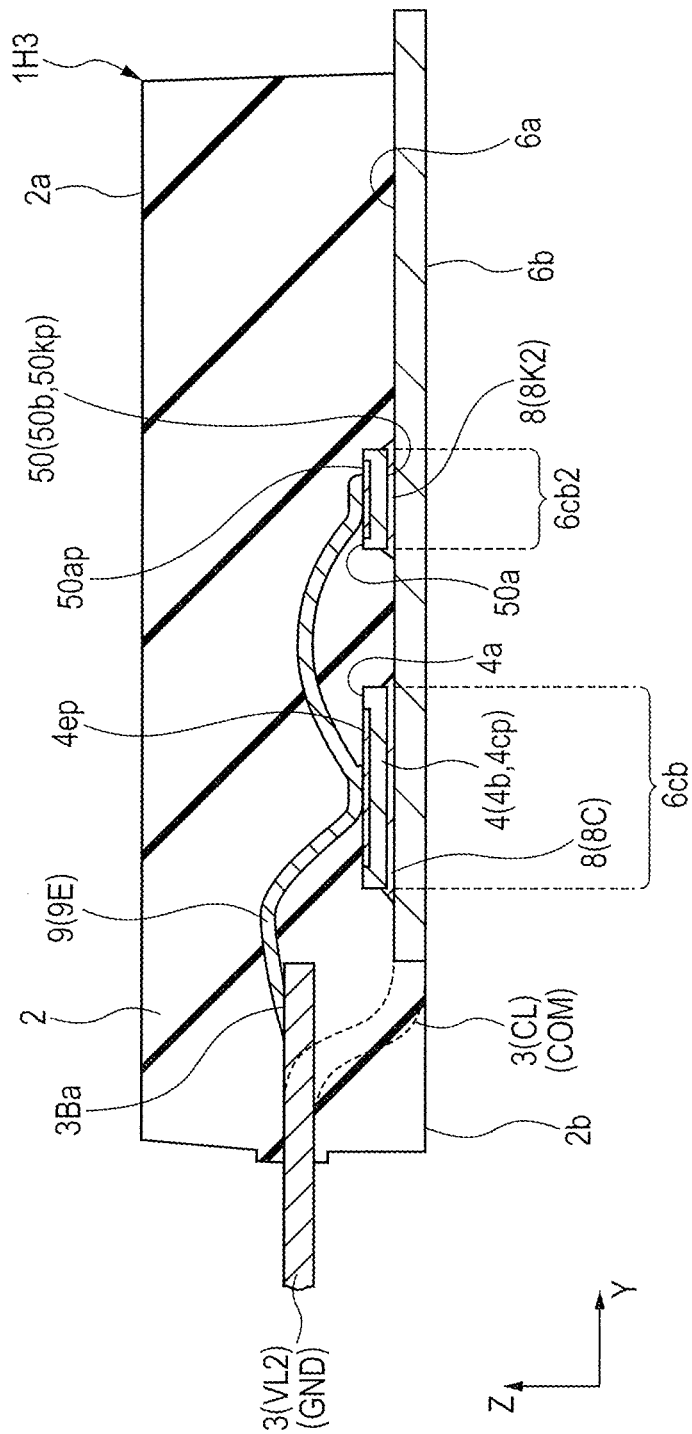
FIG. 35 is an enlarged cross-sectional view along line A-A of FIG. 34.

FIG. 33 is a circuit block diagram showing a modified example of the power factor correction circuit shown in FIG. 1. Whereas, FIG. 34 is a transparent enlarged plan view showing the internal structure of the semiconductor device as seen through the sealing body of the semiconductor device mounted into the power factor correction circuit shown in FIG. 33. Further, FIG. 35 is an enlarged cross-sectional view along line A-A of FIG. 34.

The power factor correction circuit 13H1 shown in FIG. 33 is different from the power factor correction circuit 13 shown in FIG. 1 in that the diode element D2 is formed between the first power source terminal for supplying the first power source potential Vcc and the second power source terminal for supplying the second power source potential (reference potential) GND. The diode element D2 forms a protective circuit for protecting the transistor element T1 from a reverse current from the load 12 (see FIG. 1) side when the switch of the transistor element T1 is turned off.

For this reason, the diode element D2 is coupled in parallel between the emitter electrode E1 and the collector electrode C1 of the transistor element T1. Particularly, the anode electrode A2 of the diode element D2 is coupled to the emitter electrode E1 of the transistor element T1, so that the same electrical potential (second power source potential GND in FIG. 33) is supplied to the anode electrode A2 and the emitter electrode E1. Whereas, the cathode electrode K2 of the diode element D2 is coupled to the collector electrode C1 of the transistor element T1, so that the same electrical potential is supplied to the cathode electrode K2 and the collector electrode C1.

Alternatively, as a modified example with respect to FIG. 33, the diode element D2 can also be formed at the semiconductor chip 4 including the transistor element T1 formed therein. However, in the example shown in FIG. 33, the diode element D2 is formed at a semiconductor chip 50 different from the semiconductor chip 4 including the transistor element T1 formed therein.

As shown in FIG. 35, the semiconductor chip 50 included in the semiconductor device 1H3 has a front surface 50a including an anode electrode pad 50ap formed thereover, and a back surface 50b arranged on the opposite side to the front surface 50a, and including a cathode electrode 50kp formed thereover. Further, as shown in FIGS. 34 and 35, the semiconductor chip 50 is mounted over a chip mounting part 6cb2 disposed at the metal plate 6 via a conductive adhesive material 8K2. The semiconductor chip 50 is mounted over the chip mounting part 6cb2 via the conductive adhesive material 8K2 so that the back surface 50b faces to the top surface 6a of the metal plate 6. The conductive adhesive material 8K2 is the same conductive member as the conductive adhesive materials 8C and 8K described in the embodiment. Accordingly, the cathode electrode 50kp is electrically coupled with the metal plate 6 via the conductive adhesive material 8K2. Incidentally, as the element structure of the semiconductor chip 50, there is applicable the same structure as that of the semiconductor chip described by reference to FIG. 11, and hence will not be repeatedly described.

As described above, by separately forming the diode element D2 forming the protective circuit from the semiconductor chip 4 including the transistor element T1 to be protected formed thereover, it is possible to reduce the size of the plane area of the semiconductor chip 4. On the other hand, although not shown, when the diode element D2 is formed over the semiconductor chip 4 including the transistor element T1 formed therein, the number of components to be incorporated in one package can be reduced. This can reduce the package size.

Further, as described above, the diode element D2 is coupled in parallel with the transistor element T1. For this reason, as shown in FIG. 34, the semiconductor chip 50 is mounted over the metal plate 6 mounting the semiconductor chip 4 thereover. In other words, as shown in FIG. 35, the collector electrode 4cp formed at the back surface 4b of the semiconductor chip 4 and the cathode electrode 50kp formed at the back surface 50b of the semiconductor chip 50 are electrically coupled via the die bonding material (conductive adhesive material) 8, and the metal plate 6.

As described above, the semiconductor chip 5 including the diode element D1 formed therein shown in FIG. 33 and the semiconductor chip 50 including the diode element D2 formed therein shown in FIG. 33 have different electrical coupling relations with the transistor element T1. Further, the diode element D2 is a semiconductor element forming the protective circuit as described above, and hence is much smaller in heat value upon driving as compared with the diode element D1 and the transistor element T1. Therefore, as shown in FIGS. 34 and 35, even when the semiconductor chip 50 is mounted over the metal plate 6 in addition to the semiconductor chip 4, as described in the embodiment, with attention focused on the relation in heat value between the semiconductor chip 4 and the semiconductor chip 5, the heat radiation performances of the metal plate 6 and the metal plate 7 can be designed. In other words, even when the semiconductor chip 50 is mounted over the metal plate 6 in addition to the semiconductor chip 4, in plan view as shown in FIG. 34, the width 6cbW in the X direction of the portion of the metal plate 6 including the chip mounting part 6cb is set larger than the width 7cbW in the X direction of the portion of the metal plate 7 including the chip mounting part 7cb. As a result, the heat radiation performance can be improved.

Further, as shown in FIGS. 34 and 35, when a plurality of semiconductor chips 4 and 50 are mounted over the metal plate 6, the semiconductor chip 4 serving as the current path for the large current from the switching circuit is preferably arranged close to the plurality of leads 3. In the example of FIG. 34, the semiconductor chip 4 is arranged between the lead group including the plurality of leads 3 and the semiconductor chip 50. In other words, the chip mounting part 6cb for mounting the semiconductor chip4 thereover is arranged between the side 6h1 opposing to the lead group and the chip mounting part 6cb2. Thus, the semiconductor chip 4 is arranged closer to the lead 3 (particularly, the lead VL2) than the semiconductor chip 50. This can shorten the path distance of the conduction path (in FIG. 34, the wire 9E) for electrically coupling the emitter electrode pad 4ep and the lead VL2. For this reason, the resistance value can be reduced. As a result, it is possible to reduce the ON resistance of the transistor element T1 (see FIG. 33).

Further, the semiconductor chip 4 is arranged closer to the lead 3 (particularly, the lead GL) than the semiconductor chip 50. This can shorten the path distance of the conduction path (in FIG. 34, the wire 9G) for electrically coupling the gate electrode pad 4gp and the lead GL. For this reason, the resistance value can be reduced. Then, by reducing the resistance value of the wire 9G, it is possible to improve the switching speed.

Further, in the example shown in FIGS. 34 and 35, the anode electrode pad 50ap of the semiconductor chip 50, the emitter electrode pad 4ep of the semiconductor chip 4, and the lead VL2 are electrically coupled by one wire 9E. This can shorten the conduction path distance between the anode electrode pad 50ap of the semiconductor chip 50 and the emitter electrode pad 4ep of the semiconductor chip 4. However, as a modified example with respect to FIG. 34, there is also a method in which the anode electrode pad 50ap of the semiconductor chip 50 and the emitter electrode pad 4ep of the semiconductor chip 4 are coupled to the lead VL2 via respective different wires 9.

The semiconductor device 1H3 and the semiconductor device 1 are the same, except for the differences, and hence, will not be repeatedly described.

Modified Example 3

Further, in the embodiment, a description has been given to the embodiment in which, as shown in FIG. 6, the emitter electrode pad 4ep and the gate electrode pad 4gp of the semiconductor chip 4 are arranged in parallel along the X direction. In this case, the distance between the central position of the emitter electrode pad 4ep and the lead group (particularly, the lead VL2) is roughly equal to the distance between the central position of the gate electrode pad 4gp and the lead group (particularly, the lead GL). Accordingly, the length of the wire 9E is roughly equal to the length of the wire 9G.

Figure 36:
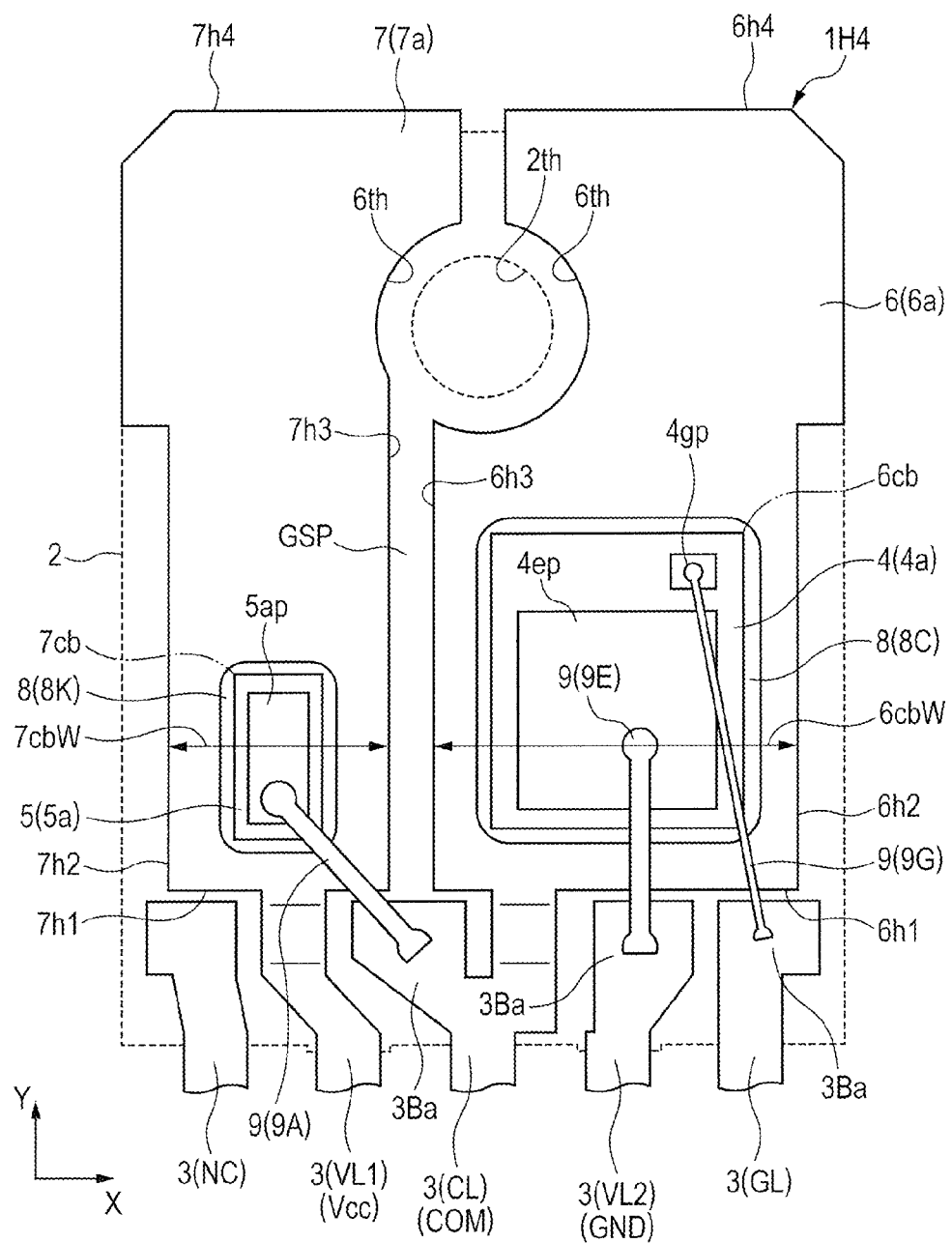
FIG. 36 is a transparent enlarged plan view showing the internal structure of the semiconductor device as seen through the sealing body of the semiconductor device which is a modified example with respect to FIG. 6.

However, as a modified example, there is applicable an embodiment in which, as with a semiconductor device 1H4 shown in FIG. 36, the emitter electrode pad 4ep and the gate electrode pad 4gp of the semiconductor chip 4 are arranged in parallel along the Y direction. FIG. 36 is a transparent enlarged plan view showing the internal structure of the semiconductor device as seen through the sealing body of the semiconductor device which is a modified example with respect to FIG. 6.

In the semiconductor device 1H4 shown in FIG. 36, the emitter electrode pad 4ep and the gate electrode pad 4gp of the semiconductor chip 4 are arranged in parallel along the Y direction. Herein, the distance between the central position of the emitter electrode pad 4ep of the semiconductor chip 4 and the lead group (particularly, the lead VL2) is shorter than the distance between the central position of the gate electrode pad 4gp and the lead group (particularly, the lead GL). In other words, in the Y direction, the central position of the emitter electrode pad 4ep is closer to the lead group (particularly, the lead VL2) than the gate electrode pad 4gp.

Thus, the emitter electrode pad 4ep is arranged closer to the lead 3 (particularly, the lead VL2) than the gate electrode pad 4gp. This can shorten the path distance of the conduction path (in FIG. 36, the wire 9E) for electrically coupling the emitter electrode pad 4ep and the lead VL2. Accordingly, the resistance value can be reduced. As a result, the ON resistance of the transistor element T1 (see FIG. 1) can be reduced.

Modified Example 4

Figure 37:
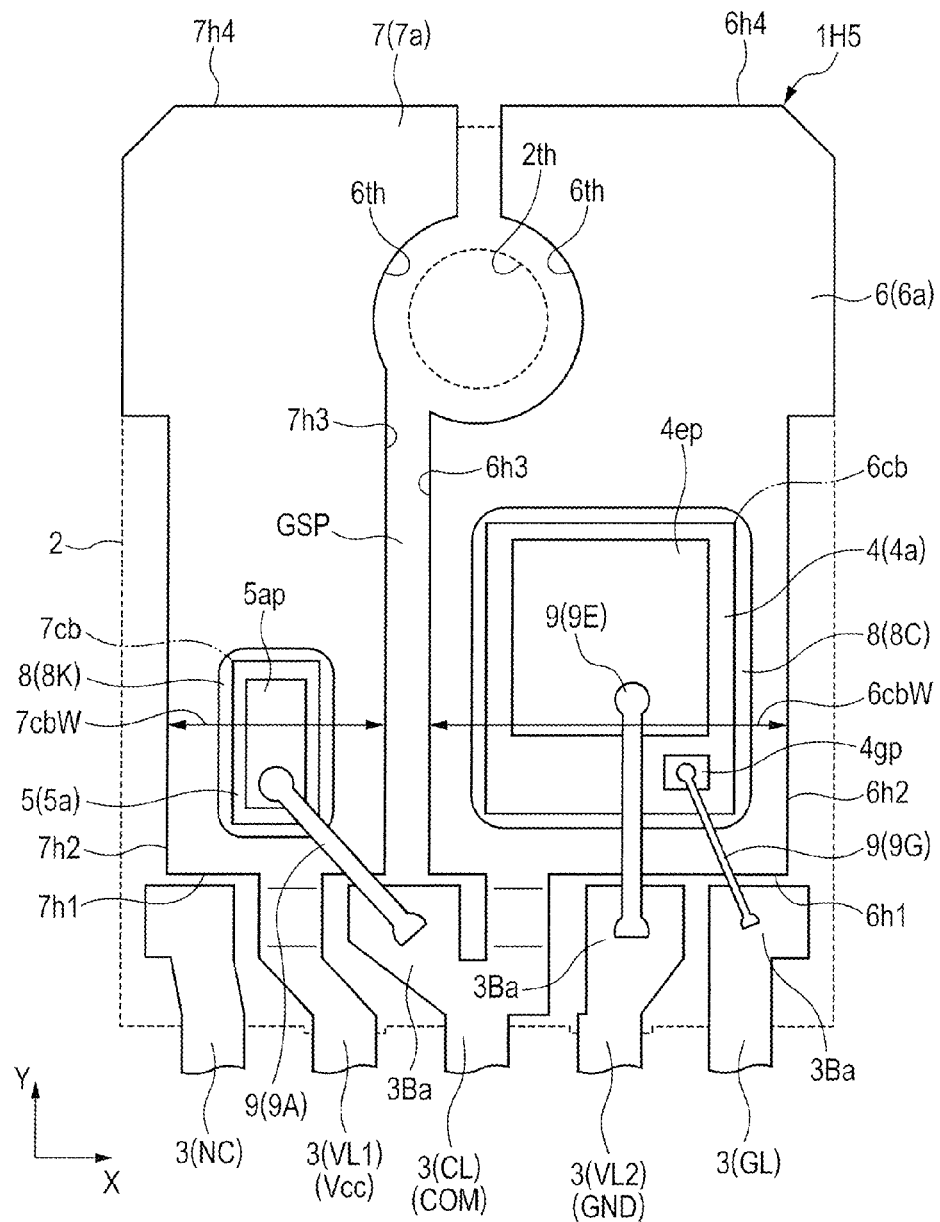
FIG. 37 is a transparent enlarged plan view showing the internal structure of a semiconductor device as seen through the sealing body of a semiconductor device which is another modified example with respect to FIG. 6.

Whereas, as another modified example different from the semiconductor device 1H4 shown in FIG. 36, there is applicable an embodiment in which, as with a semiconductor device 1H5 shown in FIG. 37, the emitter electrode pad 4ep and the gate electrode pad 4gp of the semiconductor chip 4 are arranged in parallel along the Y direction. FIG. 37 is a transparent enlarged plan view showing the internal structure of a semiconductor device as seen through the sealing body of a semiconductor device which is another modified example with respect to FIG. 6.

In the semiconductor device 1H5 shown in FIG. 37, the emitter electrode pad 4ep and the gate electrode pad 4gp of the semiconductor chip 4 are arranged in parallel along the Y direction. Herein, in the semiconductor device 1H5, the distance between the central position of the gate electrode pad 4gp of the semiconductor chip 4 and the lead group (particularly, the lead GL) is shorter than the distance between the central position of the emitter electrode pad 4ep and the lead group (particularly, the lead VL2). In other words, in the Y direction, the central position of the gate electrode pad 4gp is closer to the lead group (particularly, the lead GL) than the emitter electrode pad 4ep.

Thus, the gate electrode pad 4gp is arranged closer to the lead 3 (particularly, the lead GL) than the emitter electrode pad 4ep. This can shorten the path distance of the conduction path (in FIG. 37, the wire 9G) for electrically coupling the gate electrode pad 4gp and the lead GL. Accordingly, the resistance value can be reduced. Then, the reduction of the resistance value of the wire 9G can improve the switching speed.

Modified Example 5

Further, in the embodiments and Modified Example 1 to Modified Example 4, a description has been given to the embodiment in which the wire 9E is used as a metal conductor (conductive member) for electrically coupling the emitter electrode pad 4ep of the semiconductor chip 4 and the lead VL2. However, as a modified example in which the cross-sectional area of the conduction path for passing therethrough a large current from the switching circuit is further increased, a metallic clip (a metal conductor or a metal plate) 51 can be used as with a semiconductor device 1H6 shown in FIG. 38.

Figure 38:
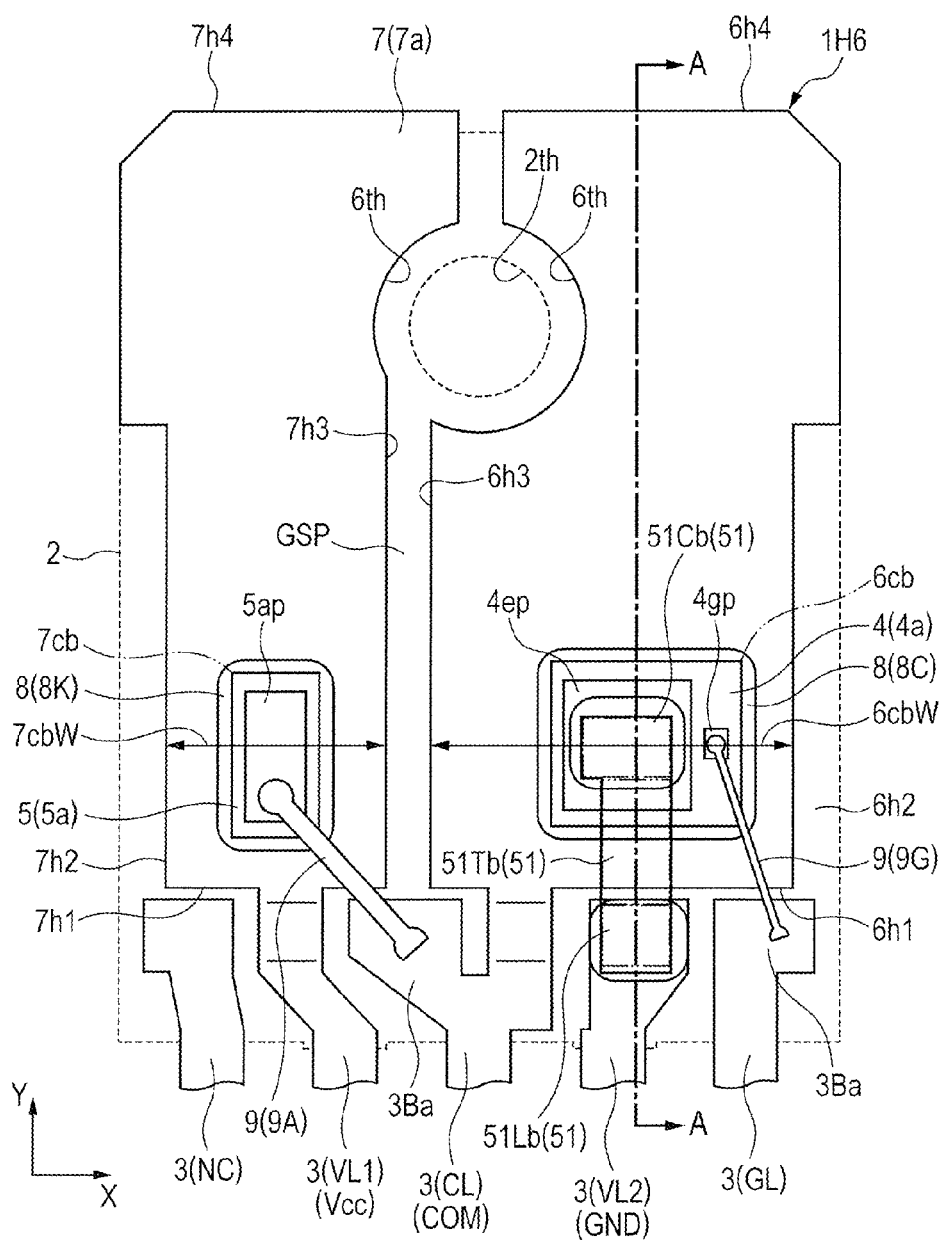
FIG. 38 is a transparent enlarged plan view showing the internal structure of a semiconductor device as seen through the sealing body of a semiconductor device which is a still other modified example with respect to FIG. 6.

FIG. 38 is a transparent enlarged plan view showing the internal structure of a semiconductor device as seen through the sealing body of a semiconductor device which is a still other modified example with respect to FIG. 6. Whereas, FIG. 39 is an enlarged cross-sectional view along line A-A of FIG. 38.

Figure 39:
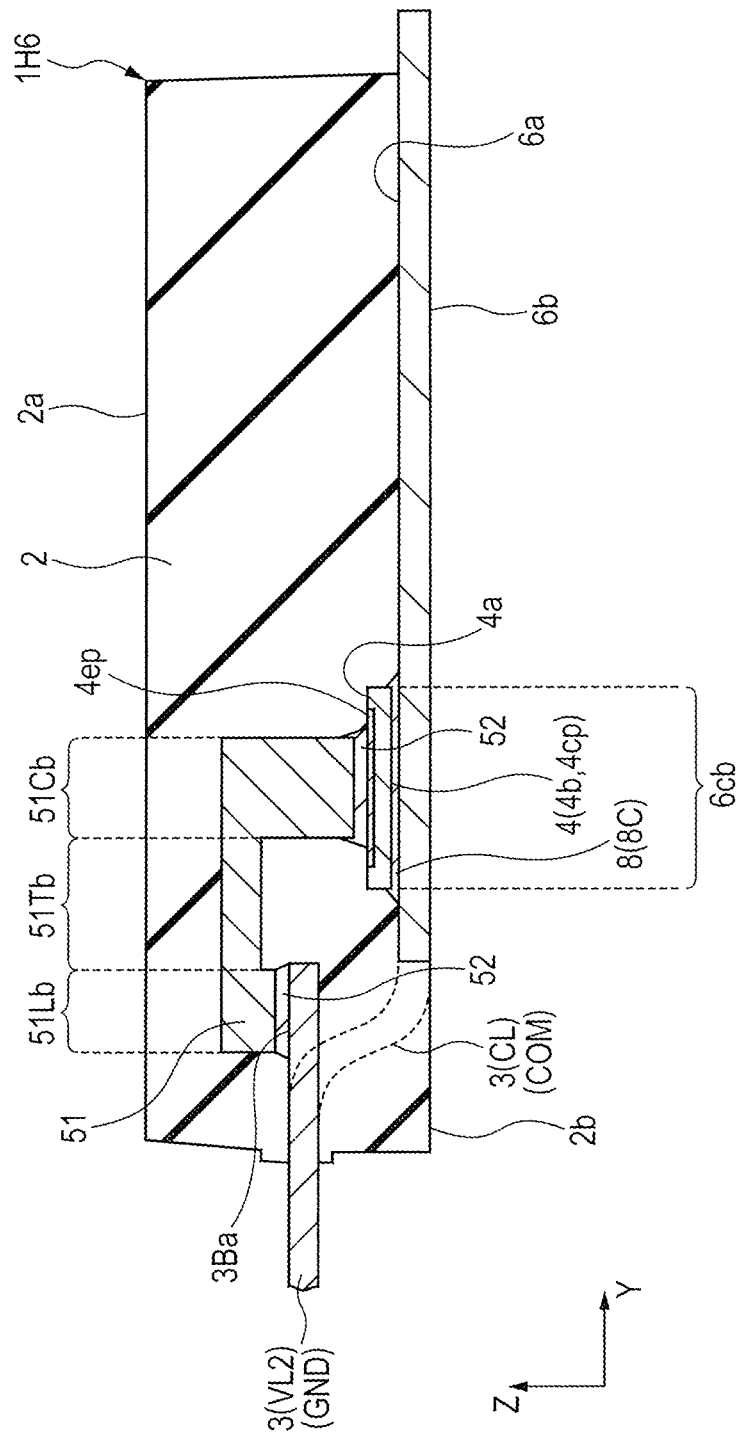
FIG. 39 is an enlarged cross-sectional view along line A-A of FIG. 38.

The semiconductor device 1H6 shown in FIG. 38 and FIG. 39 is different from the semiconductor device 1 shown in FIG. 6, in that the emitter electrode pad 4ep of the semiconductor chip 4 and the lead VL2 are electrically coupled via a metallic clip (metal conductor or metal plate) 51.

The metallic clip 51 is a metal plate formed of, for example, copper (Cu), and has a chip coupling part 51Cb to be coupled with the emitter electrode pad 4ep of the semiconductor chip 4, a lead coupling part 51Lb to be coupled with the lead VL2, and an intermediate part 51Tb arranged between the chip coupling part 51Cb and the lead coupling part 51Lb. As shown in FIG. 39, the chip coupling part 51Cb and the lead coupling part 51Lb each have a protruding part protruding toward a to-be-coupled part. The protruding part is previously formed before mounting the metallic clip 51 over the semiconductor chip 4 and the lead VL2.

Whereas, the chip coupling part 51Cb is electrically coupled with the emitter electrode pad 4ep via the conductive adhesive material 52. The lead coupling part 51Lb is electrically coupled with the wire coupling surface (in the case of FIG. 35, shall read a clip coupling surface) 3Ba of the lead VL2 via the conductive adhesive material 52. As the conductive adhesive material 52, as with the die bonding material 8, there can be used a solder material such as Pb—Sn—Ag solder or Sn—Sb solder, or a conductive resin material including a large number of conductive particles (metal particles) mixed in a resin such as Ag paste.

When as with the semiconductor device 1H6, the emitter electrode pad 4ep of the semiconductor chip 4 and the lead VL2 are electrically coupled via the metallic clip (metal conductor or metal plate) 51, the cross-sectional area of the conduction path can be made still larger than that of the semiconductor device 1 described in the embodiment. Then, by increasing the cross-sectional area of the conduction path (metallic clip 51) for electrically coupling the emitter electrode pad 4*ep* and the lead VL2, it is possible to reduce the resistance value. As a result, it is possible to reduce the ON resistance of the transistor element T1 (see FIG. 1).

Incidentally, with the manufacturing method of the semiconductor device 1H6 shown in FIGS. 38 and 39, in the wire bonding step described in the embodiment, the metallic clip 51 is formed. Whereas, when a solder material is used as the conductive adhesive material 52, a cleaning step is performed after forming the metallic clip 51. Therefore, preferably, the step of forming the metallic clip 51, and the cleaning step are performed before forming the wire 9A and the wire 9G.

Further, although not shown, as a further modified example with respect to the semiconductor device 1H6, the wire 9A for electrically coupling the anode electrode pad 5*ap* of the semiconductor chip 5 and the lead CL shown in FIG. 38 may be replaced with the metallic clip 51.

The semiconductor device 1H6 and the semiconductor device 1 are the same except for the differences, and hence will not be repeatedly described.

Modified Example 6

Figure 40:
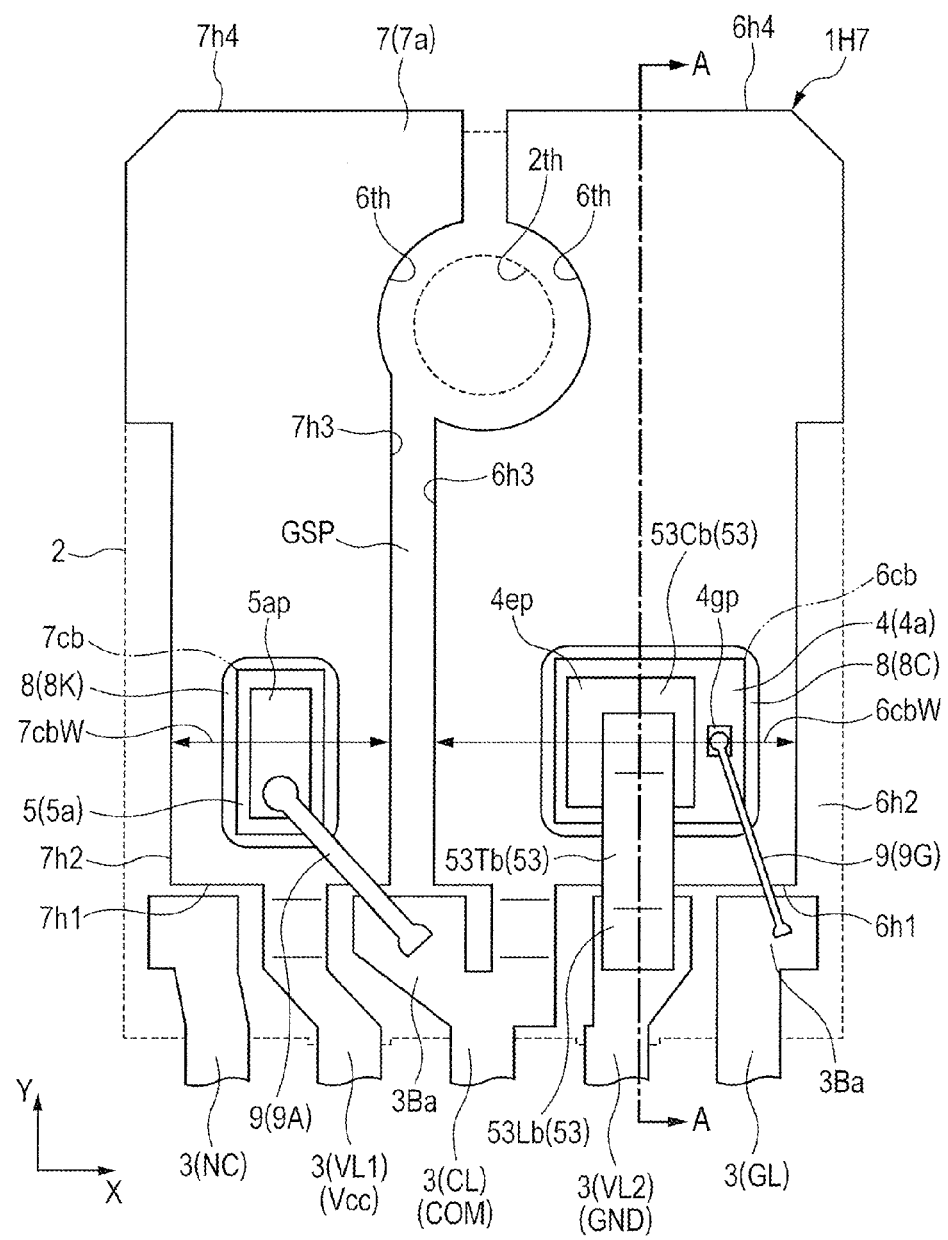
FIG. 40 is a transparent enlarged plan view showing the internal structure of a semiconductor device as seen through the sealing body of a semiconductor device which is a modified example with respect to FIG. 38.

Whereas, as a further modified example with respect to the Modified Example 5, as with a semiconductor device 1H7 shown in FIG. 40, using a metallic ribbon (a metal conductor or a metallic band) 53, the emitter electrode pad 4*ep* of the semiconductor chip 4 and the lead VL2 can be electrically coupled.

FIG. 40 is a transparent enlarged plan view showing the internal structure of a semiconductor device as seen through the sealing body of a semiconductor device which is a modified example with respect to FIG. 38. Further, FIG. 41 is an enlarged cross-sectional view along line A-A of FIG. 40.

The semiconductor device 1H7 shown in FIGS. 40 and 41 is different from the semiconductor device 1 shown in FIG. 6 in that the emitter electrode pad 4*ep* of the semiconductor chip 4 and the lead VL2 are electrically coupled via the metallic ribbon (metal conductor or metallic band) 53.

The metallic ribbon 53 is a metal plate formed in a band form (ribbon form), and is made of, for example, aluminum. Further, the metallic ribbon 53 is the same as the metallic clip 51 shown in FIG. 38 in that the metallic ribbon 53 has a chip coupling part 53Cb to be coupled to the emitter electrode pad 4*ep* of the semiconductor chip 4, a lead coupling part 53Lb to be coupled to the lead VL2, and an intermediate part 53Tb arranged between the chip coupling part 53Cb and the lead coupling part 53Lb.

Further, the metallic ribbon 53 shown in FIGS. 40 and 41 is different from the metallic clip 51 shown in FIGS. 38 and 39 in some points. The different points will be described below.

With the formation method of the metallic ribbon 53 (ribbon bonding method), a metallic band is sequentially drawn from a reel (holding part) for holding the metallic band not shown, and the metallic band is joined to the to-be-joined part (the electrode pad of the semiconductor chip or the coupling surface of the lead) while being molded. In other words, the metallic ribbon 53 is different from the metallic clip 51 in that the metallic band is joined to the to-be-joined part while being molded.

Further, for joining the metallic ribbon 53 to the to-be-joined part, a bonding tool (joining jig) not shown is applied with an ultrasonic wave, thereby to form a metallic bond at the joint interface between the metallic ribbon 53 and the metal member of the to-be-joined part for achieving joining. Thus, the metallic ribbon 53 establishes an electrical coupling with the to-be-joined part by being applied with an ultrasonic wave. This eliminates the necessity of a conductive adhesive material between the metallic ribbon 53 and the to-be-joined part. This results in the reduction of the number of materials forming the semiconductor device, and the reduction of the number of steps of supplying a conductive joining material, and other procedures. For these and other reasons, it is possible to reduce the assembly cost of the semiconductor device.

However, the metallic clip 51 using the conductive joining material also has a large merit. As shown in FIG. 39, when, for example, a solder material is used for the conductive adhesive material 52 for electrically coupling the metallic clip 51 and the to-be-joined part, the strength of the coupling part is higher than the coupling strength of the joint part formed by application with an ultrasonic wave of the metallic ribbon 53 shown in FIG. 41. This is effective for improving the reliability of the semiconductor device. In summary, it can be said desirable that the metallic ribbon 53 is adopted when great importance is attached to the cost reduction, and that the metallic clip 51 is adopted when great importance is attached to the reliability assurance.

Modified Example 7

Further, the modified examples may be combined and applied within the scope not departing from the gist of the technical idea described in the embodiments.

Other than these, some of the contents described in the embodiments will be described below.

A semiconductor device includes:

a first semiconductor chip having a first front surface including a first electrode pad and a second electrode pad formed thereover, and a first back surface arranged on the opposite side to the first front surface, and including a third electrode formed thereover, and including a transistor element electrically coupled with the first and second electrode pads and the third electrode, a second semiconductor chip having a second front surface including a fourth electrode pad formed thereover, and a second back surface arranged on the opposite side to the second front surface, and including a fifth electrode formed thereover, and including a diode element electrically coupled with the fourth electrode pad and the fifth electrode, a first metal plate including a first side extending in a first direction, a second side extending in a second direction orthogonal to the first direction, and crossing with the first side, a third side extending in the second direction, opposing to the second side, further crossing with the first side, and arranged inwardly of the second side, and a first chip mounting part for mounting the first semiconductor chip thereover, electrically coupled with the third electrode of the first semiconductor chip, and, further, disposed in such a manner as to be interposed between the second and third sides in plan view, a second metal plate including a fourth side extending in the first direction, a fifth side extending in the second direction, and crossing with the fourth side, a sixth side extending in the second direction, opposing to the fifth side, further crossing with the fourth side, and arranged inwardly of the fifth side, and a second chip mounting part for mounting the second semiconductor chip thereover, electrically coupled with the fifth electrode of the second semiconductor chip, and, further, disposed in such a manner as to be interposed between the fifth and sixth sides in plan view, a group of a plurality of leads including leads electrically coupled with the first semiconductor chip, and leads electrically coupled with the second semiconductor chip, and a sealing body for sealing the first and second semiconductor chips, and respective portions of the plurality of leads.

The first and second metal plates are electrically isolated from each other, and are arranged adjacent to each other in such a manner that the third side of the first metal plate faces to the sixth side of the second metal plate.

The group of the plurality of leads is arranged along the second direction in such a manner as to face to the first side of the first metal plate and the fourth side of the second metal plate, and respective leads are arranged along the first direction.

In plan view, the length in the first direction between the second side and the third side with the first chip mounting part interposed therebetween of the first metal plate is larger than the length in the first direction between the fifth side and the sixth side with the second chip mounting part interposed therebetween of the second metal plate.

What is claimed is:

1. A semiconductor device, comprising:
    a first semiconductor chip having a first front surface including a first electrode pad and a second electrode pad formed thereover, and a first back surface arranged on the opposite side to the first front surface and including a third electrode formed thereover, the first semiconductor chip including a transistor element electrically coupled with the first and second electrode pads and the third electrode;
    a second semiconductor chip having a second front surface including a fourth electrode pad formed thereover, and a second back surface arranged on the opposite side to the second front surface and including a fifth electrode formed thereover, the second semiconductor chip including a diode element electrically coupled with the fourth electrode pad and the fifth electrode;
    a first metal plate having a first chip mounting part including the first semiconductor chip mounted thereover, and electrically coupled with the third electrode of the first semiconductor chip;
    a second metal plate having a second chip mounting part including the second semiconductor chip mounted thereover, and electrically coupled with the fifth electrode of the second semiconductor chip;
    a lead group including a lead electrically coupled with the first semiconductor chip, and a lead electrically coupled with the second semiconductor chip; and
    a sealing body for sealing the first and second semiconductor chips, and respective portions of a plurality of the leads,
    wherein the first and second metal plates are electrically isolated from each other, and are arranged adjacent to each other along a first direction,
    wherein the lead group is arranged in such a manner as to face to the first metal plate and the second metal plate along a second direction orthogonal to the first direction, and respective leads are arranged along the first direction, and
    wherein, in plan view, the width in the first direction of a portion of the first metal plate including the first chip mounting part is larger than the width in the first direction of a portion of the second metal plate including the second chip mounting part.

2. The semiconductor device according to claim 1,
    wherein each cross-sectional area in the first direction of the portion of the first metal plate including the first chip mounting part and in the thickness direction of the first metal plate is larger than each cross-sectional area in the first direction of the portion of the second metal plate including the second chip mounting part and in the thickness direction of the second metal plate.

3. The semiconductor device according to claim 2,
    wherein the first metal plate has a first top surface including the first chip mounting part,
    wherein the second metal plate has a second top surface including the second chip mounting part, and
    wherein the area of the first top surface of the first metal plate is larger than the area of the second top surface of the second metal plate.

4. The semiconductor device according to claim 3,
    wherein the volume of the first metal plate is larger than the volume of the second metal plate.

5. The semiconductor device according to claim 4,
    wherein the lead group includes a first lead electrically coupled with the first electrode pad of the first semiconductor chip, a second lead electrically coupled with the second electrode pad of the first semiconductor chip, and a third lead electrically coupled with the third electrode of the first semiconductor chip and the fourth electrode pad of the second semiconductor chip.

6. The semiconductor device according to claim 5,
    wherein the leads protrude, from the sealing body, along the second direction orthogonal to the first direction.

7. The semiconductor device according to claim 5,
    wherein the first lead is electrically coupled with the first electrode pad of the first semiconductor chip via a first metal conductor,
    wherein the second lead is electrically coupled with the second electrode pad of the first semiconductor chip via a second metal conductor, and
    wherein the third lead is integrally formed with the first metal plate, and is electrically coupled with the fourth electrode pad of the second semiconductor chip via a third metal conductor.

8. The semiconductor device according to claim 7,
    wherein the cross-sectional area of each conduction path of the first and third metal conductors is larger than the cross-sectional area of the conduction path of the second metal conductor.

9. The semiconductor device according to claim 7,
    wherein, in plan view, the central position of the first electrode pad in the second direction is closer to the lead group than the central position of the second electrode pad.

10. The semiconductor device according to claim 5,
    wherein the first semiconductor chip includes an insulation gate bipolar transistor element,
    wherein the first electrode pad is electrically coupled with an emitter electrode of the insulation gate bipolar transistor element,
    wherein the second electrode pad is electrically coupled with a gate electrode of the insulation gate bipolar transistor element,
    wherein the third electrode is a gate electrode of the insulation gate bipolar transistor element,
    wherein the fourth electrode pad is electrically coupled with an anode electrode of the diode element, and
    wherein the fifth electrode is a cathode electrode of the diode element.

11. The semiconductor device according to claim 3,
    wherein the area of the first front surface of the first semiconductor chip is larger than the area of the second front surface of the second semiconductor chip.

12. The semiconductor device according to claim 1,
wherein in the first metal plate, a through hole penetrating through the first metal plate in the thickness direction of the first metal plate is formed, and
wherein the through hole is formed in such a manner as to be closer to the side of the first metal plate opposite to the side thereof facing to the lead group than to the side of the first metal plate facing to the lead group.

13. The semiconductor device according to claim 12,
wherein the through hole is formed across the first metal plate and the second metal plate, and is formed in such a manner as to penetrate through the second metal plate in the thickness direction of the second metal plate.

14. The semiconductor device according to claim 1,
wherein a gap is disposed between the first and second metal plates,
wherein, in plan view, the width in the first direction of the gap is smaller than the width in the first direction of a portion of the second metal plate including the second chip mounting part, and
wherein a portion of the sealing body is arranged in the gap.

15. A semiconductor device, comprising:
a first semiconductor chip having a first front surface including an emitter electrode pad and a gate electrode pad formed thereover, and a first back surface arranged on the opposite side to the first front surface and including a collector electrode formed thereover, the first semiconductor chip including an insulation gate bipolar transistor element electrically coupled with the emitter and gate electrode pads, and the collector electrode;
a second semiconductor chip having a second front surface including an anode electrode pad formed thereover, and a second back surface arranged on the opposite side to the second front surface and including a cathode electrode formed thereover, the second semiconductor chip including a diode element electrically coupled with the anode electrode pad and the cathode electrode;
a first metal plate having a first chip mounting part including the first semiconductor chip mounted thereover, and electrically coupled with the collector electrode of the first semiconductor chip;
a second metal plate having a second chip mounting part including the second semiconductor chip mounted thereover, and electrically coupled with the cathode electrode of the second semiconductor chip;
a lead group including an emitter lead electrically coupled with the emitter electrode pad of the first semiconductor chip, a gate lead electrically coupled with the gate electrode pad of the first semiconductor chip, and an anode-collector lead electrically coupled with the first metal plate and the anode electrode pad of the second semiconductor chip;
a first metal conductor electrically coupled with the emitter electrode pad of the first semiconductor chip, and the emitter lead;
a second metal conductor electrically coupled with the gate electrode pad of the first semiconductor chip and the gate lead;
a third metal conductor electrically coupled with the anode electrode pad of the second semiconductor chip, and the anode-collector lead; and
a sealing body for sealing the first and second semiconductor chips, respective portions of the leads forming the lead group, and the first, second, and third metal conductors,
wherein the first and second metal plates are electrically isolated from each other, and are arranged adjacent to each other along a first direction,
wherein the lead group is arranged in such a manner as to face to the first metal plate and the second metal plate along a second direction orthogonal to the first direction, and respective leads are arranged along the first direction, and
wherein, in plan view, the width in the first direction of a portion of the first metal plate including the first chip mounting part is larger than the width in the first direction of a portion of the second metal plate including the second chip mounting part.

16. A method for manufacturing a semiconductor device, comprising the steps of:
(a) providing a lead frame having a first metal plate, a second metal plate, and a lead group;
(b) mounting a first semiconductor chip over a first chip mounting part of the first metal plate and electrically coupling the first metal plate and a third electrode of the first semiconductor chip, the first semiconductor chip having a first front surface including a first electrode pad and a second electrode pad formed thereover, and a first back surface arranged on the opposite side to the first front surface and including the third electrode formed thereover, and including a transistor element electrically coupled with the first and second electrode pads and the third electrode;
(c) mounting a second semiconductor chip over a second chip mounting part of the second metal plate, and electrically coupling the second metal plate and a fifth electrode of the second semiconductor chip, the second semiconductor chip having a second front surface including a fourth electrode pad formed thereover, and a second back surface arranged on the opposite side to the second front surface and including the fifth electrode formed thereover, and including a diode element electrically coupled with the fourth electrode pad and the fifth electrode;
(d) electrically coupling the first semiconductor chip with some leads of the lead group, and electrically coupling the second semiconductor chip with other leads of the lead group;
(e) sealing the first and second semiconductor chips, and a portion of the lead group with a sealing resin, and forming a sealing body; and
(f) cutting the first and second metal plates, and the lead group from a support part of the lead frame,
wherein the first and second metal plates are electrically isolated from each other, and are arranged adjacent to each other along a first direction,
wherein the lead group is arranged in such a manner as to face to the first metal plate and the second metal plate along a second direction orthogonal to the first direction, and respective leads are arranged along the first direction, and
wherein, in plan view, the width in the first direction of a portion of the first metal plate including the first chip mounting part is larger than the width in the first direction of a portion of the second metal plate including the second chip mounting part.

17. The method for manufacturing a semiconductor device according to claim 16,
wherein the step (d) comprises:
(d1) electrically coupling the first electrode pad of the first semiconductor chip and a first lead via a first metal conductor;

(d2) electrically coupling the second electrode pad of the first semiconductor chip and a second lead via a second metal conductor; and (d3) electrically coupling the fourth electrode pad of the second semiconductor chip and a third lead electrically coupled with the first metal plate via a third metal conductor.

18. The method for manufacturing a semiconductor device according to claim 17, wherein the cross-sectional area of the conduction path of the first metal conductor is equal to or larger than the cross-sectional area of the conduction path of the second metal conductor.

19. The method for manufacturing a semiconductor device according to claim 18, wherein the step (d2) is performed after the step (d1).

20. The method for manufacturing a semiconductor device according to claim 16, wherein a gap is disposed between the first and second metal plates, wherein, in plan view, the width in the first direction of the gap is smaller than the width in the first direction of a portion of the second metal plate including the second chip mounting part, and wherein, in the step (e), the sealing body is formed such that a portion of the sealing body is arranged in the gap.

* * * * *